(12) United States Patent
Nakayama et al.

(10) Patent No.: US 10,714,330 B2
(45) Date of Patent: Jul. 14, 2020

(54) METHOD FOR MANUFACTURING A SEMICONDUCTOR DEVICE HAVING A STEP OF PERFORMING ION IMPLANTATION USING A RESIST PATTERN AS A MASK

(71) Applicant: Renesas Electronics Corporation, Koutou-ku, Tokyo (JP)

(72) Inventors: Tomoo Nakayama, Ibaraki (JP); Tatsuya Usami, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 19 days.

(21) Appl. No.: 15/934,710

(22) Filed: Mar. 23, 2018

(65) Prior Publication Data
US 2018/0366321 A1    Dec. 20, 2018

(30) Foreign Application Priority Data

Jun. 14, 2017 (JP) .................................. 2017-116478

(51) Int. Cl.
| | | |
|---|---|---|
| H01L 21/3205 | (2006.01) | |
| H01L 29/76 | (2006.01) | |
| H01L 29/94 | (2006.01) | |
| H01L 21/02 | (2006.01) | |
| H01L 29/66 | (2006.01) | |
| H01L 21/3213 | (2006.01) | |
| H01L 21/265 | (2006.01) | |
| H01L 21/266 | (2006.01) | |
| H01L 21/8238 | (2006.01) | |

(52) U.S. Cl.
CPC .. *H01L 21/02164* (2013.01); *H01L 21/02274* (2013.01); *H01L 21/266* (2013.01); *H01L 21/2652* (2013.01); *H01L 21/32139* (2013.01); *H01L 21/823814* (2013.01); *H01L 29/66477* (2013.01)

(58) Field of Classification Search
CPC ........... H01L 21/02274; H01L 21/2652; H01L 21/266; H01L 21/32139; H01L 21/823814; H01L 29/66477; H01L 21/28132; H01L 21/28141; H01L 21/2815; H01L 21/823468; H01L 21/823864; H01L 29/6656; H01L 29/66689; H01L 29/66719
USPC .................................. 438/595; 257/336, 344
See application file for complete search history.

(56) References Cited

U.S. PATENT DOCUMENTS 5,731,239 A * 3/1998 Wong ................ H01L 21/28052
257/E21.199
6,492,218 B1    12/2002 Mineji
(Continued)

FOREIGN PATENT DOCUMENTS

| JP | 2001-110913 A | 4/2001 |
| JP | 2010-245518 A | 10/2010 |

*Primary Examiner* — Duy T Nguyen
*Assistant Examiner* — Dilinh P Nguyen
(74) *Attorney, Agent, or Firm* — SGPatents PLLC

(57) ABSTRACT

The reliability of a semiconductor device is improved. A photoresist pattern is formed over a semiconductor substrate. Then, over the semiconductor substrate, a protective film is formed in such a manner as to cover the photoresist pattern. Then, with the photoresist pattern covered with the protective film, an impurity is ion implanted into the semiconductor substrate. Thereafter, the protective film is removed by wet etching, and then, the photoresist pattern is removed.

12 Claims, 26 Drawing Sheets

(56) References Cited

U.S. PATENT DOCUMENTS

| | | |
|---|---|---|
| 8,197,915 B2 | 6/2012 | Oka et al. |
| 2004/0227192 A1* | 11/2004 | Yoshida .......... H01L 21/823892 257/371 |
| 2008/0160427 A1* | 7/2008 | Kim .......................... G03F 1/26 430/5 |
| 2011/0018067 A1* | 1/2011 | Usujima ......... H01L 21/823412 257/369 |

* cited by examiner

METHOD FOR MANUFACTURING A SEMICONDUCTOR DEVICE HAVING A STEP OF PERFORMING ION IMPLANTATION USING A RESIST PATTERN AS A MASK

CROSS-REFERENCE TO RELATED APPLICATIONS

The disclosure of Japanese Patent Application No. 2017-116478 filed on Jun. 14, 2017 including the specification, drawings and abstract is incorporated herein by reference in its entirety.

BACKGROUND

The present invention relates to a method for manufacturing a semiconductor device, and is preferably applicable to, for example, a method for manufacturing a semiconductor device having a step of performing ion implantation using a resist pattern as a mask.

The manufacturing steps of a semiconductor device include an ion implantation step. With the ion implantation step, using a resist pattern as a mask, ion implantation is performed. This can prevent impurity ions from being implanted into a region which should not be subjected to ion implantation.

Japanese Unexamined Patent Application Publication No. 2001-110913 (Patent Document 1) describes a technology of performing ion implantation using a resist as a mask.

Japanese Unexamined Patent Application Publication No. 2010-245518 (Patent Document 2) describes a technology using a photoresist.

CITED DOCUMENTS

Patent Documents

[Patent Document 1] Japanese Unexamined Patent Application Publication No. 2001-110913
[Patent Document 2] Japanese Unexamined Patent Application Publication No. 2010-245518

SUMMARY

In a step of performing ion implantation using a resist pattern as a mask, the resist pattern is also subjected to ion implantation, so that a cured layer may be formed at the surface layer part of the resist pattern. The formation of a cured layer at the surface layer part of the resist pattern may cause a defect when the resist pattern is removed, or other problems, resulting in the reduction of the reliability of the semiconductor device.

Other objects and novel features will be apparent from the description of this specification and the accompanying drawings.

In accordance with one embodiment, with a method for manufacturing a semiconductor device, a resist pattern is formed over a semiconductor substrate. Then, a first film is formed over the semiconductor substrate in such a manner as to cover the resist pattern. Then, with the resist pattern covered with the first film, an impurity is ion implanted into the semiconductor substrate. Thereafter, the first film is removed by wet etching, and then, the resist pattern is removed.

In accordance with one embodiment, the reliability of a semiconductor device can be improved.

DETAILED DESCRIPTION

In description of the following embodiment, the embodiment may be described in a plurality of divided sections or embodiments for convenience, if required. However, unless otherwise specified, these are not independent of each other, but are in a relation such that one is a modification example, a detailed description, complementary explanation, or the like of a part or the whole of the other. Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, or except for other cases. Further, in the following embodiments, it is naturally understood that the constitutional elements (including element steps, or the like) are not always essential, unless otherwise specified, except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, or except for other cases. This also applies to the foregoing numerical values and ranges.

Below, embodiments will be described in details by reference to the accompanying drawings. Incidentally, in all the drawings for describing the embodiments, the members having the same function are given the same reference sign and numeral, and a repeated description thereon is omitted. Further, in the following embodiments, a description on the same or similar part will not be repeated in principle, unless otherwise required.

Further, in the accompanying drawings used in embodiments, hatching may be omitted even in a cross sectional view for ease of understanding of the drawings. Whereas, hatching may be added even in a plan view for ease of understanding of the drawings.

First Embodiment

Regarding Details of Study

The present inventors has conducted a study on a step of performing ion implantation using a resist pattern as a mask in the manufacturing steps of a semiconductor device. By performing ion implantation using a resist pattern as a mask, it is possible to implement the following: impurity ions are implanted into a region which should be subjected to ion implantation, but impurity ions are prevented from being implanted into a region which should not be subjected to ion implantation.

FIGS. 1 to 4 are each a cross sectional view showing a step relating to ion implantation of Study Example studied by the present inventors.

Figure 1:
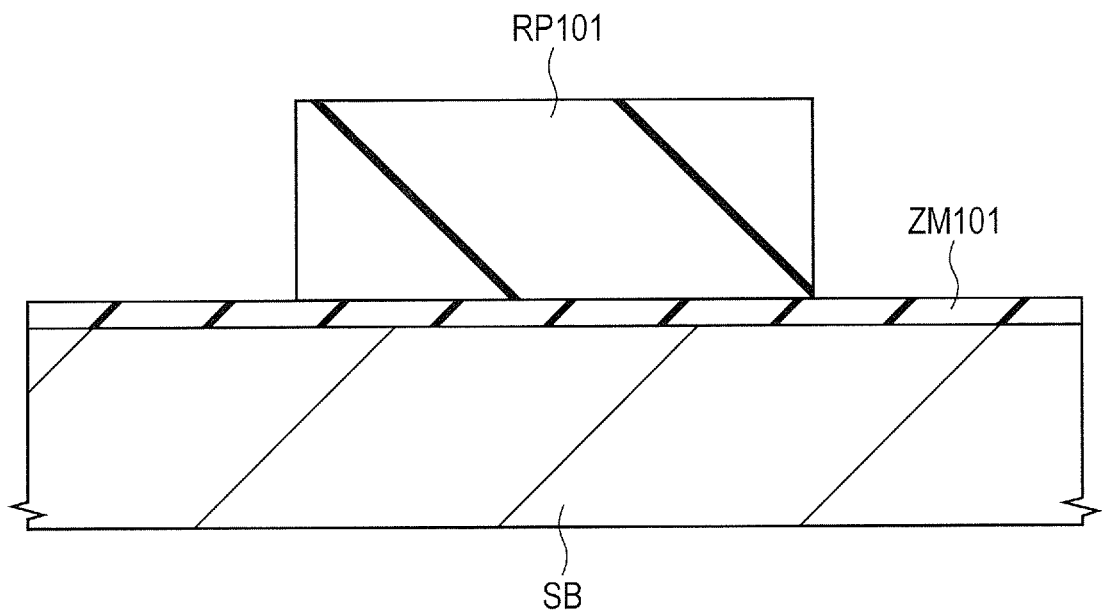
FIG. 1 is a cross sectional view showing a step relating to ion implantation of Study Example.

First, as shown in FIG. 1, an insulation film ZM101 formed of a silicon oxide film or the like is formed over the main surface of a semiconductor substrate SB. Then, over the insulation film ZM101, a photoresist pattern (resist pattern) RP101 is formed using a photolithography technology. Incidentally, the photolithography technology is the following technology: a photoresist layer is formed using a coating method (spin coating method) or the like; then, the photoresist layer is subjected to light exposure and development, thereby to be patterned; as a result, a photoresist pattern is formed. The insulation film ZM101 has a function as an implantation preventive film.

Figure 2:
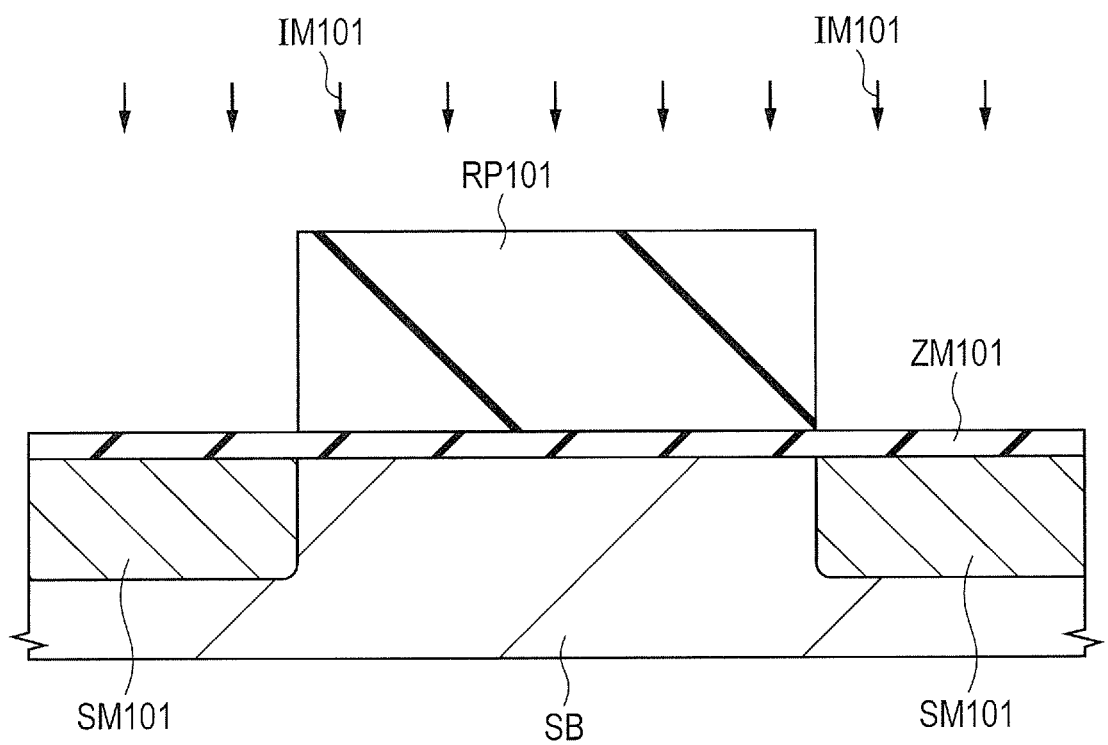
FIG. 2 is a cross sectional view showing a step relating to ion implantation following FIG. 1.

Then, as shown in FIG. 2, using the photoresist pattern RP101 as a mask, the semiconductor substrate SB is subjected to ion implantation IM101. FIG. 2 schematically shows the ion implantation IM101 by an arrow. By the ion implantation IM101, impurity ions are implanted into the semiconductor substrate SB in the region not covered with the photoresist pattern RP101, thereby to form a semiconductor region SM101. When the impurity ions to be implanted in the ion implantation IM101 are n type impurity ions, the semiconductor region SM101 is an n type semiconductor region. When the impurity ions to be implanted in the ion implantation IM101 are p type impurity ions, the semiconductor region SM101 is a p type semiconductor region. In the ion implantation IM101, the photoresist pattern RP101 functions as a mask (ion implantation inhibiting mask). For this reason, impurity ions are not implanted into the semiconductor substrate SB in the region covered with the photoresist pattern RP101.

Figure 3:
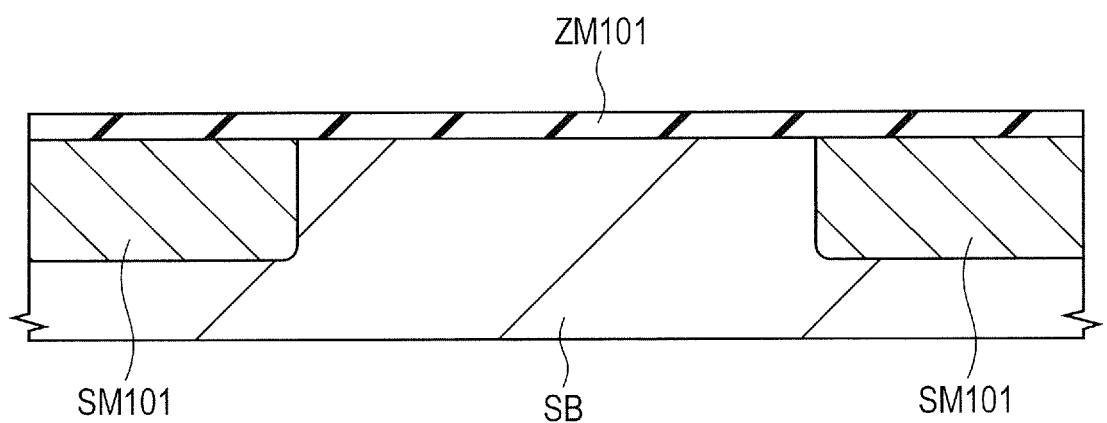
FIG. 3 is a cross sectional view showing a step relating to ion implantation following FIG. 2.
Figure 4:
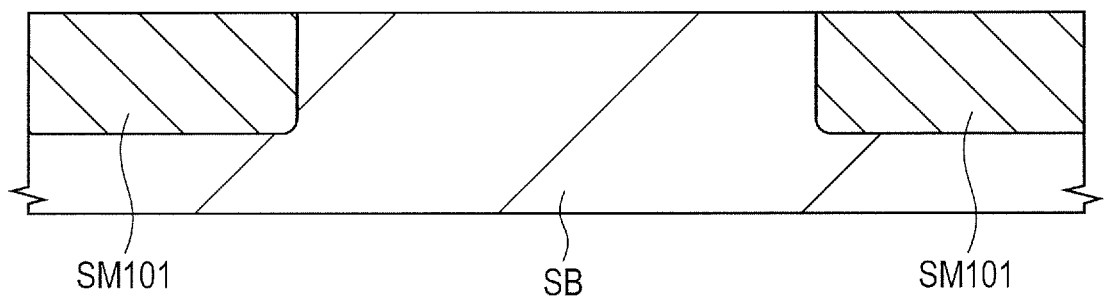
FIG. 4 is a cross sectional view showing a step relating to ion implantation following FIG. 3.

Then, as shown in FIG. 3, the photoresist pattern RP101 is removed by asking or the like. Then, as shown in FIG. 4, the insulation film ZM101 is removed by wet etching or the like.

Figure 5:
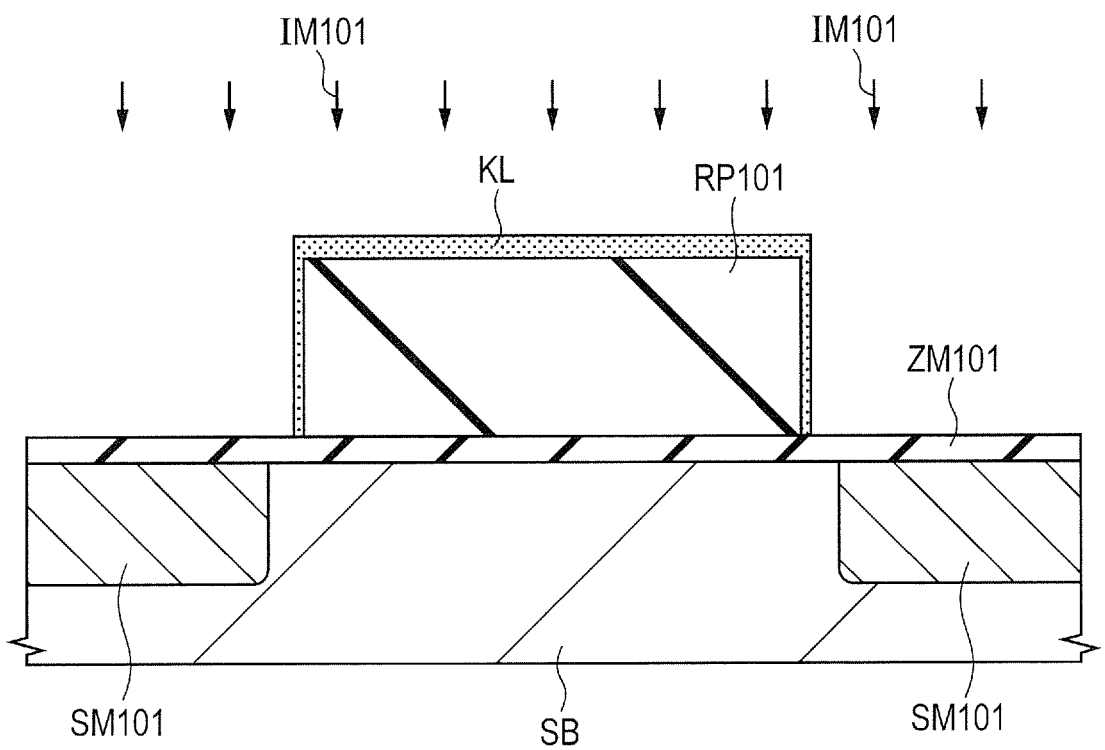
FIG. 5 is a cross sectional view for illustrating the problem of Study Example.
Figure 6:
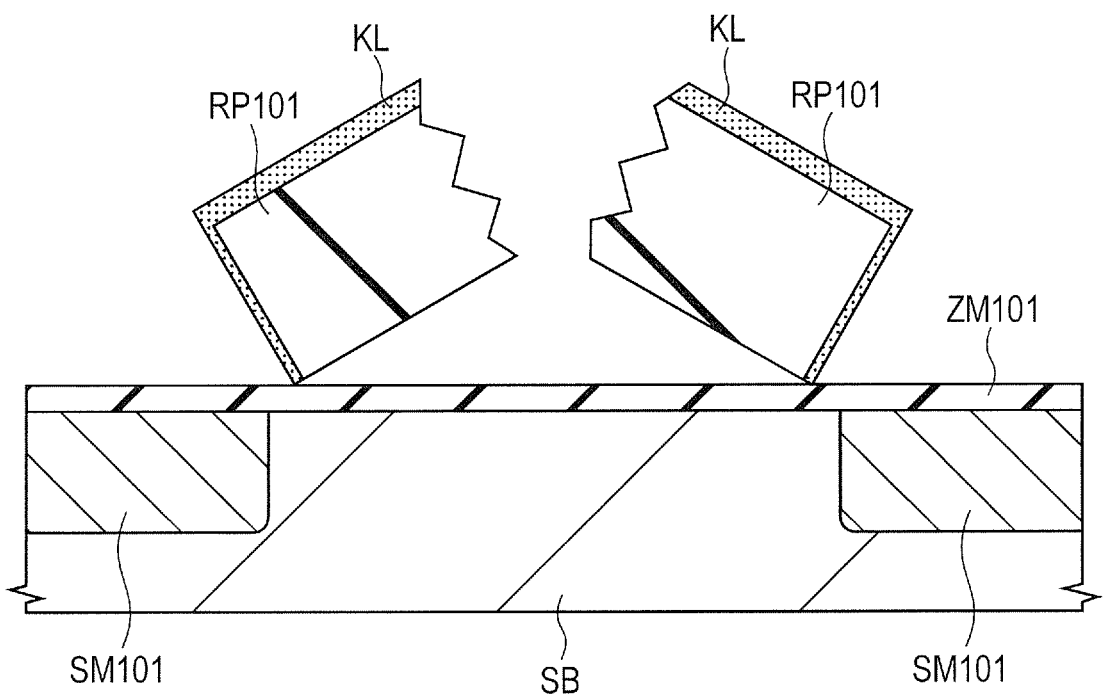
FIG. 6 is a cross sectional view for illustrating the problem of Study Example.

Then, the problems found by the present inventors will be described by reference to FIGS. 5 and 6. FIGS. 5 and 6 are each a cross sectional view for illustrating the problems in the steps of Study Example of FIGS. 1 to 4. FIG. 5 corresponds to the same step stage as that of FIG. 2. FIG. 6 corresponds to the same step stage as that of FIG. 3.

Namely, as described above, the insulation film ZM101 formed of a silicon oxide film or the like is formed over the main surface of the semiconductor substrate SB. Then, over the insulation film ZM101, a photoresist pattern RP101 is formed, resulting in the structure of FIG. 1. Then, as shown in FIG. 5, using the photoresist pattern RP101 as a mask, the semiconductor substrate SB is subjected to ion implantation IM101. By the ion implantation IM101, impurity ions are implanted into the semiconductor substrate SB in the region not covered with the photoresist pattern RP101, thereby to form a semiconductor region SM101. In the ion implantation IM101, the photoresist pattern RP101 functions as a mask. For this reason, impurity ions are not implanted into the semiconductor substrate SB in the region covered with the photoresist pattern RP101.

However, with the ion implantation IM101, impurity ions are also implanted into the surface layer part of the photoresist pattern RP101. This is because the ion implantation IM101 is performed with the photoresist pattern RP101 exposed. When the dose amount of the ion implantation IM101 is large, implantation of impurity ions into the photoresist pattern RP101 by the ion implantation IM101 results in the formation of a cured layer (modified layer) KL damaged by ion implantation at the surface (surface layer part) of the photoresist pattern RP101 as shown in FIG. 5. The cured layer KL is a region modified by damages of ion impact.

The cured layer KL has become harder than the photoresist pattern RP101 other than the cured layer KL (i.e., the unmodified region of the photoresist pattern RP101), and is difficult to remove by either an ashing treatment (e.g., an oxygen plasma treatment), or a wet treatment. For this reason, when the cured layer KL is formed at the surface (surface layer part) of the photoresist pattern RP101, it becomes difficult to perform the removal step of the photoresist pattern RP101.

For example, when the photoresist pattern RP101 is tried to be removed by an ashing treatment after the ion implantation IM101, the ashing treatment proceeds in a state in which the unmodified region (the region which has not become the cured layer KL) of the photoresist pattern RP101 tends to be decomposed by the ashing treatment, but the cured layer KL is less likely to be decomposed. For this reason, in the ashing treatment, only the unmodified region of the photoresist pattern RP101 is decomposed, and the cured layer KL is hardly decomposed. Thus, a so-called popping phenomenon may be caused. The popping phenomenon is a phenomenon in which the decomposed photoresist material (unmodified region) breaks through the cured layer, resulting in burst of the photoresist pattern. FIG. schematically illustrates the state in which a popping phenomenon has been caused upon removing the photoresist pattern RP101 by an ashing treatment. Further, expansion or shrinkage caused by the difference between the thermal expansion coefficient of the unmodified region of the photoresist pattern RP101 and the thermal expansion coefficient of the cured layer KL may also cause a popping phenomenon.

When a popping phenomenon is caused, the burst photoresist pattern (cured layer KL and photoresist material) may scatter to unexpected sites, to remain as foreign matters (particles). Formation of the foreign matters may lead to a reduction of the reliability and the manufacturing yield of the semiconductor device to be manufactured, and hence is undesirable. Further, when a popping phenomenon is caused, the burst photoresist pattern scatters as foreign matters (particles) into the manufacturing device (ashing device), which may adversely affect the next treatment to be performed using the manufacturing device.

Further, the cured layer KL is also difficult to remove by a wet treatment. For this reason, even when after the ion implantation IM101, the photoresist pattern RP101 is removed by a wet treatment, the cured layer KL formed at the surface (surface layer part) of the photoresist pattern RP101 is difficult to remove. Accordingly, the photoresist pattern RP101 cannot be fully removed, so that a part (the residue) of the photoresist pattern RP101 may remain as foreign matters (particles). The formation of the foreign matters may lead to a reduction of the reliability and the manufacturing yield of the semiconductor device to be manufactured, and hence is undesirable.

For this reason, when the cured layer KL is formed at the surface (surface layer part) of the photoresist pattern RP101 by the ion implantation IM101, it becomes difficult to perform the removal step of the photoresist pattern RP101 in either of the case using an ashing treatment or the case using a wet treatment for removal of the photoresist pattern RP101. This may lead to a reduction of the reliability and the manufacturing yield of the semiconductor device to be manufactured.

In order to improve the reliability and the manufacturing yield of the semiconductor device to be manufactured, it is desirable to prevent the defect caused by the formation of the cured layer at the surface (surface layer part) of the photoresist pattern by ion implantation.

Incidentally, in the steps of Study Example of FIGS. 1 to 4, the formation of the insulation film ZM101 may be conceivably omitted. Also in that case, the problem described by reference to FIGS. 5 and 6 may be caused. For this reason, the problem described by reference to FIGS. 5 and 6 is the problem caused irrespective of whether the insulation film ZM101 is present or not.

Step Relating to Ion Implantation

Figure 7:
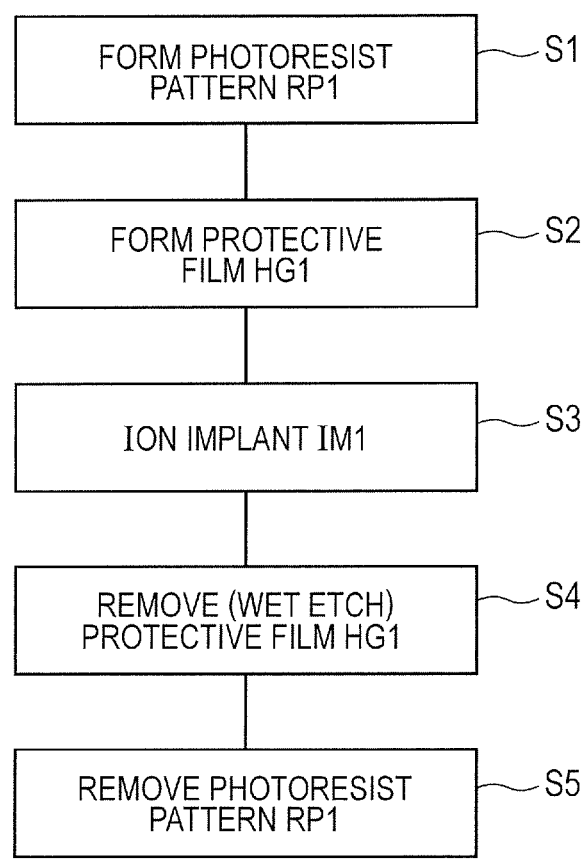
FIG. 7 is a step flowchart showing a step relating to ion implantation of the present embodiment.

FIG. 7 is a step flowchart showing a step relating to ion implantation of the present embodiment. FIGS. 8 to 12 are each a cross sectional view showing a step relating to ion implantation of present embodiment, and each show from a resist pattern formation step through an ion implantation step to a resist pattern removal step.

Figure 8:
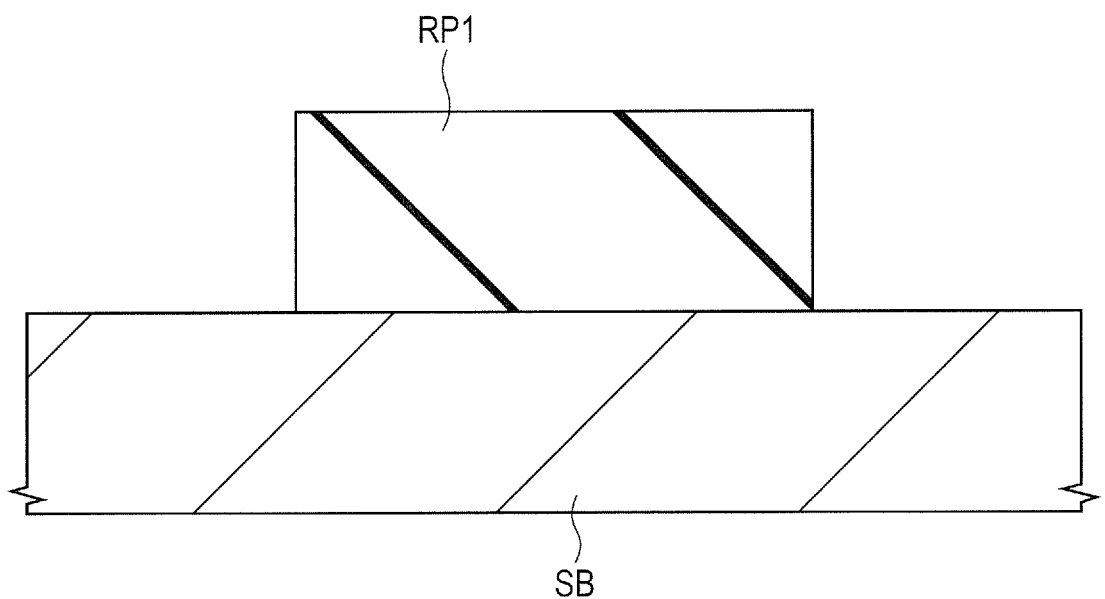
FIG. 8 is a cross sectional view showing a step relating to ion implantation of the present embodiment.

First, as shown in FIG. 8, over the main surface of the semiconductor substrate SB, a photoresist pattern (resist pattern or mask layer) RP1 is formed as a resist pattern using a photolithography technology (Step S1 of FIG. 7).

Figure 9:
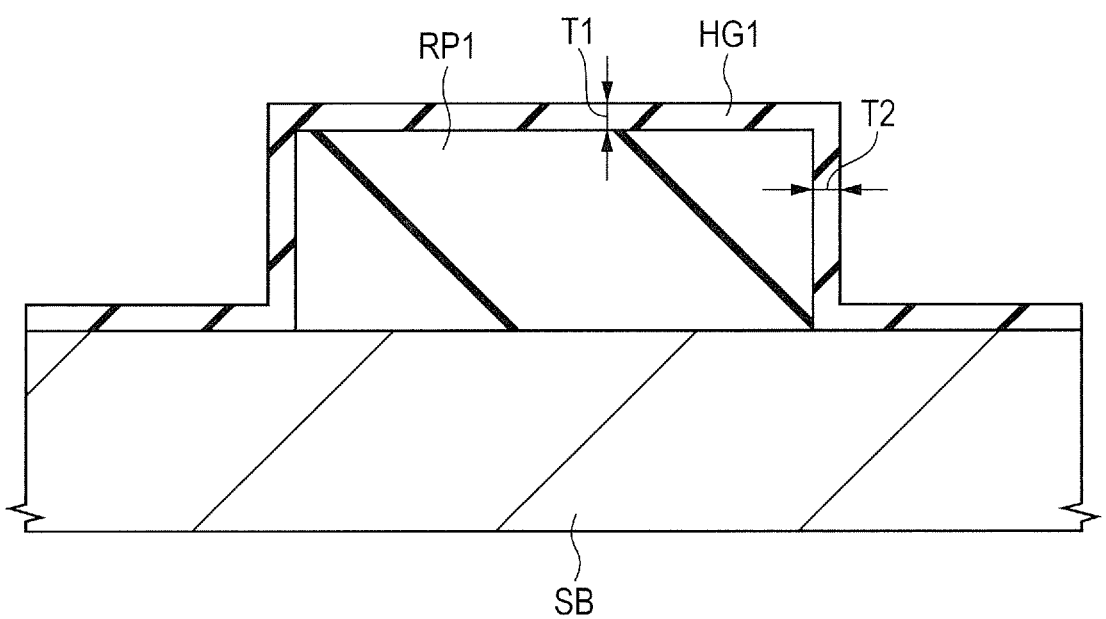
FIG. 9 is a cross sectional view showing a step relating to ion implantation following FIG. 8.

Then, as shown in FIG. 9, over the main surface of the semiconductor substrate SB, a protective film (insulation film) HG1 is formed in such a manner as to cover the photoresist pattern RP1 (Step S2 of FIG. 7). The protective film HG1 is formed of a material easy to remove by wet etching, and is formed of preferably a silicon oxide film or a silicon nitride film, and is formed of more preferably a silicon oxide film.

The protective film HG1 can be formed preferably using a CVD (Chemical Vapor Deposition) method or an ALD (Atomic Layer Deposition) method. Formation of the protective film HG1 by a CVD method or an ALD method can form the protective film HG1 having a desirable thickness with good controllability and precision. By using a CVD method or an ALD method, the protective film HG1 is formed with almost the same thickness over the top surface and over the side surface of the photoresist pattern RP1. Namely, when a CVD method or an ALD method is used, the thickness (film thickness) T1 of the protective film HG1 formed over the top surface of the photoresist pattern RP1 and the thickness (film thickness) T2 of the protective film HG1 formed over the side surface of the photoresist pattern RP1 are almost equal to each other (T1=T2). Further, as compared with a thermal CVD method, a plasma CVD method or an ALD method enables deposition at lower temperatures, and is more advantageous in suppressing or preventing modification (thermal decomposition) of the photoresist pattern RP1. For this reason, the protective film HG1 is more preferably formed using a plasma CVD method or an ALD method. Further, as compared with the plasma CVD method, the ALD method is still more excellent in controllability of the film thickness. For this reason, the protective film HG1 is still more preferably formed using an ALD method. Therefore, as the deposition method of the protective film HG1, a CVD method or an ALD method can be preferably used. In order to enable deposition at low temperatures, a plasma CVD method or an ALD method is more preferable. In consideration of the controllability of the film thickness, an ALD method is most preferable.

When the deposition temperature of the protective film HG1 is too high, the photoresist pattern RP1 may be modified (thermally decomposed) during deposition of the protective film HG1. For this reason, the protective film HG1 is preferably formed at relatively lower temperatures. The deposition temperature (the temperature of the semiconductor substrate SB during deposition) of the protective film HG1 is preferably 200° C. or less. This can surely prevent the modification (thermal decomposition) of the photoresist pattern RP1 during deposition of the protective film HG1. For this reason, as the deposition method of the protective film HG1, a plasma CVD method or an ALD method at low temperatures (200° C. or less, such as 100 to 200° C.) is particularly preferable.

Figure 10:
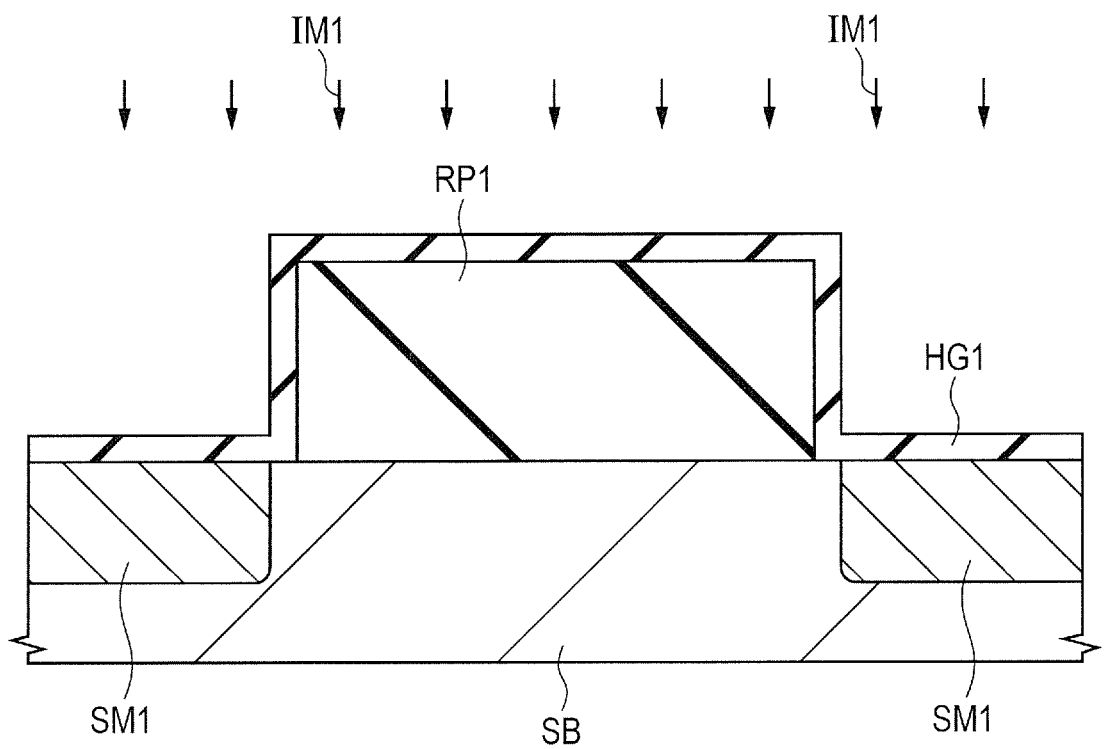
FIG. 10 is a cross sectional view showing a step relating to ion implantation following FIG. 9.

Then, as shown in FIG. 10, using the photoresist pattern RP1 as a mask, the semiconductor substrate SB is subjected to ion implantation IM1 (Step S3 of FIG. 7). In FIG. 10, the ion implantation IM1 is schematically indicated with arrows.

With the photoresist pattern RP1 covered with the protective film HG1, the ion implantation IM1 is performed. Accordingly, in the ion implantation IM1, the photoresist pattern RP1 and the portion of the protective film HG1 covering the photoresist pattern RP1 can function as a mask (ion implantation inhibiting mask). Namely, the photoresist pattern RP1, the protective film HG1 over the upper surface of the photoresist pattern RP1, and the protective film HG1 over the side surface of the photoresist pattern RP1 can function as a mask.

In Step S3, by the ion implantation IM1, impurity ions are implanted into the semiconductor substrate SB in the region not covered with the photoresist pattern RP1, thereby to form a semiconductor region SM1. When the impurity ions to be implanted in the ion implantation IM1 are n type impurity ions, the semiconductor region SM1 is an n type semiconductor region. When the impurity ions to be implanted in the ion implantation IM1 are p type impurity ions, the semiconductor region SM1 is a p type semiconductor region. In the ion implantation IM1 of Step S3, the photoresist pattern RP1 functions as a mask (ion implantation inhibiting mask). Accordingly, impurity ions are not implanted into the semiconductor substrate SB in the region covered with the photoresist pattern RP1.

In the step of FIG. 5, with the photoresist pattern RP101 being exposed, the ion implantation IM101 is performed. For this reason, the cured layer KL is formed at the photoresist pattern RP101. However, the portion to be the cured layer KL at the photoresist pattern RP101 is the surface layer part (the surface layer part of the photoresist pattern RP101) which is susceptible to damage (damage by ion impact) of ion implantation.

However, in Step S3, the ion implantation IM1 is not performed with the photoresist pattern RP1 exposed, but is performed with the photoresist pattern RP1 covered with the protective film HG1. The photoresist pattern RP1 is covered with the protective film HG1, and hence becomes less susceptible to damage (damage by ion impact) due to the ion implantation IM1. This prevents the formation of the cured layer KL at the photoresist pattern RP1 even when the ion implantation IM1 is performed.

Figure 11:
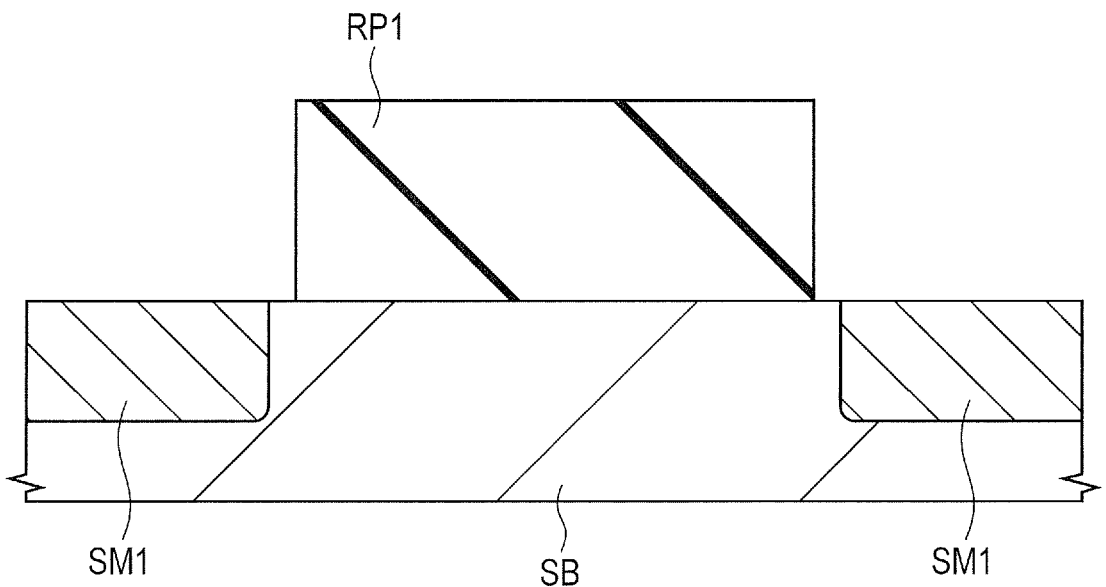
FIG. 11 is a cross sectional view showing a step relating to ion implantation following FIG. 10.

Then, as shown in FIG. 11, the protective film HG1 is removed by a wet etching treatment (Step S4 of FIG. 7). In Step S4, the protective film HG1 is removed, thereby to expose the photoresist pattern RP1.

Further, in Step S4, the protective film HG1 is etched under the conditions in which the protective film HG1 tends to be etched. For this reason, in Step S4, the protective film HG1 is etched under the conditions in which the protective film HG1 is more likely to be etched than the photoresist pattern RP1. Namely, in Step S4, the protective film HG1 is etched under the conditions in which the etching rate of the protective film HG1 is larger than the etching rate of the photoresist pattern RP1. In other words, in Step S4, the protective film HG1 is etched under the conditions in which the photoresist pattern RP1 is less likely to be etched than the protective film HG1. For this reason, in Step S4, the protective film HG1 can be selectively etched and removed.

Incidentally, the wording "B is more likely to be etched than A" corresponds to the wording "the etching rate of B is larger than the etching rate of A". Whereas, the wording "B is less likely to be etched than A" corresponds to the wording "the etching rate of B is smaller than the etching rate of A". Further, the etching rate being small is synonymous with the etching rate being slow, and is also synonymous with the etching rate being low. Whereas, the etching rate being large is synonymous with the etching rate being fast, and is also synonymous with the etching rate being high. When etching is easier, the etching rate increases. When etching is more difficult, the etching rate decreases.

Further, in Step S4, the protective film HG1 is etched under the conditions in which the underlayer (herein, the semiconductor substrate SB) of the protective film HG1 is less likely to be etched than the protective film HG1. As a result, in Step S4, even when the protective film HG1 is removed, and the underlayer (herein, the semiconductor substrate SB) of the protective film HG1 is exposed, the underlayer (herein, the semiconductor substrate SB) can be suppressed or prevented from being etched.

Impurity ions are implanted into the protective film HG1 by the ion implantation IM1. However, as the materials for the protective film HG1, the materials easy to remove by wet etching have been previously selected. For this reason, even when impurity ions are implanted into the protective film HG1 by the ion implantation IM1, by performing a wet etching treatment after the ion implantation IM1, it is possible to remove the protective film HG1 with ease and reliability.

In other words, as described in the column of "Regarding the details of study", when at the photoresist pattern, a cured layer is formed by ion implantation with a large dose amount, the cured layer is difficult to remove either by asking or by a wet treatment, and hence may cause a defect upon removing the photoresist pattern. However, the protective film HG1 is originally formed of a material easy to remove by wet etching, and hence can be removed by wet etching with ease and reliability even when damaged by the ion implantation IM1. For this reason, by performing a wet etching treatment after the ion implantation IM1, it is possible to remove the protective film HG1 with ease and reliability.

In order to facilitate removal of the protective film HG1 by wet etching in Step S4, the material for the protective film HG1 is previously selected. From this viewpoint, the protective film HG1 is preferably formed of a silicon oxide film or a silicon nitride film, and is more preferably formed of a silicon oxide film. When the protective film HG1 is a silicon oxide film, in Step S4, hydrofluoric acid can be preferably used as an etchant. Incidentally, in the present application, the term "hydrofluoric acid" also includes dilute hydrofluoric acid. Alternatively, when the protective film HG1 is a silicon nitride film, in Step S4, hot phosphoric acid (heated phosphoric acid) can be preferably used as an etchant.

Figure 12:
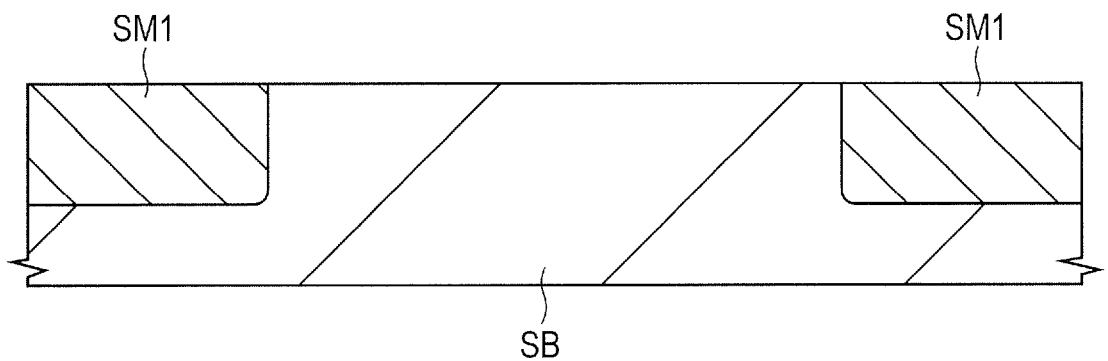
FIG. 12 is a cross sectional view showing a step relating to ion implantation following FIG. 11.

Then, as shown in FIG. 12, the photoresist pattern RP1 is removed (Step S5 of FIG. 7).

The ion implantation IM1 is performed with the photoresist pattern RP1 covered with the protective film HG1. For this reason, even when the ion implantation IM1 is performed, the cured layer (KL) is not formed at the photoresist pattern RP1. Accordingly, in Step S5, it is essential only that the photoresist pattern RP1 with no cured layer (KL) formed therein is removed. For this reason, in Step S5, the photoresist pattern RP1 can be removed with ease and reliability.

Namely, when in Step S5, the photoresist pattern RP1 is removed by an ashing treatment (e.g., an oxygen plasma treatment), the ashing treatment proceeds with the cured layer (KL) not formed at the photoresist pattern RP1. Accordingly, in the ashing treatment, the entire photoresist pattern RP1 is decomposed, so that the photoresist pattern RP1 can be removed without generating the residue of the photoresist pattern RP1. The photoresist pattern RP1 is subjected to an asking treatment with the cured layer (KL) not formed therein. This can prevent the occurrence of the popping phenomenon caused by the cured layer (KL) of the photoresist pattern.

Alternatively, in Step S5, the photoresist pattern RP1 can also be removed by a wet treatment. In the wet treatment, the resist pattern (herein, the photoresist pattern RP1) is removed using a chemical (resist releasing solution). In this case, the wet treatment is performed with the cured layer (KL) not formed at the photoresist pattern RP1. Accordingly, in the wet treatment, the entire photoresist pattern RP1 is decomposed, so that the photoresist pattern RP1 can be removed without generating the residue of the photoresist pattern RP1.

Further, when Step S5 is performed as a wet treatment, the chemical (etchant) for use in Step S4 and the chemical (resist releasing solution) for use in Step S5 are different from each other. Step S4 and Step S5 can be performed in different treatment tanks. However, according to the specifications of the treatment device, Step S4 and Step S5 can also be performed by using the same treatment tank, and replacing the chemical.

In this manner, the step relating to ion implantation can be performed. Thereafter, if required, the next step is performed, but is not shown and is not described herein.

In the present embodiment, the ion implantation IM1 of Step S3 is performed not with the photoresist pattern RP1 being exposed, but with the photoresist pattern RP1 covered with the protective film HG1. For this reason, even when the ion implantation IM1 is performed, the cured layer (KL) is prevented from being formed at the photoresist pattern RP1. In Step S5, it is essential only that the photoresist pattern RP1 not including the cured layer (KL) formed therein is removed. Accordingly, the photoresist pattern RP1 can be removed with ease and reliability. It is possible to prevent the defect (e.g., the popping phenomenon upon removing the photoresist pattern) caused by the formation of the cured layer at the surface (surface layer part) of the photoresist pattern by ion implantation. For this reason, it is possible to improve the reliability of the semiconductor device to be manufactured. Further, it is possible to improve the manufacturing yield of the semiconductor device.

Further, in the ion implantation IM1 of Step S3, impurity ions pass through the protective film HG1, to be implanted into the semiconductor substrate SB. This can suppress or prevent the damage (damage due to ion impact) of ion implantation from being imposed on the semiconductor substrate SB. As a result, it is possible to improve the performances of the manufactured semiconductor device.

Further, in the ion implantation IM1 of Step S3, impurity ions may pass through the protective film HG1, to be also implanted into the photoresist pattern RP1. However, when a given film is subjected to ion implantation, damage due to ion implantation is imposed only on the very shallow region in the vicinity of the surface of the film. In the film, the damage in the inside region into which impurity ions have been implanted is relatively smaller. This is due to the following: the damage due to ion implantation is mainly damage due to ion impact, and the damage due to ion impact is concentrated to the film surface on which the ions have been impacted, and its vicinity. For this reason, in the ion implantation IM1 of Step S3, when impurity ions pass through the protective film HG1, to be implanted into the photoresist pattern RP1, the interposition of the protective film HG1 causes the impurity ions to be dispersed upon reaching the surface of the photoresist pattern RP1. This can prevent the implanted ion species from being concentrated on the surface of the photoresist pattern RP1. In other words, the protective film HG1 over the photoresist pattern RP1 does not have to completely hinder the impurity ions from passing therethrough (the protective film HG1 does not have to be formed so thick). The impurity ions which have passed through the protective film HG1, to reach the photoresist pattern RP1 are dispersed. This can prevent the formation of the cured layer (KL) at the photoresist pattern RP1, which can prevent the popping phenomenon.

From this viewpoint, the thickness (film thickness) of the protective film HG1 formed in Step S2 is preferably 10 nm or more. With such a configuration, it is possible to surely prevent the formation of the cured layer (KL) at the photoresist pattern RP1 in the ion implantation IM1 of Step S3.

Whereas, when the protective film HG1 is unnecessarily made thick, it becomes difficult to implant impurity ions into the semiconductor substrate SB through the protective film HG1. For this reason, the thickness (film thickness) of the protective film HG1 formed in Step S2 is more preferably 10 to 20 nm.

Incidentally, when the ion implantation IM101 is performed, as shown in FIG. 5, the photoresist pattern RP101 is damaged by the ion implantation, which may result in the formation of the cured layer KL. However, the portion in which the cured layer KL is highly possibly formed is the vicinity of the upper surface of the photoresist pattern RP101. The cured layer KL is less likely to be formed on the side surface side of the photoresist pattern RP101. This is due to the following: as compared with the fact that a large amount of impurity ions are implanted from the upper surface of the photoresist pattern RP101 into the photoresist pattern RP101, the impurity ions are implanted from the side surface of the photoresist pattern RP101 into the photoresist pattern RP101 scarcely, or implanted in a small amount, if any. For this reason, it is the portion of the protective film HG1 formed over the upper surface of the photoresist pattern RP1 of the protective film HG1 covering the photoresist pattern RP1 that mainly has an action of preventing the formation of the cured layer (KL) associated with ion implantation at the photoresist pattern RP1. Therefore, in order to surely prevent the formation of the cured layer (KL) at the photoresist pattern RP1 in the ion implantation IM1 of Step S3, not the thickness (film thickness) T2 of the protective film HG1 formed over the side surface of the photoresist pattern RP1 but the thickness (film thickness) T1 of the protective film HG1 formed over the upper surface of the photoresist pattern RP1 in Step S2 is important.

For this reason, the preferable thickness of the protective film HG1 is particularly effectively applied to that of the protective film HG1 formed over the upper surface of the photoresist pattern RP1. Namely, the thickness T1 of the protective film HG1 formed over the upper surface of the photoresist pattern RP1 is preferably 10 nm or more. The thickness T1 of the protective film HG1 formed over the upper surface of the photoresist pattern RP1 is more preferably 10 to 20 nm. This is also applicable to protective films HG1$a$, HG1$b$, HG1$c$, HG1$d$, HG1$e$, and HG1$f$ described later. Namely, the thickness T1$a$ (FIG. 23) of the protective film HG1$a$ described later formed over the upper surface of a photoresist pattern RP4$p$ described later, and the thickness T1$b$ (FIG. 28) of the protective film HG1$b$ described later formed over the upper surface of a photoresist pattern RP4$n$ described later are both preferably 10 nm or more, and more preferably 10 to 20 nm. Further, the thickness T1$c$ (FIG. 35) of the protective film HG1$c$ described later formed over the upper surface of a photoresist pattern RP4$p$ described later, and the thickness T1$d$ (FIG. 39) of the protective film HG1$d$ described later formed over the upper surface of the photoresist pattern RP4$n$ described later are both preferably 10 nm or more, and more preferably 10 to 20 nm. Further, the thickness T1$e$ (FIG. 44) of the protective film HG1$e$ described later formed over the upper surface of a photoresist pattern RP4$p$ described later, and the thickness T1$f$ (FIG. 48) of the protective film HG1$f$ described later formed over the upper surface of the photoresist pattern RP4$n$ described later are both preferably 10 nm or more, and more preferably 10 to 20 nm. As a result, it is possible to surely prevent the formation of the cured layer (KL) at the photoresist pattern (RP1, RP4$p$, or RP4$n$) by ion implantation.

Further, when ion implantation is performed with the photoresist pattern exposed, the risk of formation of the cured layer (KL) at the photoresist pattern increases with an increase in weight of the ion species and an increase in dose amount of ion implantation. A study by the present inventors indicated as follows: in the case where the ion species (dose species) of ion implantation is P (phosphorus), and the dose amount is $1 \times 10^{15}/\text{cm}^2$ or more, when ion implantation is performed with the photoresist pattern exposed, the cured layer (KL) may be formed at the photoresist pattern. For this reason, the steps of FIGS. 7 to 12 produce a large effect when applied to the case where the dose amount of the ion implantation IM1 is $1 \times 10^{15}/\text{cm}^2$ or more, and produce a still larger effect when the ion species of the ion implantation IM1 is P (phosphorus).

On the other hand, in the case where the dose amount of ion implantation is less than $1 \times 10^{15}/\text{cm}^2$, even when ion implantation is performed with the photoresist pattern exposed, the risk of formation of the cured layer (KL) at the photoresist pattern is relatively smaller. For this reason, when the dose amount of ion implantation is less than $1 \times 10^{15}/\text{cm}^2$, the steps of FIGS. 7 to 12 are applicable. However, even when the steps are not applied, the risk of formation of the cured layer (KL) at the photoresist pattern is relatively smaller. When the steps of FIGS. 7 to 12 are not applied (i.e., when Steps S2 and S4 are not performed), the number of manufacturing steps of a semiconductor device can be suppressed.

Regarding Application Example of Manufacturing Steps of Semiconductor Device

The steps of FIGS. 7 to 12 are applicable to various steps of ion implanting an impurity into a semiconductor substrate. Below, a description will be given to the case where the steps are applied to the steps of forming semiconductor regions with a high impurity density for source/drain.

Specific manufacturing steps of the semiconductor device to which the steps of FIGS. 7 to 12 are applied will be described by reference to FIGS. 13 to 33. FIGS. 13 to 33 are each an essential part cross sectional view of the semiconductor device of the present embodiment during a manufacturing step. Each cross sectional view of FIGS. 13 to 33 shows the essential part cross sectional view of an nMISFET formation region 1A and a pMISFET formation region 1B, and shows the manner in which an n channel type MISFET (Metal Insulator Semiconductor Field Effect Transistor) is formed in the nMISFET formation region 1A, and a p channel type MISFET is formed in the pMISFET formation region 1B.

Figure 13:
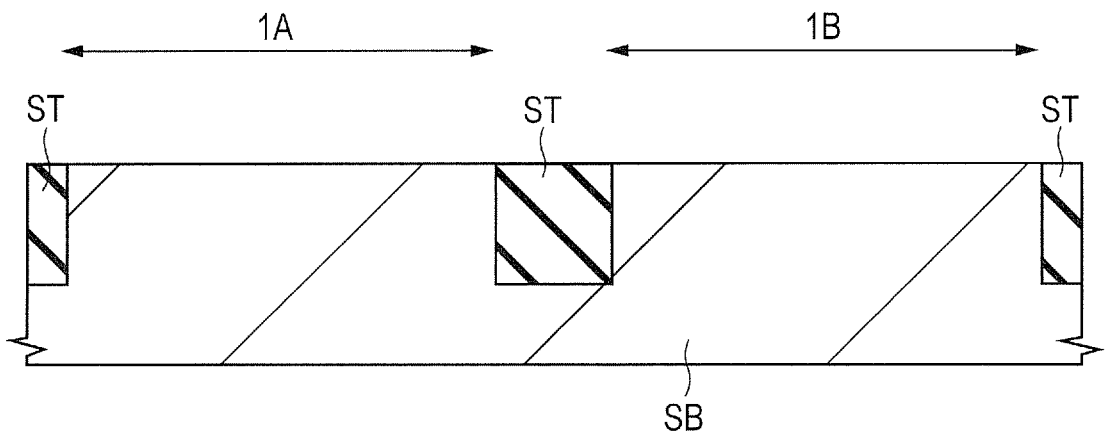
FIG. 13 is an essential part cross sectional view of a semiconductor device of one embodiment during a manufacturing step.

First, as shown in FIG. 13, a semiconductor substrate (semiconductor wafer) SB formed of, for example, a p type single crystal silicon having a specific resistance of about 1 to 10 Ωcm is provided (prepared). The semiconductor substrate SB has the nMISFET formation region 1A and the pMISFET formation region 1B.

Herein, the nMISFET formation region 1A is the region of the main surface of the semiconductor substrate SB in which an n channel type MISFET is to be formed. Whereas, the pMISFET formation region 1B is the region of the main surface of the semiconductor substrate SB in which a p channel type MISFET is to be formed. The nMISFET formation region 1A and the pMISFET formation region 1B are present at the same semiconductor substrate SB. Namely, the nMISFET formation region 1A and the pMISFET formation region 1B correspond to mutually different plan regions of the main surface of the same semiconductor substrate SB.

Then, as shown in FIG. 13, in the main surface of the semiconductor substrate SB, an element isolation region ST for defining (partitioning) an active region is formed. The element isolation region ST can be formed by, for example, a STI (Shallow Trench Isolation) method.

Figure 14:
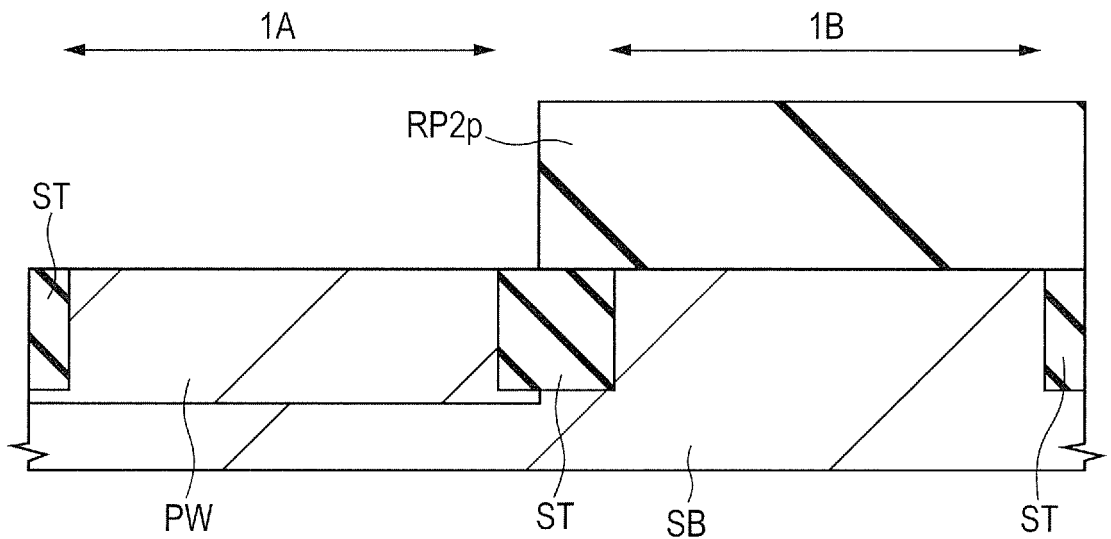
FIG. 14 is an essential part cross sectional view of the semiconductor device during a manufacturing step following FIG. 13.
Figure 15:
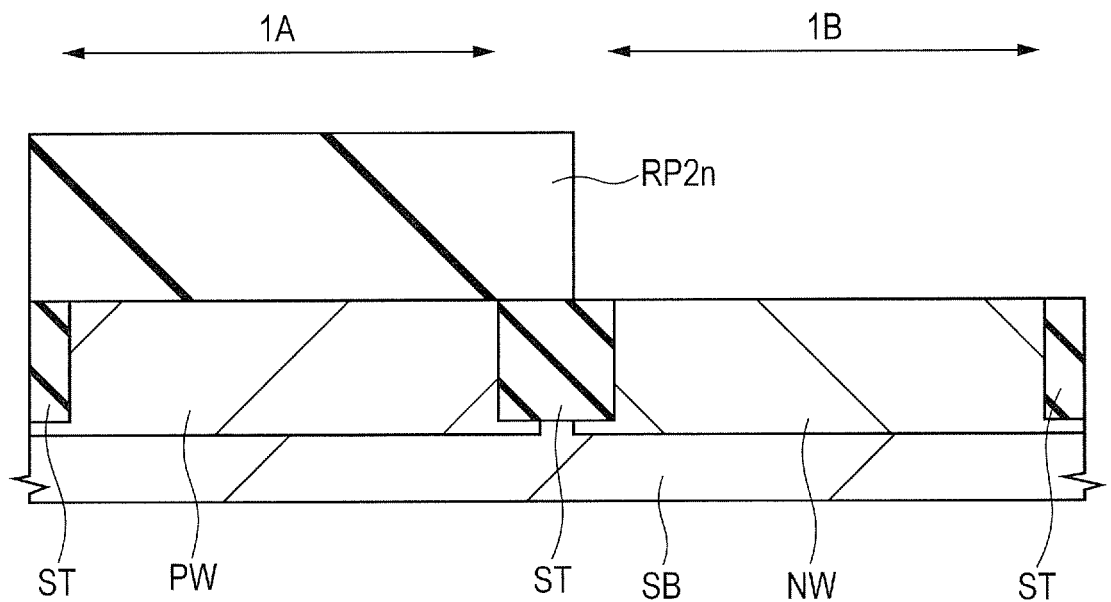
FIG. 15 is an essential part cross sectional view of the semiconductor device during a manufacturing step following FIG. 14.

Then, as shown in FIGS. 14 and 15, in the nMISFET formation region 1A, a p type well (p type semiconductor region) PW is formed to a prescribed depth from the main surface of the semiconductor substrate SB. In the pMISFET formation region 1B, an n type well (n type semiconductor region) NW is formed to a prescribed depth from the main surface of the semiconductor substrate SB.

For forming the p type well PW, first, as shown in FIG. 14, a photoresist pattern (resist pattern or mask layer) RP2p covering the pMISFET formation region 1B, and exposing the nMISFET formation region 1A is formed over the main surface of the semiconductor substrate SB using a photolithography technology. Then, using the photoresist pattern RP2p as a mask (ion implantation inhibiting mask), a p type impurity (e.g., boron) is ion implanted into the semiconductor substrate SB in the nMISFET formation region 1A. As a result, as shown in FIG. 14, the p type well PW can be formed. After forming the p type well PW, the photoresist pattern RP2p is removed by ashing or the like. Further, for forming the n type well NW, first, as shown in FIG. 15, a photoresist pattern (resist pattern or mask layer) RP2n covering the nMISFET formation region 1A, and exposing the pMISFET formation region 1B is formed over the main surface of the semiconductor substrate SB using a photolithography technology. Then, using the photoresist pattern RP2n as a mask (ion implantation inhibiting mask), an n type impurity (e.g., phosphorus) is ion implanted into the semiconductor substrate SB in the pMISFET formation region 1B. As a result, as shown in FIG. 15, then type well NW can be formed. After forming the n type well NW, the photoresist pattern RP2n is removed by ashing or the like. Either of the p type well PW and then type well NW may be formed first.

Further, herein, the steps of FIGS. 7 to 12 are not applied to the step of forming the p type well PW by ion implantation, and the step of forming the n type well NW by ion implantation. However, as another aspect, the steps of FIGS. 7 to 12 are also applicable. However, with the ion implantation for forming the p type well PW, and the ion implantation for forming the n type well NW, the dose amount is not so large. For this reason, even when ion implantation is performed with the photoresist pattern (RP2p or RP2n) exposed, the risk of formation of the cured layer (KL) at the photoresist pattern (RP2p or RP2n) is relatively smaller. For this reason, to the step of forming the p type well PW by ion implantation, and the step of forming the n type well NW by ion implantation, the steps of FIGS. 7 to 12 are applicable, but the steps of FIGS. 7 to 12 are not required to be applied. By not applying the steps, it is possible to suppress the number of manufacturing steps of the semiconductor device.

Incidentally, when the steps of FIGS. 7 to 12 are applied to the step of forming the p type well PW by ion implantation, in the steps of FIGS. 7 to 12, the photoresist pattern RP1 corresponds to the photoresist pattern RP2p, and the semiconductor region SM1 corresponds to the p type well PW. Further, when the steps of FIGS. 7 to 12 are applied to the step of forming the n type well NW by ion implantation, in the steps of FIGS. 7 to 12, the photoresist pattern RP1 corresponds to the photoresist pattern RP2n, and the semiconductor region SM1 corresponds to the n type well NW.

Figure 16:
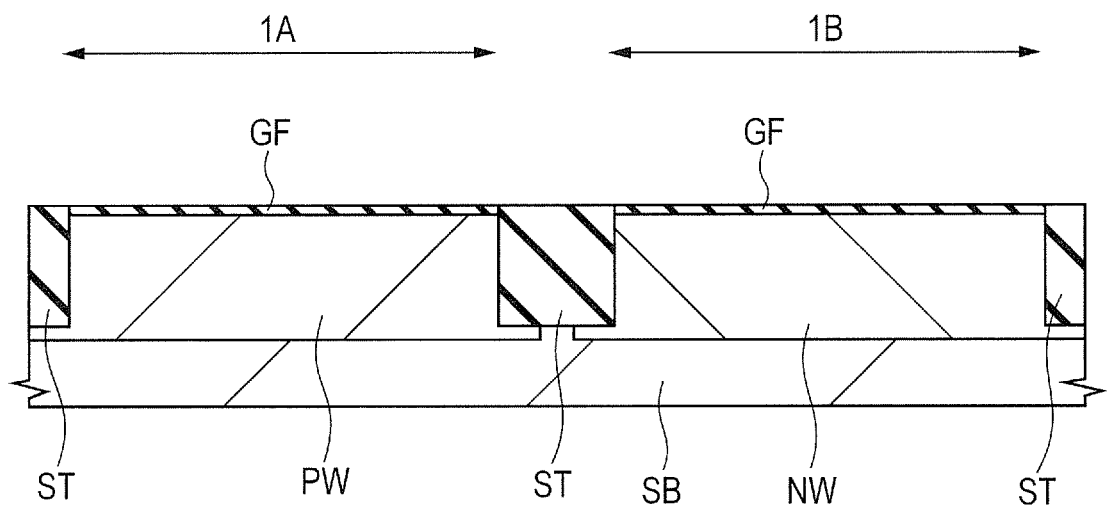
FIG. 16 is an essential part cross sectional view of the semiconductor device during a manufacturing step following FIG. 15.

Then, for example, by wet etching using hydrofluoric acid (dilute hydrofluoric acid), the surface of the semiconductor substrate SB (the p type well PW and then type well NW) is cleaned. Then, as shown in FIG. 16, at the surface of the semiconductor substrate SB (the surfaces of the p type well PW and the n type well NW), an insulation film GF for gate insulation film is formed. The insulation film GF is formed of, for example, a thin silicon oxide film, and can be formed by a thermal oxidation method, or the like.

Figure 17:
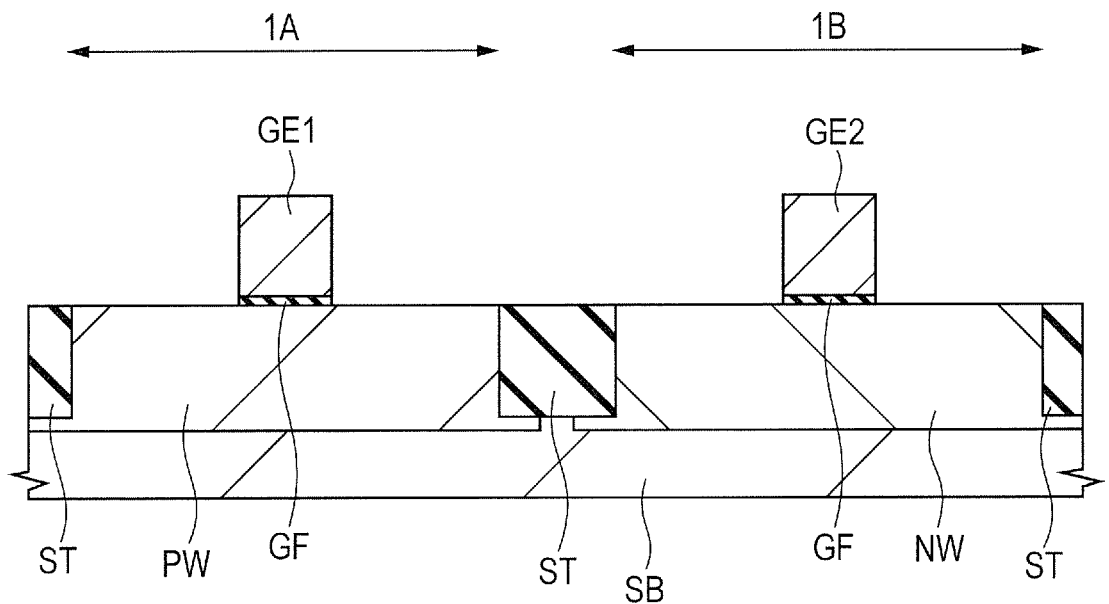
FIG. 17 is an essential part cross sectional view of the semiconductor device during a manufacturing step following FIG. 16.

Then, as shown in FIG. 17, gate electrodes GE1 and GE2 are formed. The gate electrodes GE1 and GE2 can be formed, for example, in the following manner.

Namely, over the main surface (the entire main surface) of the semiconductor substrate SB, namely, over the insulation film GF in the nMISFET formation region 1A and the pMISFET formation region 1B, a silicon film (doped polysilicon film) is formed as a conductive film for gate electrode. Then, the silicon film is patterned using a photolithography technology and an etching technology. As a result, the gate electrodes GE1 and GE2 can be formed. In this case, the gate electrodes GE1 and GE2 are both formed of a patterned silicon film (doped polysilicon film). The silicon film for gate electrode is formed of a polycrystal silicon film (polysilicon film), and can be formed using a CVD (Chemical Vapor Deposition) method, or the like. However, the following is also possible: the film is formed as an amorphous silicon film during deposition; then, by the subsequent heat treatment, the amorphous silicon film is changed into a polycrystal silicon film. The portion of the insulation film GF not covered with the gate electrodes GE1 and GE2 can be removed by dry etching for patterning a silicon film, subsequent wet etching, or the like.

The gate electrode GE1 to be the gate electrode of the n channel type MISFET is formed over the p type well PW in the nMISFET formation region 1A via the insulation film GF. The portion of the insulation film GF remaining under the gate electrode GE1 becomes the gate insulation film of the n channel type MISFET. Whereas, the gate electrode GE1 to be the gate electrode of the p channel type MISFET is formed over the n type well NW in the pMISFET formation region 1B via the insulation film GF. The portion of the insulation film GF remaining under the gate electrode GE2 becomes the gate insulation film of the p channel type MISFET.

Figure 18:
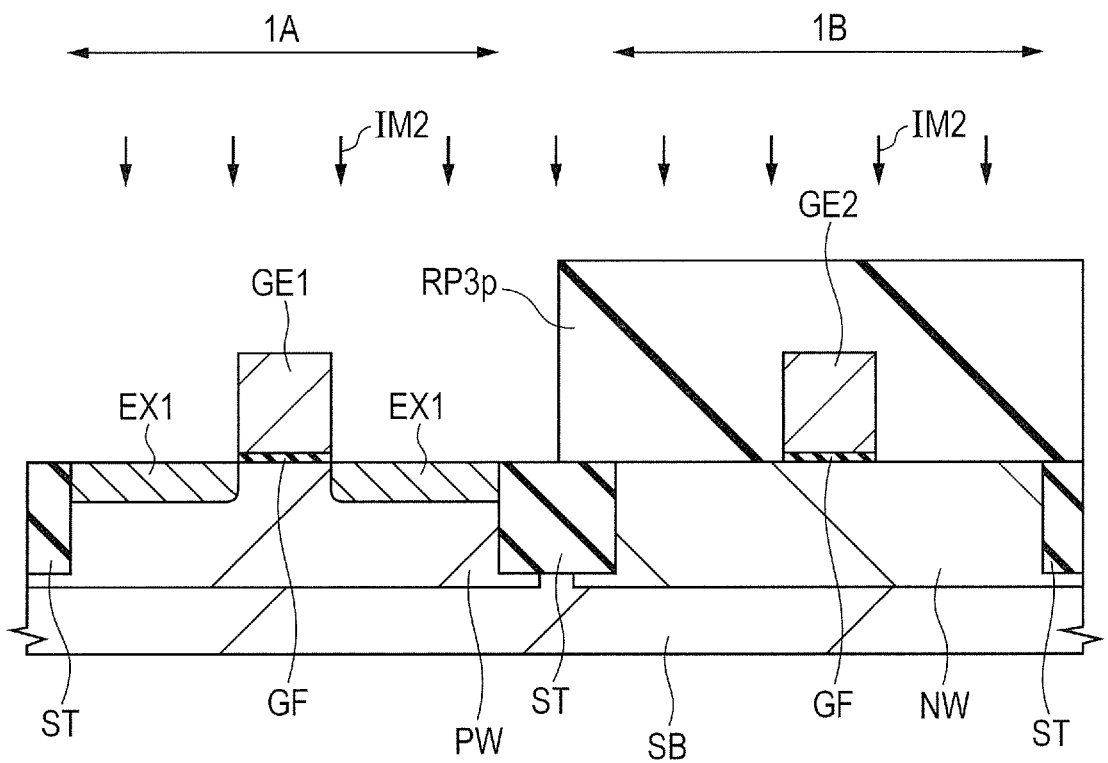
FIG. 18 is an essential part cross sectional view of the semiconductor device during a manufacturing step following FIG. 17.

Then, as shown in FIG. 18, over the semiconductor substrate SB, a photoresist pattern (resist pattern or mask layer) RP3p covering the pMISFET formation region 1B, and exposing the nMISFET formation region 1A is formed using a photolithography technology. The n type well NW and the gate electrode GE2 in the pMISFET formation region 1B are covered with the photoresist pattern RP3p. However, the p type well PW and the gate electrode GE1 in the nMISFET formation region 1A are not covered with the photoresist pattern RP3p.

Then, as shown in FIG. 18, an n type impurity such as phosphorus (P) or arsenic (As) is ion implanted into the regions on the opposite sides of the gate electrode GE1 in the semiconductor substrate SB (p type well PW) in the nMISFET formation region 1A. As a result, (a pair of) n⁻ type semiconductor regions (extension regions) EX1 are formed. The ion implantation for forming the n⁻ type semiconductor regions EX1 is indicated with a sign IM2, and is referred to as ion implantation IM2. In FIG. 18, the ion implantation IM2 is indicated schematically with arrows.

During the ion implantation IM2, in the nMISFET formation region 1A, the gate electrode GE1 functions as a mask (ion implantation inhibiting mask). For this reason, the region of the p type well PW immediately under the gate electrode GE1 is shielded by the gate electrode GE1, so that the impurity is not implanted therein. As a result, the n⁻ type semiconductor regions EX1 are formed in self-alignment with the opposite side surfaces of the gate electrode GE1. Whereas, during the ion implantation IM2, the pMISFET formation region 1B is covered with the photoresist pattern RP3p. The photoresist pattern RP3p functions as a mask (ion implantation inhibiting mask). For this reason, an impurity is not implanted into the semiconductor substrate (n type well NW) and the gate electrode GE2 in the pMISFET formation region 1B. Thereafter, the photoresist pattern RP3p is removed by asking or the like.

Figure 19:
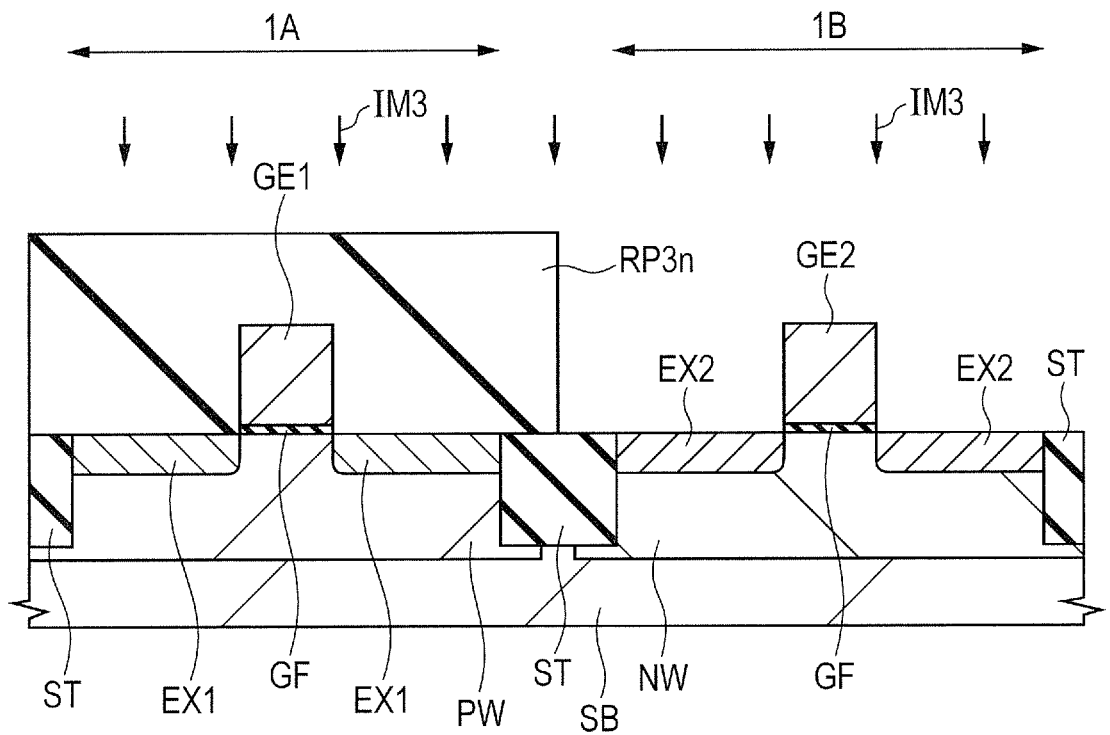
FIG. 19 is an essential part cross sectional view of the semiconductor device during a manufacturing step following FIG. 18.

Then, as shown in FIG. 19, over the semiconductor substrate SB, a photoresist pattern (resist pattern or mask layer) RP3n covering the nMISFET formation region 1A, and exposing the pMISFET formation region 1B is formed using a photolithography technology. The p type well PW and the gate electrode GE1 in the nMISFET formation region 1A are covered with the photoresist pattern RP3n. However, the n type well NW and the gate electrode GE2 in the pMISFET formation region 1B are not covered with the photoresist pattern RP3n.

Then, as shown in FIG. 19, a p type impurity such as boron (B) is ion implanted into the regions on the opposite sides of the gate electrode GE2 of the semiconductor substrate SB (n type well NW) in the pMISFET formation region 1B. As a result, (a pair of) p⁻ type semiconductor regions (extension regions) EX2 are formed. The ion implantation for forming the p⁻ type semiconductor regions EX2 is indicated with a sign IM3, and is referred to as ion implantation IM3. In FIG. 19, the ion implantation IM3 is indicated schematically with arrows.

Figure 20:
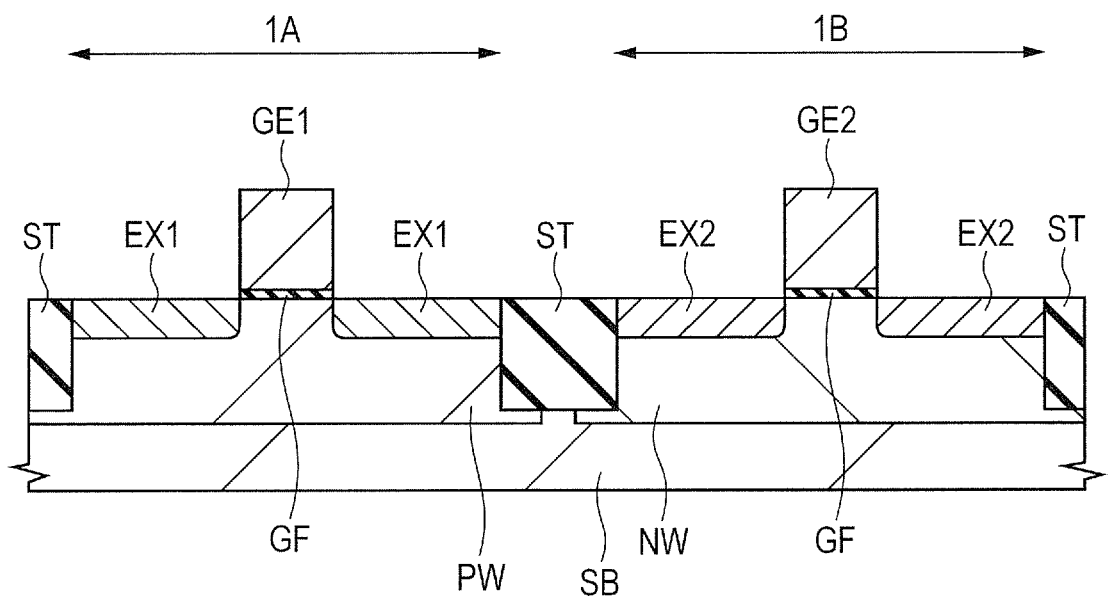
FIG. 20 is an essential part cross sectional view of the semiconductor device during a manufacturing step following FIG. 19.

During the ion implantation IM3, in the pMISFET formation region 1B, the gate electrode GE2 functions as a mask (ion implantation inhibiting mask). For this reason, the region of the n type well NW immediately under the gate electrode GE2 is shielded by the gate electrode GE2, so that the impurity is not implanted therein. As a result, the p⁻ type semiconductor regions EX2 are formed in self-alignment with the opposite side surfaces of the gate electrode GE2. Whereas, during the ion implantation IM3, the nMISFET formation region 1A is covered with the photoresist pattern RP3n. The photoresist pattern RP3n functions as a mask (ion implantation inhibiting mask). For this reason, an impurity is not implanted into the semiconductor substrate (p type well PW) and the gate electrode GE1 in the nMISFET formation region 1A. Thereafter, the photoresist pattern RP3n is removed by asking or the like. FIG. 20 shows this stage.

Incidentally, herein, a description has been given to the following case; the step of forming the n⁻ type semiconductor regions EX1 (step of FIG. 18) is performed first, then, the step of forming the p⁻ type semiconductor regions EX2 (step of FIG. 19) is performed. However, either of the n⁻ type semiconductor regions EX1 and the p⁻ type semiconductor regions EX2 may be formed first. The following case is also possible: after performing the step of forming the p⁻ type semiconductor regions EX2 (step of FIG. 19) first, the step of forming the n⁻ type semiconductor regions EX1 (step of FIG. 18) is performed.

Figure 21:
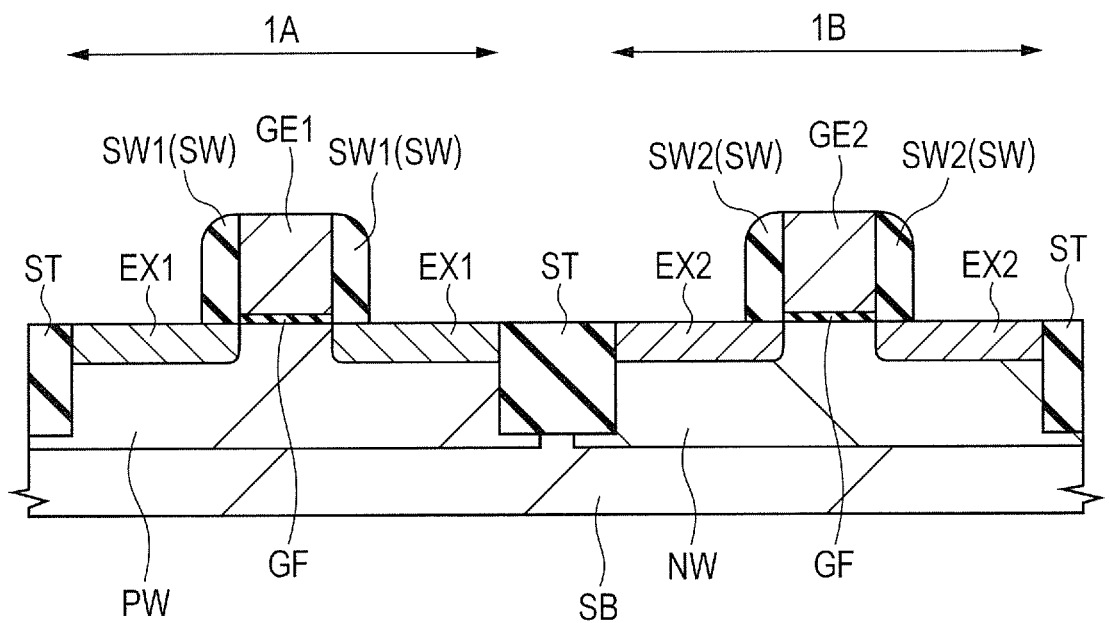
FIG. 21 is an essential part cross sectional view of the semiconductor device during a manufacturing step following FIG. 20.

Then, as shown in FIG. 21, sidewall spacers SW are formed over respective opposite side surfaces of the gate electrodes GE1 and GE2 as sidewall insulation films. The sidewall spacer SW formation step can be performed in the following manner.

Namely, first, entirely over the main surface of the semiconductor substrate SB, an insulation film for forming the sidewall spacers SW is deposited in such a manner as to cover the gate electrodes GE1 and GE2 using a CVD method or the like. The sidewall spacer SW forming insulation film is formed of, for example, a silicon oxide film or a silicon nitride film, or a lamination film thereof. Then, the sidewall spacer SW forming insulation film is anisotropically etched (etched back). As a result, as shown in FIG. 21, the insulation film (sidewall spacer SW forming insulation film) is left over the opposite side surfaces of the gate electrode GE1, and over the opposite side surfaces of the gate electrode GE2, thereby to form the sidewall spacers SW. Incidentally, below, in the nMISFET formation region 1A, the sidewall spacer SW formed over each side surface of the gate electrode GE1 is indicated with a sign SW1, and is referred to as a sidewall spacer SW1, and in the pMISFET formation region 1B, the sidewall spacer SW formed over each side surface of the gate electrode GE2 is indicated with a sign SW2, and is referred to as a sidewall spacer SW2.

Figure 22:
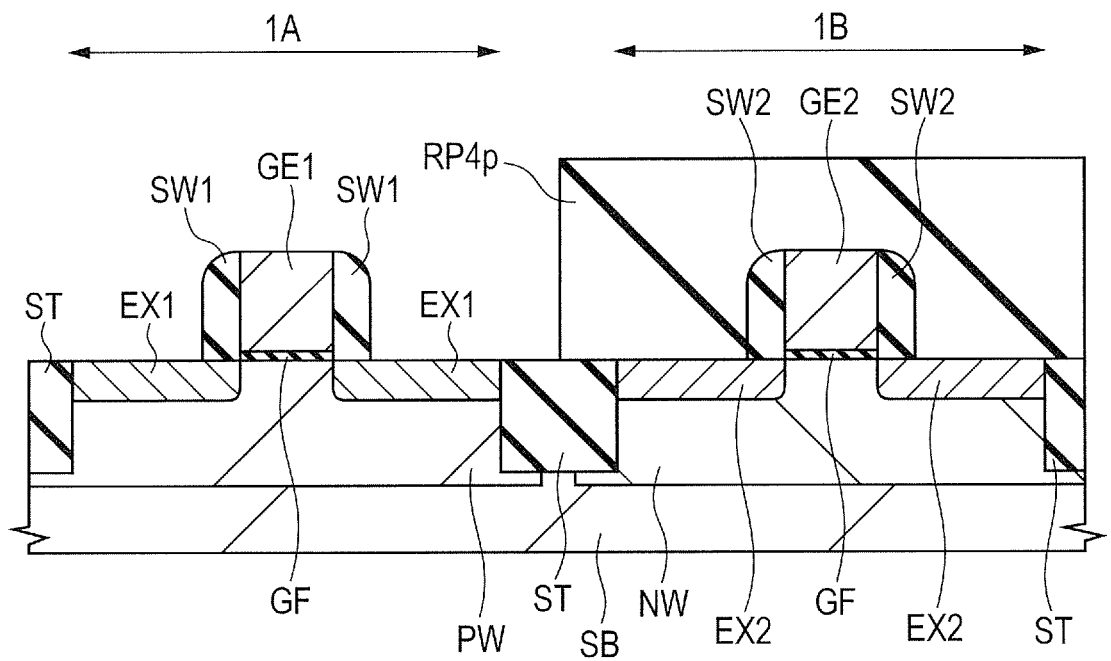
FIG. 22 is an essential part cross sectional view of the semiconductor device during a manufacturing step following FIG. 21.

Then, as shown in FIG. 22, over the semiconductor substrate SB, a photoresist pattern (resist pattern or mask layer) RP4p covering the pMISFET formation region 1B, and exposing the nMISFET formation region 1A is formed using a photolithography technology. The n type well NW, the gate electrode GE2, and the sidewall spacers SW2 in the pMISFET formation region 1B are covered with the photoresist pattern RP4p. However, the p type well PW, the gate electrode GE1, and the sidewall spacers SW1 in the nMISFET formation region 1A are not covered with the photoresist pattern RP4p.

Figure 23:
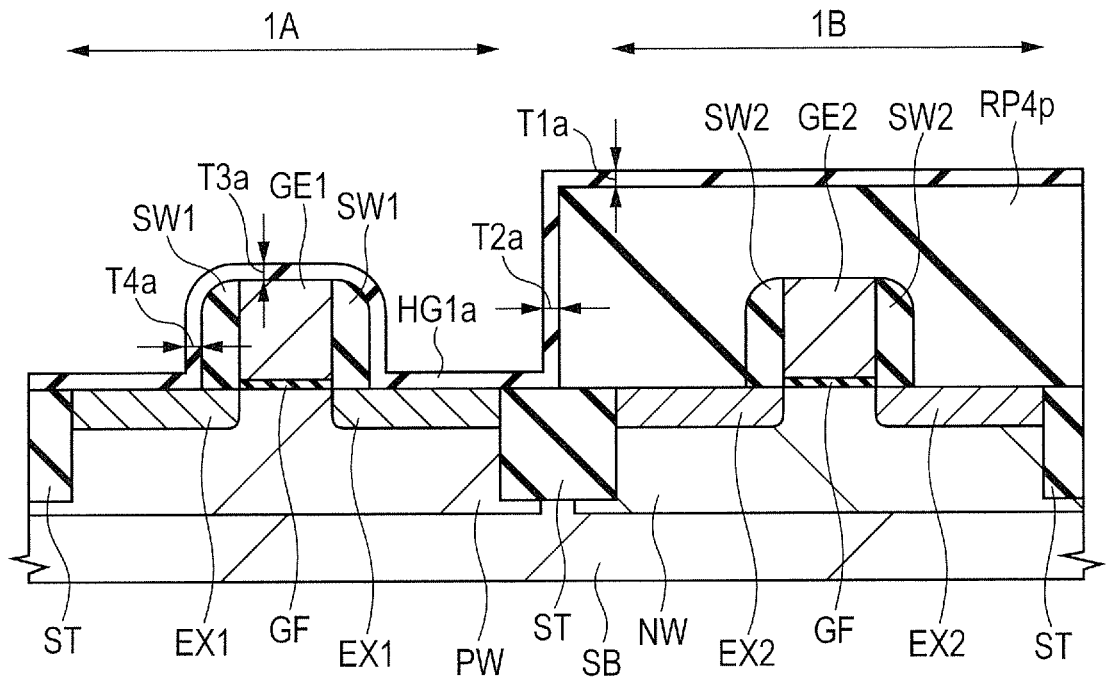
FIG. 23 is an essential part cross sectional view of the semiconductor device during a manufacturing step following FIG. 22.

Then, as shown in FIG. 23, over the main surface of the semiconductor substrate SB, a protective film (insulation film) HG1a is formed in such a manner as to cover the photoresist pattern RP4p. The protective film HG1a corresponds to the protective film HG1, and the photoresist pattern RP4p corresponds to the photoresist pattern RP1. An n⁺ type semiconductor region SD1 described later corresponds to the semiconductor region SM1.

In the pMISFET formation region 1B, the photoresist pattern RP4p is formed. For this reason, the protective film HG1a is formed in such a manner as to cover the photoresist pattern RP4p. In the nMISFET formation region 1A, the photoresist pattern RP4p is not formed. For this reason, the protective film HG1a is formed in such a manner as to cover the gate electrode GE1 and the sidewall spacers SW1. The protective film HG1a is formed of preferably a silicon oxide film or a silicon nitride film, and is formed of more preferably a silicon oxide film.

The protective film HG1a can be preferably formed using a CVD method or an ALD method. As a result, the protective film HG1a with a desirable thickness can be formed with good controllability. Use of a CVD method or an ALD method results in the formation of the protective film HG1a with almost the same thickness over the upper surface and over the side surfaces of the photoresist pattern RP4p. Further, in order to prevent the modification of the photoresist pattern RP4p during deposition of the protective film HG1a, the protective film HG1a is preferably formed at relatively lower temperatures, and the deposition temperature of the protective film HG1a is preferably 200° C. or less. The protective film HG1a can be formed using, preferably a CVD method or an ALD method, more preferably a plasma CVD method or an ALD method, and further preferably an ALD method.

Figure 24:
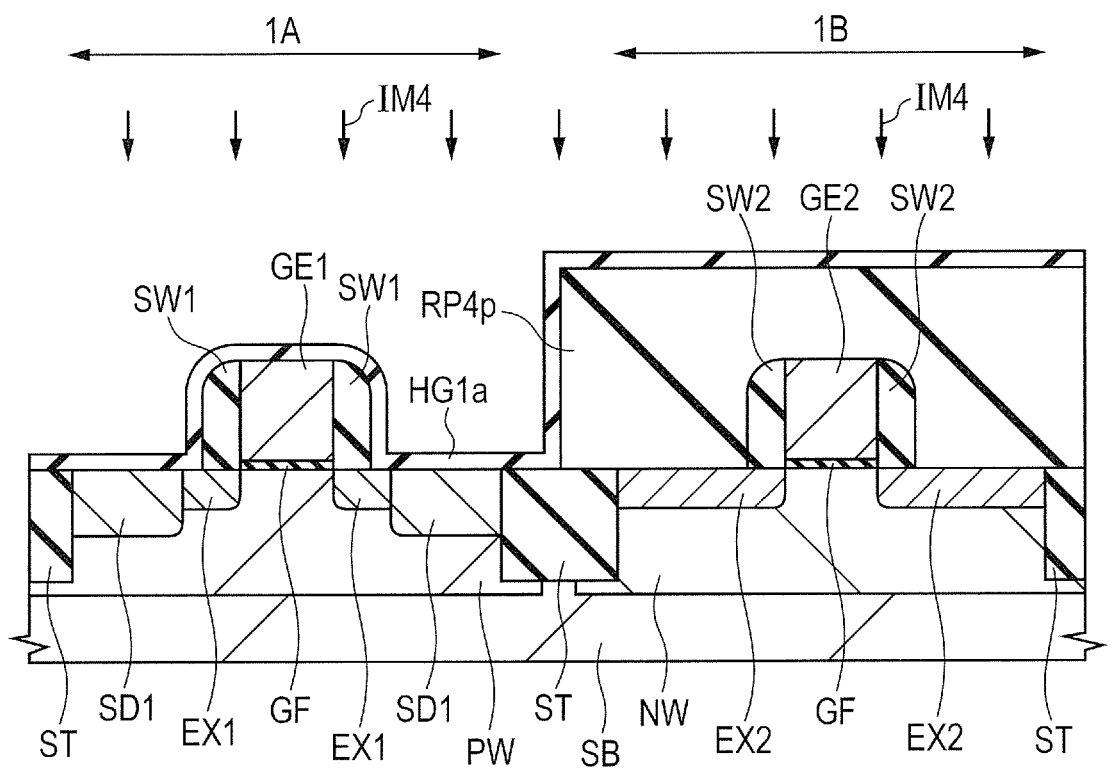
FIG. 24 is an essential part cross sectional view of the semiconductor device during a manufacturing step following FIG. 23.

Then, as shown in FIG. 24, an n type impurity such as phosphorus (P) or arsenic (As) is ion implanted into the regions on the opposite sides of the gate electrode GE1 and the sidewall spacers SW1 of the semiconductor substrate SB (p type well PW) in the nMISFET formation region 1A. As a result, (a pair of) $n^+$ type semiconductor regions SD1 are formed. The ion implantation for forming the $n^+$ type semiconductor regions SD1 is indicated with a sign IM4, and is referred to as ion implantation IM4. In FIG. 24, the ion implantation IM4 is schematically indicated with arrows.

During the ion implantation IM4, in the nMISFET formation region 1A, the gate electrode GE1, the sidewall spacers SW1, and the protective film HG1a over the sidewall (side surface) of each sidewall spacer SW1 function as a mask (ion implantation inhibiting mask). For this reason, in the ion implantation IM4, an impurity is not implanted in the region immediately under the gate electrode GE1 and immediately under the sidewall spacers SW1 in the p type well PW. Each $n^+$ type semiconductor region SD1 is formed separated from the side surface of the gate electrode GE1 by the total of the thickness (thickness in the gate length direction) of the sidewall spacer SW1 and the thickness of the protective film HG1a. Further, during the ion implantation IM4, the pMISFET formation region 1B is covered with the photoresist pattern RP4p. The photoresist pattern RP4p functions as a mask (ion implantation inhibiting mask). Accordingly, an impurity is not implanted into the semiconductor substrate SB (n type well NW) and the gate electrode GE2 in the pMISFET formation region 1B.

In the ion implantation IM4, impurity ions pass through the protective film HG1a, to be implanted into the semiconductor substrate SB (p type well PW). As a result, the $n^+$ type semiconductor regions SD1 are formed. This can suppress or prevent the damages due to the ion implantation IM4 from being imposed on the semiconductor substrate SB.

Further, in the ion implantation IM4, impurity ions can pass through the protective film HG1a, to be also implanted into the photoresist pattern RP4p. However, when the film is subjected to ion implantation, damages due to ion implantation are caused only the very shallow region in the vicinity of the surface of the film. The damages in the inside region of the film into which the impurity ions have been implanted are relatively smaller. For this reason, in the ion implantation IM4, even when impurity ions pass through the protective film HG1a, to be implanted into the photoresist pattern RP4p, the impurity ions which reached the surface of the photoresist pattern RP4p are dispersed. Thus, the implanted ion species is not concentrated on the surface of the photoresist pattern RP4p. This can prevent the formation of the cured layer (KL) at the photoresist pattern RP4p. Into the photoresist pattern RP4n, the impurity ions were not implanted directly, but the impurity ions were caused to pass through the protective film HG1a, to be implanted. This can prevent the formation of the cured layer (KL) at the photoresist pattern RP4p.

Figure 25:
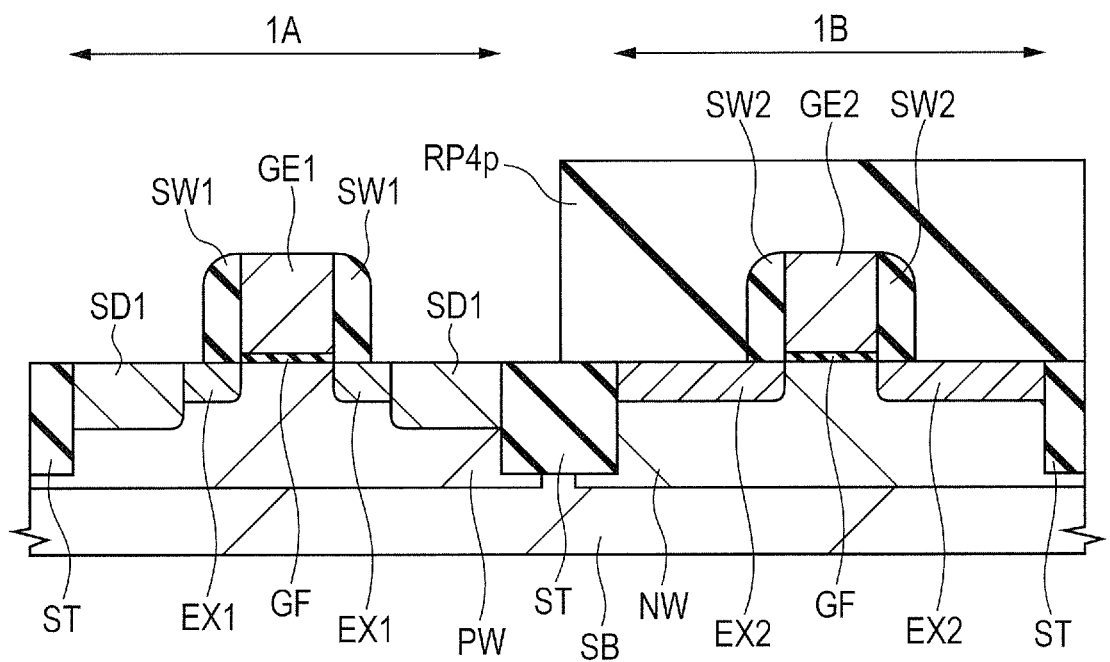
FIG. 25 is an essential part cross sectional view of the semiconductor device during a manufacturing step following FIG. 24.

Then, as shown in FIG. 25, the protective film HG1a is removed by a wet etching treatment. The protective film HG1a is originally formed of a material easy to remove by wet etching. For this reason, the protective film HG1a can be removed by wet etching with ease and reliability even when damaged by the ion implantation IM4. From this viewpoint, the protective film HG1a is preferably formed of a silicon oxide film or a silicon nitride film, and is more preferably formed of a silicon oxide film. When the protective film HG1a is a silicon oxide film, hydrofluoric acid can be preferably used as an etchant. When the protective film HG1a is a silicon nitride film, hot phosphoric acid can be preferably used as an etchant.

When the protective film HG1a is removed by a wet etching treatment, the protective film HG1a is selectively etched under the conditions in which the protective film HG1a is more likely to be etched than the photoresist pattern RP4p, and the semiconductor substrate SB is less likely to be etched than the protective film HG1a.

Figure 26:
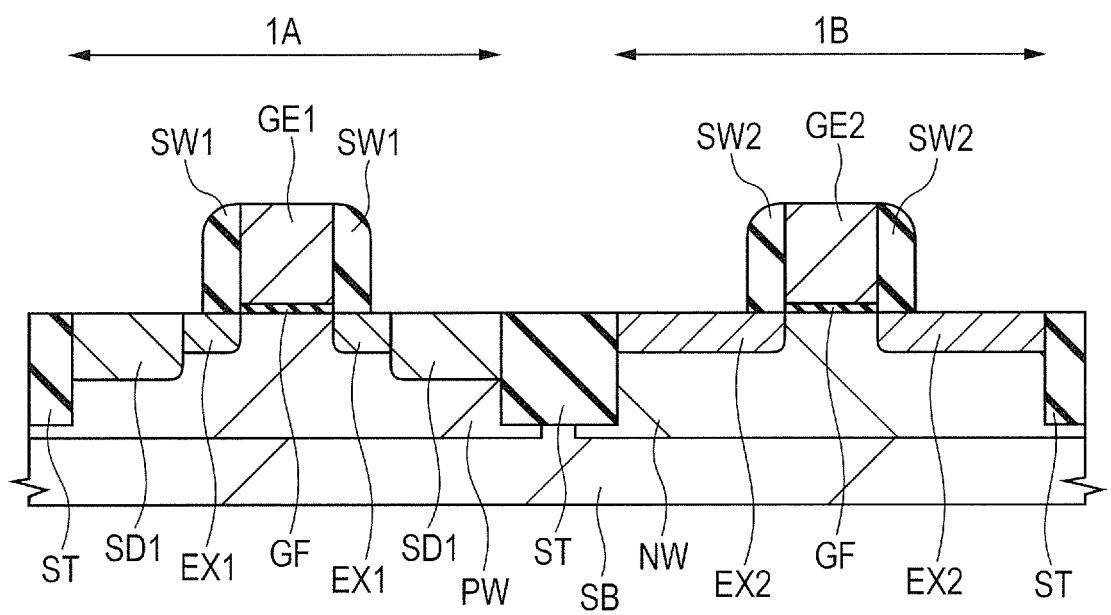
FIG. 26 is an essential part cross sectional view of the semiconductor device during a manufacturing step following FIG. 25.

Then, as shown in FIG. 26, the photoresist pattern RP4p is removed by an ashing treatment or a wet treatment. At the photoresist pattern RP4p, an equivalent of the cured layer KL is not formed. For this reason, the photoresist pattern RP4p can be removed by an ashing treatment or a wet treatment with ease and reliability.

Figure 27:
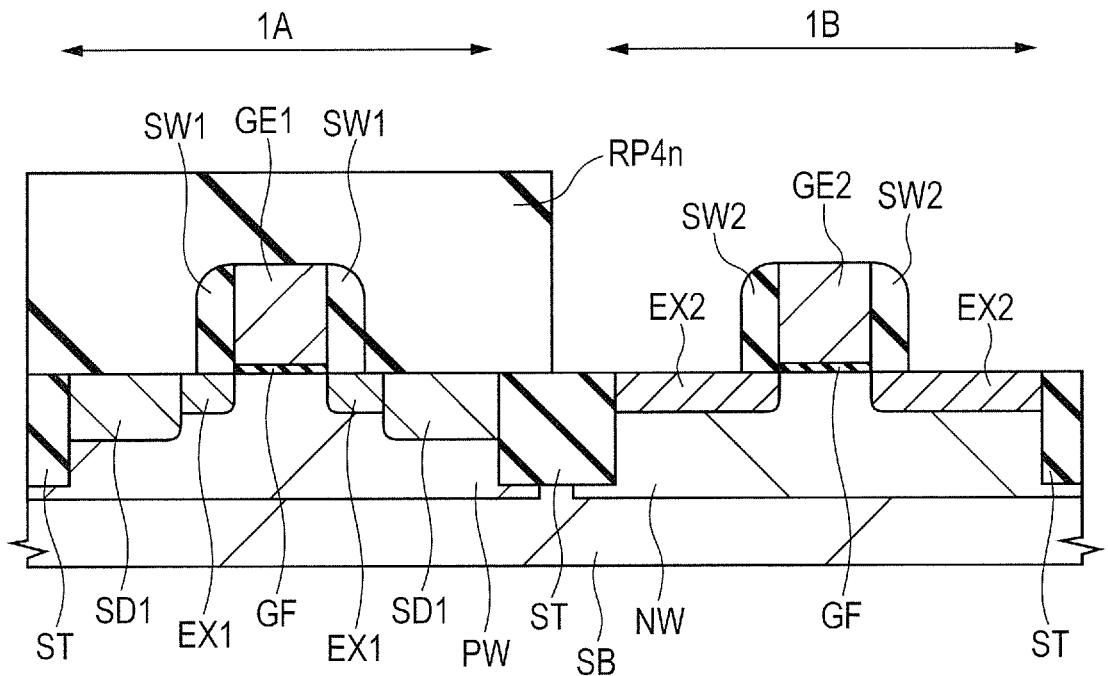
FIG. 27 is an essential part cross sectional view of the semiconductor device during a manufacturing step following FIG. 26.

Then, as shown in FIG. 27, over the semiconductor substrate SB, a photoresist pattern (resist pattern or mask layer) RP4n covering the nMISFET formation region 1A, and exposing the pMISFET formation region 1B is formed using a photolithography technology. The p type well PW, the gate electrode GE1, and the sidewall spacers SW1 in the nMISFET formation region 1A are covered with the photoresist pattern RP4n. However, the n type well NW, the gate electrode GE2, and the sidewall spacers SW2 in the pMISFET formation region 1B are not covered with the photoresist pattern RP4n.

Figure 28:
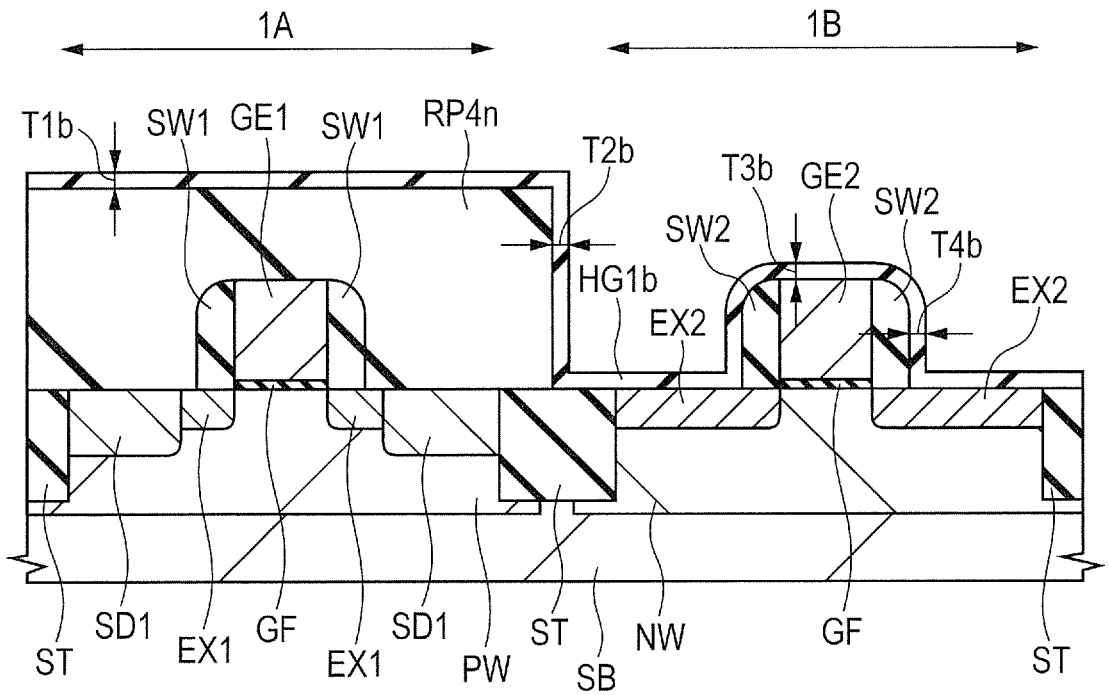
FIG. 28 is an essential part cross sectional view of the semiconductor device during a manufacturing step following FIG. 27.

Then, as shown in FIG. 28, over the main surface of the semiconductor substrate SB, a protective film (insulation film) HG1b is formed in such a manner as to cover the photoresist pattern RP4n. The protective film HG1b corresponds to the protective film HG1, and the photoresist pattern RP4n corresponds to the photoresist pattern RP1. A $p^+$ type semiconductor region SD2 described later corresponds to the semiconductor region SM1.

In the nMISFET formation region 1A, the photoresist pattern RP4n is formed. Accordingly, the protective film HG1b is formed in such a manner as to cover the photoresist pattern RP4n. In the pMISFET formation region 1B, the photoresist pattern RP4n is not formed. Accordingly, the protective film HG1b is formed in such a manner as to cover the gate electrode GE2 and the sidewall spacers SW2. The protective film HG1b is preferably formed of a silicon oxide film or a silicon nitride film, and is more preferably formed of a silicon oxide film.

The protective film HG1b can be formed preferably using a CVD method or an ALD method. As a result, the protective film HG1b with a desirable thickness can be formed with good controllability. Use of a CVD method or an ALD method results in the formation of the protective film HG1a with almost the same thickness over the upper surface and over the side surfaces of the photoresist pattern RP4n. Further, in order to prevent the modification of the photoresist pattern RP4n during deposition of the protective film HG1b, the protective film HG1b is preferably formed at relatively lower temperatures, and the deposition temperature of the protective film HG1b is preferably 200° C. or less. The protective film HG1b can be formed using, preferably, a CVD method or an ALD method, more preferably a plasma CVD method or an ALD method, and further preferably an ALD method.

Figure 29:
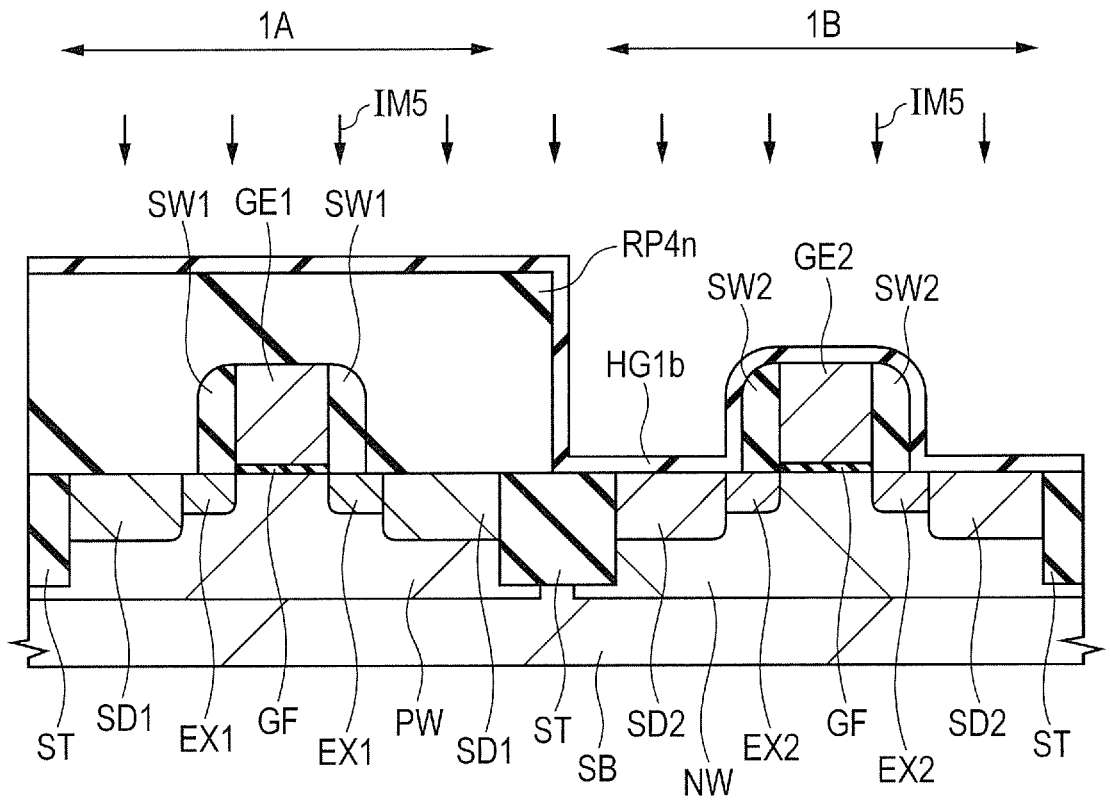
FIG. 29 is an essential part cross sectional view of the semiconductor device during a manufacturing step following FIG. 28.

Then, as shown in FIG. 29, a p type impurity such as boron (B) is ion implanted into the regions on the opposite sides of the gate electrode GE2 and the sidewall spacers SW2 of the semiconductor substrate SB (n type well NW) in the pMISFET formation region 1B. As a result, (a pair of) $p^+$ type semiconductor regions SD2 are formed. The ion implantation for forming the $p^+$ type semiconductor regions SD2 is indicated with a sign IM5, and is referred to as ion implantation IM5. In FIG. 29, the ion implantation IM5 is schematically indicated with arrows.

During the ion implantation IM5, in the pMISFET formation region 1B, the gate electrode GE2, the sidewall spacers SW2, and the protective film HG1b over the sidewall (side surface) of each sidewall spacer SW2 function as a mask (ion implantation inhibiting mask). For this reason, in the ion implantation IM5, an impurity is not implanted in the region immediately under the gate electrode GE2 and immediately under the sidewall spacer SW2 in the n type well NW. Each $p^+$ type semiconductor region SD2 is formed separated from the side surface of the gate electrode GE2 by the total of the thickness (thickness in the gate length direction) of the sidewall spacer SW2 and the thickness of the protective film HG1b. Further, during the ion implantation IM5, the nMISFET formation region 1A is covered with the photoresist pattern RP4n. The photoresist pattern RP4n functions as a mask (ion implantation inhibiting mask). Accordingly, an impurity is not implanted into the semiconductor substrate SB (p type well PW) and the gate electrode GE1 in the nMISFET formation region 1A.

In the ion implantation IM5, impurity ions pass through the protective film HG1b, to be implanted into the semiconductor substrate SB (n type well NW). As a result, the $p^+$ type semiconductor regions SD2 are formed. This can suppress or prevent the damages due to the ion implantation IM5 from being imposed on the semiconductor substrate SB.

Further, in the ion implantation IM5, impurity ions can pass through the protective film HG1b, to be implanted into the photoresist pattern RP4n. However, when the film is subjected to ion implantation, damages due to ion implantation are caused only in the very shallow region in the vicinity of the surface of the film. The damages in the inside region of the film into which the impurity ions have been implanted are relatively smaller. For this reason, in the ion implantation IM5, even when impurity ions pass through the protective film HG1b, to be implanted into the photoresist pattern RP4n, the impurity ions which reached the surface of the photoresist pattern RP4n are dispersed. Thus, the implanted ion species is not concentrated on the surface of the photoresist pattern RP4n. This can prevent the formation of the cured layer (KL) at the photoresist pattern RP4n. Into the photoresist pattern RP4n, the impurity ions were not implanted directly, but the impurity ions were caused to pass through the protective film HG1b, to be implanted. This can prevent the formation of the cured layer (KL) at the photoresist pattern RP4n.

Figure 30:
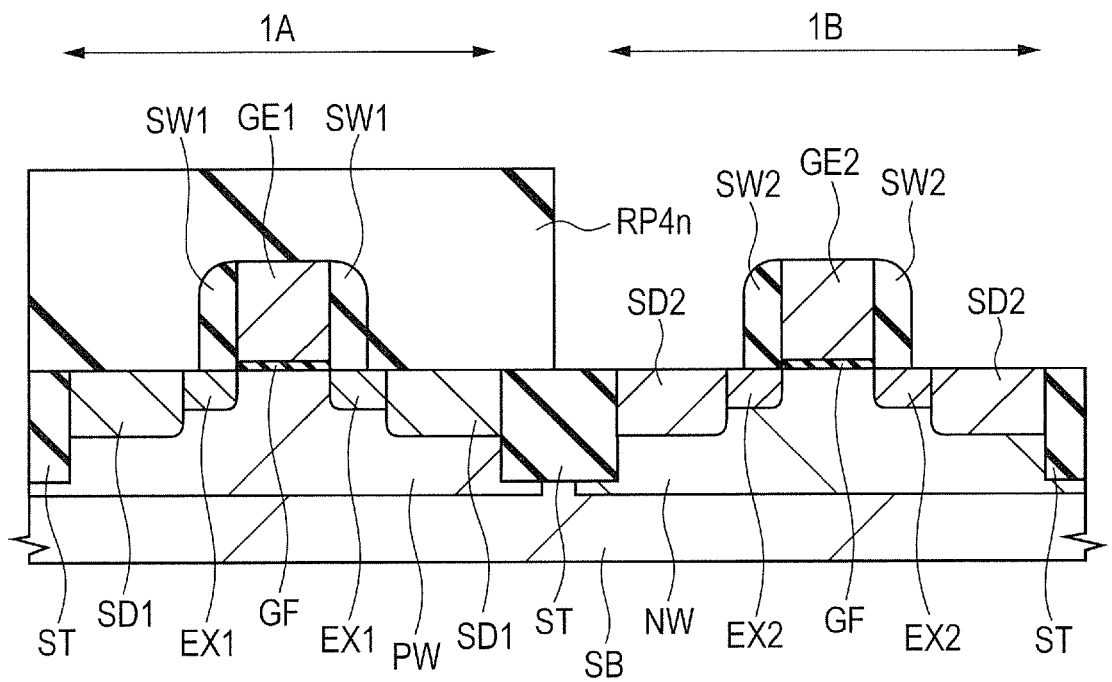
FIG. 30 is an essential part cross sectional view of the semiconductor device during a manufacturing step following FIG. 29.

Then, as shown in FIG. 30, the protective film HG1b is removed by a wet etching treatment. The protective film HG1b is originally formed of a material easy to remove by wet etching. For this reason, the protective film HG1b can be removed by wet etching with ease and reliability even when damaged by the ion implantation IM5. From this viewpoint, the protective film HG1b is preferably formed of a silicon oxide film or a silicon nitride film, and is more preferably formed of a silicon oxide film. When the protective film HG1b is a silicon oxide film, hydrofluoric acid can be preferably used as an etchant. When the protective film HG1b is a silicon nitride film, hot phosphoric acid can be preferably used as an etchant.

When the protective film HG1b is removed by a wet etching treatment, the protective film HG1b is selectively etched under the conditions in which the protective film HG1b is more likely to be etched than the photoresist pattern RP4n, and the semiconductor substrate SB is less likely to be etched than the protective film HG1a.

Figure 31:
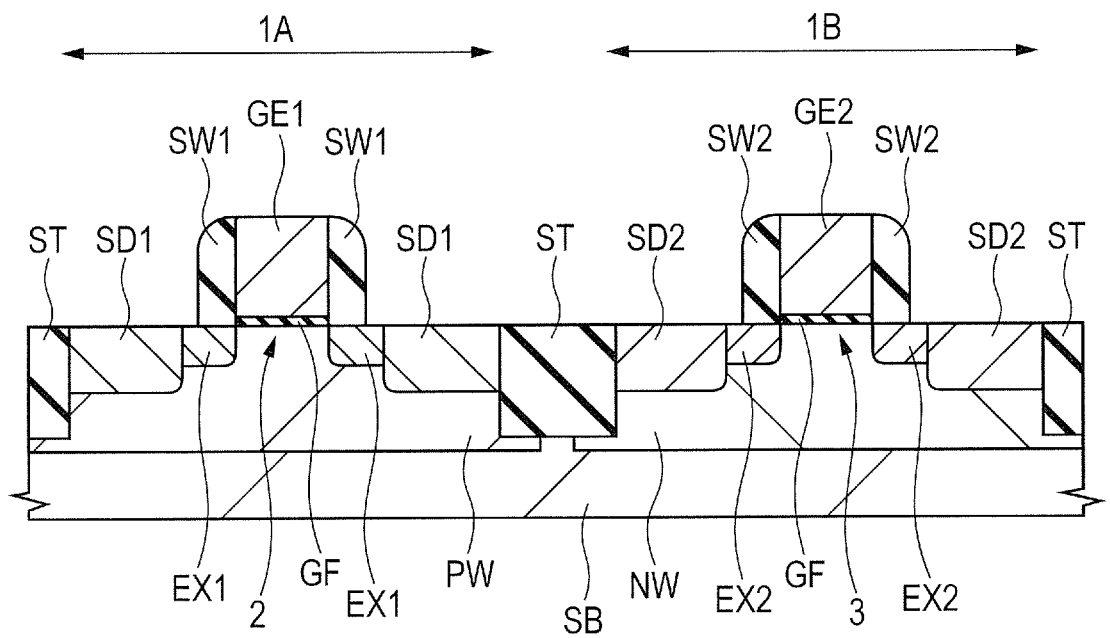
FIG. 31 is an essential part cross sectional view of the semiconductor device during a manufacturing step following FIG. 30.

Then, as shown in FIG. 31, the photoresist pattern RP4n is removed by an ashing treatment or a wet treatment. At the photoresist pattern RP4n, an equivalent of the cured layer KL is not formed. For this reason, the photoresist pattern RP4n can be removed by an ashing treatment or a wet treatment with ease and reliability.

Incidentally, herein, a description has been given to the following case; the steps of forming the $n^+$ type semiconductor regions SD1 (the steps of FIGS. 22 to 26) are performed first, then, the steps of forming the $p^+$ type semiconductor regions SD2 (the steps of FIGS. 27 to 31) are performed. However, either of the $n^+$ type semiconductor regions SD1 and the $p^+$ type semiconductor regions SD2 may be formed first. The following case is also possible: after performing the steps of forming the $p^+$ type semiconductor regions SD2 (the steps of FIGS. 27 to 31) first, the steps of forming the $n^+$ type semiconductor regions SD1 (the steps of FIGS. 22 to 26) are performed.

Then, an annealing treatment (an activating annealing or a heat treatment) for activating the impurities doped up to this point is performed. As a result, the impurities doped into the $n^-$ type semiconductor regions EX1, the $n^+$ type semiconductor regions SD1, the $p^-$ type semiconductor regions EX2, the $p^+$ type semiconductor regions SD2, and the like can be activated.

In this manner, in the nMISFET formation region 1A, an n channel type MISFET2 is formed as a field effect transistor. Whereas, in the pMISFET formation region 1B, a p channel type MISFET3 is formed as a field effect transistor. This results in the structure of FIG. 31. The n channel type MISFET2 can be regarded as an n channel type field effect transistor. The p channel type MISFET3 can be regarded as a p channel type field effect transistor.

The $n^+$ type semiconductor region SD1 is higher in impurity density and deeper in junction depth than the $n^-$ type semiconductor region EX1. For this reason, the dose amount of the ion implantation IM4 is larger than the dose amount of the ion implantation IM2. Incidentally, the dose amount corresponds to the amount of impurity ions implanted per unit area. The $n^-$ type semiconductor region EX1 is adjacent to the channel formation region (the substrate region immediately under the gate electrode GE1) of the n channel type MISFET2, and the $n^+$ type semiconductor region SD1 is separated from the channel formation region of the n channel type MISFET2. The $n^-$ type semiconductor region EX1 is interposed between the n$^+$ type semiconductor region SD1 and the channel formation region of the n channel type MISFET2. The n$^-$ type semiconductor region EX1, and the n$^+$ type semiconductor region SD1 having a higher impurity density than that form an n type semiconductor region functioning as the source/drain region (semiconductor region for source or drain) of the n channel type MISFET2. Therefore, the source/drain region of the n channel type MISFET2 has a LDD (Lightly doped Drain) structure. The gate electrode GE1 functions as the gate electrode of the n channel type MISFET2.

Further, the p$^+$ type semiconductor region SD2 is higher in impurity density and deeper in junction depth than the p$^-$ type semiconductor region EX2. For this reason, the dose amount of the ion implantation IM5 is larger than the dose amount of the ion implantation IM3. The p$^-$ type semiconductor region EX2 is adjacent to the channel formation region (the substrate region immediately under the gate electrode GE2) of the p channel type MISFET3, and the p$^+$ type semiconductor region SD2 is separated from the channel formation region of the p channel type MISFET3. The p$^-$ type semiconductor region EX2 is interposed between the p$^+$ type semiconductor region SD2 and the channel formation region of the p channel type MISFET3. The p$^-$ type semiconductor region EX2, and the p$^+$ type semiconductor region SD2 having a higher impurity density than that form a p type semiconductor region functioning as the source/drain region (semiconductor region for source or drain) of the p channel type MISFET3. Therefore, the source/drain region of the p channel type MISFET3 has a LDD structure. The gate electrode GE2 functions as the gate electrode of the p channel type MISFET3.

Figure 32:
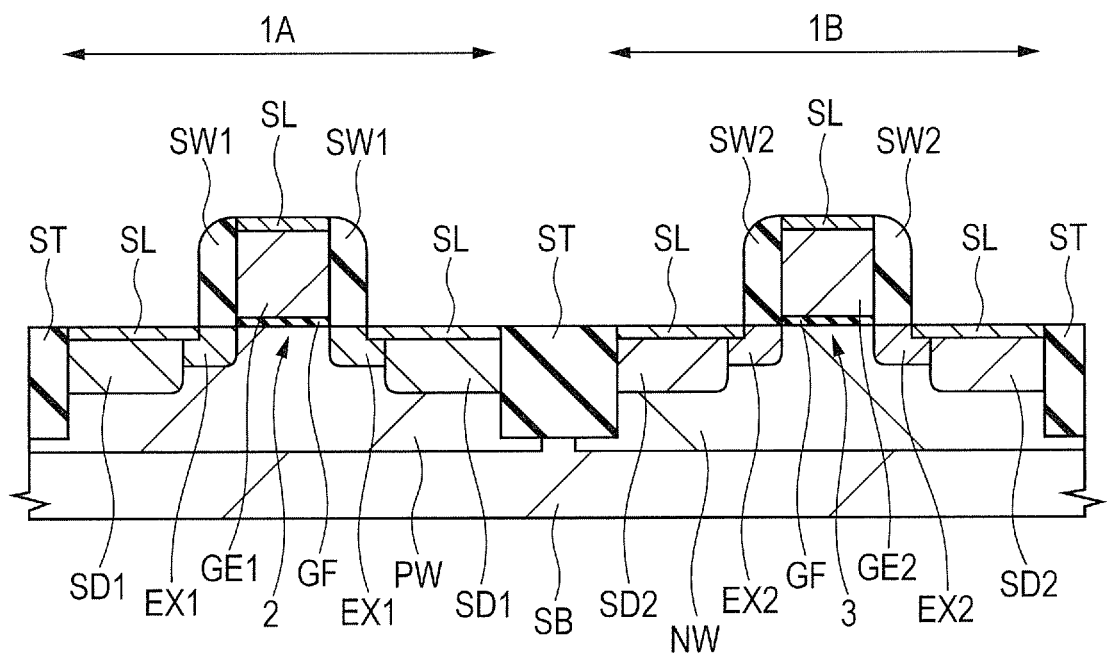
FIG. 32 is an essential part cross sectional view of the semiconductor device during a manufacturing step following FIG. 31.

Then, as shown in FIG. 32, a metal silicide layer SL is formed. The metal silicide layer SL can be formed by performing a so-called Salicide: Self Aligned Silicide process. Specifically, the metal silicide layer SL can be formed in the following manner.

Namely, first, entirely over the main surface of the semiconductor substrate SB including over the upper surfaces of the gate electrodes GE1 and GE2, the n$^+$ type semiconductor regions SD1, and the p$^+$ type semiconductor regions SD2, a metal film for forming the metal silicide layer SL (not shown) is formed in such a manner as to cover the gate electrodes GE1 and GE2, and the sidewall spacers SW1 and SW2. For the metal film, a simple substance metal film (pure metal film) or an alloy film can be used. The metal film is formed of, for example, a cobalt film, a nickel film, or a nickel platinum alloy film, and can be formed using a sputtering method or the like. Then, the semiconductor substrate SB is subjected to a heat treatment (heat treatment for forming the metal silicide layer SL). This allows respective upper layer parts of the gate electrodes GE1 and GE2, the n$^+$ type semiconductor regions SD1, and the p$^+$ type semiconductor regions SD2 to react with the metal film. As a result, as shown in FIG. 32, the metal silicide layers SL are formed at respective tops (upper layer parts) of the gate electrodes GE1 and GE2, the n$^+$ type semiconductor regions SD1, and the p$^+$ type semiconductor regions SD2. Thereafter, the unreacted portions of the metal film are removed by wet etching or the like. FIG. 32 shows the cross sectional view at this stage. Further, after removing the unreacted portions of the metal film, a heat treatment can be further performed. When the metal film is a cobalt film, the metal silicide layer SL is formed of a cobalt silicide layer. When the metal film is a nickel film, the metal silicide layer SL is formed of a nickel silicide layer. When the metal film is a nickel platinum alloy film, the metal silicide layer SL is formed of a platinum-doped nickel silicide layer.

Thus, by performing a so-called salicide process, the metal silicide layers SL are formed at respective tops of the gate electrodes GE1 and GE2, the n$^+$ type semiconductor regions SD1, and the p$^+$ type semiconductor regions SD2. As a result, it is possible to reduce the contact resistance, the diffusion resistance, and the like.

Figure 33:
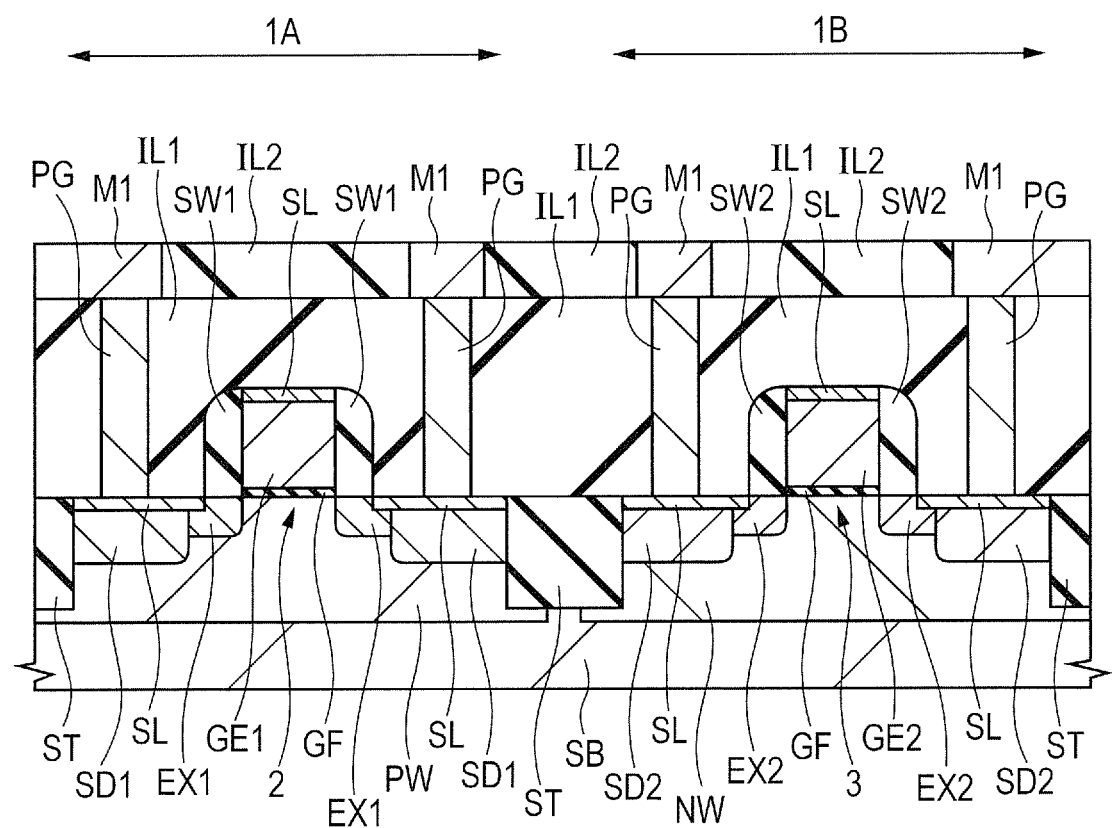
FIG. 33 is an essential part cross sectional view of the semiconductor device during a manufacturing step following FIG. 32.

Then, as shown in FIG. 33, entirely over the main surface of the semiconductor substrate SB, an insulation film (interlayer insulation film) IL1 is formed as an interlayer insulation film in such a manner as to cover the gate electrodes GE1 and GE2, and the sidewall spacers SW1 and SW2.

The insulation film IL1 is formed of a simple substance film of a silicon oxide film, or a lamination film of a silicon nitride film and a silicon oxide film formed thicker than the silicon nitride film over the silicon nitride film, or the like, and can be formed using, for example, a CVD method. After the formation of the insulation film IL1, the upper surface of the insulation film IL1 is polished by a CMP (Chemical Mechanical Polishing) method, or subjected to other treatments. As a result, the flatness of the upper surface of the insulation film IL1 can be enhanced.

Then, using the photoresist pattern (not shown) formed over the insulation film IL1 using a photolithography method as an etching mask, the insulation film IL1 is etched, thereby to form contact holes in the insulation film IL1. Then, a conductive plug PG is formed (buried) in each contact hole. The plugs PG are formed over the n$^+$ type semiconductor regions SD1, the p$^+$ type semiconductor regions SD2, the gate electrode GE1, and the gate electrode GE2, and the like, respectively, and are electrically coupled therewith, respectively.

Then, over the insulation film IL1 including the plugs PG buried therein, an insulation film IL2 is formed. Then, a wire trench is formed in each prescribed region of the insulation film IL2. Then, a wire M1 is buried in the wire trench using a single damascene technology. The wire M1 is, for example, a copper wire (buried copper wire) including copper as the main component. The wire M1 is electrically coupled via the plugs PG with the n$^+$ type semiconductor regions SD1, the p$^+$ type semiconductor regions SD2, the gate electrode GE1, the gate electrode GE2, and the like. In this manner, the structure of FIG. 33 can be obtained.

Thereafter, by a dual damascene method or the like, second-, and more-layer wires are formed, but herein, are not shown and are not described. Further, the wire M1 and higher-layer wires are not limited to damascene wires, can be formed by patterning a wiring conductor film and can be formed as, for example, a tungsten wire or an aluminum wire.

In the manner described up to this point, the semiconductor device of the present embodiment is manufactured.

Then, the features and effects of the steps of FIGS. 13 to 33 will be described.

The problem described by reference to FIGS. 5 and 6 tends to be caused when the dose amount is large in the ion implantation step using a photoresist pattern as a mask. Namely, in the case where the dose amount in ion implantation is large, when with the photoresist pattern exposed, ion implantation is performed, the cured layer KL is formed at the photoresist pattern by the ion implantation. This results in a high possibility that the removal step of the photoresist pattern becomes less likely to be performed.

In both of the ion implantation IM4 for forming the n$^+$ type semiconductor regions SD1, and the ion implantation IM5 for forming the p$^+$ type semiconductor regions SD2, the dose amount is large. For this reason, preferably, the steps described by reference to FIGS. 7 to 12 are applied to the ion implantation IM4 for forming the n$^+$ type semiconductor regions SD1, and the ion implantation IM5 for forming the p$^+$ type semiconductor regions SD2, so that ion implantation is performed with the resist pattern covered with the protective film.

Namely, the steps of FIGS. 22 to 26 are the steps to be performed for forming the n$^+$ type semiconductor regions SD1. The steps described by reference to FIGS. 7 to 12 are applied thereto. Thus, with the photoresist pattern RP4p covered with the protective film HG1a, the ion implantation IM4 is performed. Further, the steps of FIGS. 27 to 31 are the steps to be performed for forming the p$^+$ type semiconductor regions SD2. The steps described by reference to FIGS. 7 to 12 are applied thereto. Thus, with the photoresist pattern RP4n covered with the protective film HG1b, the ion implantation IM5 is performed.

As distinct from the present embodiment, when the ion implantation IM4 is performed without the formation of the protective film HG1a, and with the photoresist pattern RP4p exposed, the cured layer KL is formed at the photoresist pattern RP4p by the ion implantation IM4. Accordingly, when the photoresist pattern RP4p is removed, a defect (the defect described by reference to FIGS. 5 and 6) may be caused. Further, as distinct from the present embodiment, when the ion implantation IM5 is performed without the formation of the protective film HG1b, and with the photoresist pattern RP4n exposed, the cured layer KL is formed at the photoresist pattern RP4n by the ion implantation IM5. Accordingly, when the photoresist pattern RP4n is removed, a defect may be caused.

In contrast, in the present embodiment, the ion implantation IM4 is performed with the photoresist pattern RP4p covered with the protective film HG1a. This can prevent the formation of the cured layer (KL) at the photoresist pattern RP4p by the ion implantation IM4. When the photoresist pattern RP4p is removed, it is essential only that the photoresist pattern RP4p including no cured layer (KL) formed therein is removed. For this reason, it is possible to remove the photoresist pattern RP4p with ease and reliability. Further, in the present embodiment, the ion implantation IM5 is performed with the photoresist pattern RP4n covered with the protective film HG1b. This can prevent the formation of the cured layer (KL) at the photoresist pattern RP4n by the ion implantation IM5. When the photoresist pattern RP4n is removed, it is essential only that the photoresist pattern RP4n including no cured layer (KL) formed therein is removed. For this reason, it is possible to remove the photoresist pattern RP4n with ease and reliability. This can prevent the defect caused by the formation of the cured layer at the surface (surface layer part) of the photoresist pattern RP4p or RP4n by ion implantation. For this reason, it is possible to improve the reliability of the semiconductor device to be manufactured. Further, it is possible to improve the manufacturing yield of the semiconductor device.

The problem described by reference to FIGS. 5 and 6 tends to occur when the dose amount is large in the ion implantation step using the resist pattern as a mask. However, the possibility of the occurrence decreases when the dose amount is smaller. Further, the steps described by reference to FIGS. 7 to 12 have an advantage of capable of preventing the formation of the cured layer KL at the resist pattern during ion implantation due to the formation of the protective film HG1. However, an increase in number of steps is entailed as compared with the case where the protective film HG1 is not formed. For this reason, when the risk of the occurrence of the problem described by reference to FIGS. 5 and 6 is low, namely, when ion implantation with a small dose amount is performed, the steps described by reference to FIGS. 7 to 12 are not applied, which can suppress the number of manufacturing steps of the semiconductor device.

In both of the ion implantation IM2 for forming the n$^-$ type semiconductor regions EX1, and the ion implantation IM3 for forming the p$^-$ type semiconductor regions EX2, the dose amount is small. Specifically, the dose amount of the ion implantation IM2 is smaller than the dose amount of the ion implantation IM4. Whereas, the dose amount of the ion implantation IM3 is smaller than the dose amount of the ion implantation IM5. For this reason, to the ion implantation IM2 for forming the n$^-$ type semiconductor regions EX1, and the ion implantation IM3 for forming the p$^-$ type semiconductor regions EX2, the steps described by reference to FIGS. 7 to 12 are applicable, but the steps described by reference to FIGS. 7 to 12 are not required to be applied. No application can suppress the number of the manufacturing steps of the semiconductor device.

Namely, the step of FIG. 18 is the step for forming the n$^-$ type semiconductor regions EX1. However, the steps described by reference to FIGS. 7 to 12 are not applied thereto, and without the formation of a protective film covering the photoresist pattern RP3p, and with the photoresist pattern RP3p exposed (specifically, with the upper surface and the side surfaces of the photoresist pattern RP3p exposed), the ion implantation IM2 is performed. Whereas, the step of FIG. 19 is the step to be performed for forming the p$^-$ type semiconductor regions EX2. However, the steps described by reference to FIGS. 7 to 12 are not applied thereto, and without the formation of a protective film covering the photoresist pattern RP3n, and with the photoresist pattern RP3n exposed (specifically, with the upper surface and the side surfaces of the photoresist pattern RP3n exposed), the ion implantation IM3 is performed. In each of the ion implantations IM2 and IM3, the dose amount is small. For this reason, even when ion implantation is performed with the photoresist pattern exposed, the risk of formation of the cured layer (KL) at the photoresist pattern by the ion implantation is relatively smaller. Accordingly, the risk of occurrence of the defect (the defect described by reference to FIGS. 5 and 6) upon removing the photoresist pattern is relatively smaller. For this reason, for the ion implantations IM2 and IM3, by performing ion implantation with the photoresist pattern being exposed, it is possible to suppress the number of manufacturing steps of the semiconductor device.

Thus, attention has been focused on each dose amount of the ion implantations IM2, IM3, IM4, and IM5. For the ion implantations IM4 and IM5 with a larger dose amount, ion implantation is performed with the photoresist pattern covered with a protective film. For the ion implantations IM2 and IM3 with a smaller dose amount, ion implantation is performed without the formation of a protective film, and with the photoresist pattern exposed. This can efficiently reduce the risk of formation of the cured layer (KL) at the photoresist pattern during ion implantation, while suppressing the number of manufacturing steps of the semiconductor device. For this reason, it is possible to efficiently prevent the defect caused by the formation of the cured layer at the surface layer part of the photoresist pattern by the ion implantation, thereby to improve the reliability of the semiconductor device to be manufactured. In addition, it is possible to suppress the number of manufacturing steps of the semiconductor device, thereby to reduce the manufacturing cost of the semiconductor device. Therefore, the improvement of the reliability of the semiconductor device, and the suppression of the manufacturing cost of the semiconductor device can be made compatible with each other.

Further, with the photoresist pattern RP4p covered with the protective film HG1a in the pMISFET formation region 1B, and with the gate electrode GE1 and the sidewall spacers SW1 covered with the protective film HG1a in the nMISFET formation region 1A, the ion implantation IM4 for forming the n$^+$ type semiconductor regions SD1 is performed. For this reason, for the ion implantation IM4, in the nMISFET formation region 1A, in addition to the gate electrode GE1 and the sidewall spacers SW1, the protective film HG1a over the side surface of the sidewall spacer SW1 can also function as a mask. For this reason, the end of the n$^+$ type semiconductor region SD1 is separated from the side surface of the gate electrode GE1 by the total of the thickness of the sidewall spacer SW1 and the thickness of the protective film HG1a. For this reason, also in consideration of the thickness of the protective film HG1a, the thickness of the sidewall spacer SW1 is set. This can control the interval (interval in the gate length direction) between the n$^+$ type semiconductor region SD1 and the gate electrode GE1 at a desirable value. Namely, as compared with the case where the ion implantation IM4 is performed without the formation of the protective film HG1a, when the ion implantation IM4 is performed with the protective film HG1a formed, it is essential only that the thickness of the sidewall spacer SW1 is reduced by the thickness of the protective film HG1a.

The same also applies to the ion implantation IM5 for forming the p$^+$ type semiconductor regions SD2. For the ion implantation IM5, in the pMISFET formation region 1B, in addition to the gate electrode GE2 and the sidewall spacer SW2, the protective film HG1b over the side surface of the sidewall spacer SW2 can also function as a mask. For this reason, also in consideration of the thickness of the protective film HG1b, the thickness of the sidewall spacer SW2 is set. This can control the interval (interval in the gate length direction) between the p$^+$ type semiconductor region SD2 and the gate electrode GE2 at a desirable value.

On the other hand, the ion implantation IM2 for forming the n$^-$ type semiconductor regions EX1 is performed with an equivalent of the protective film HG1 not formed. When the ion implantation IM2 is performed with an equivalent of the protective film HG1 formed, there occurs a phenomenon in which the end of the n$^-$ type semiconductor region EX1 is separated from the side surface of the gate electrode GE1 by the thickness of the protective film. However, when the ion implantation IM2 is performed with an equivalent of the protective film HG1 not formed, such a phenomenon is prevented from occurring. For this reason, the ion implantation IM2 is performed with an equivalent of the protective film HG1 not formed. As a result, the n$^-$ type semiconductor region EX1 can be formed in such a manner as to be roughly in alignment with the side surface of the gate electrode GE1. The same also applies to the ion implantation IM3 for forming the p$^-$ type semiconductor regions EX2. The ion implantation IM3 is performed with an equivalent of the protective film HG1 not formed. As a result, the p$^-$ type semiconductor region EX2 can be formed in such a manner as to be roughly in alignment with the side surface of the gate electrode GE2. The ion implantations IM2 and IM3 are performed with an equivalent of the protective film HG1 not formed, and the ion implantations IM4 and IM5 are performed with an equivalent of the protective film HG1 formed. As a result, it is possible to readily and surely form a LDD structure in which the low impurity density regions (Ex1 and Ex2) are in alignment with their respective gate electrodes, respectively, and the high impurity density regions (SD1 and SD2) are separated from their respective gate electrodes, respectively.

Second Embodiment

FIGS. 34 to 43 are each an essential part cross sectional view of a semiconductor device of the present Second Embodiment during a manufacturing step. Also in the present Second Embodiment, the steps up to the formation of the sidewall spacers SW for obtaining the structure of FIG. 21 are almost the same as the manufacturing steps of First Embodiment. For this reason, herein, a repeated description thereon will be omitted, and a description will be given to the manufacturing steps after obtaining the structure of FIG. 21.

Figure 34:
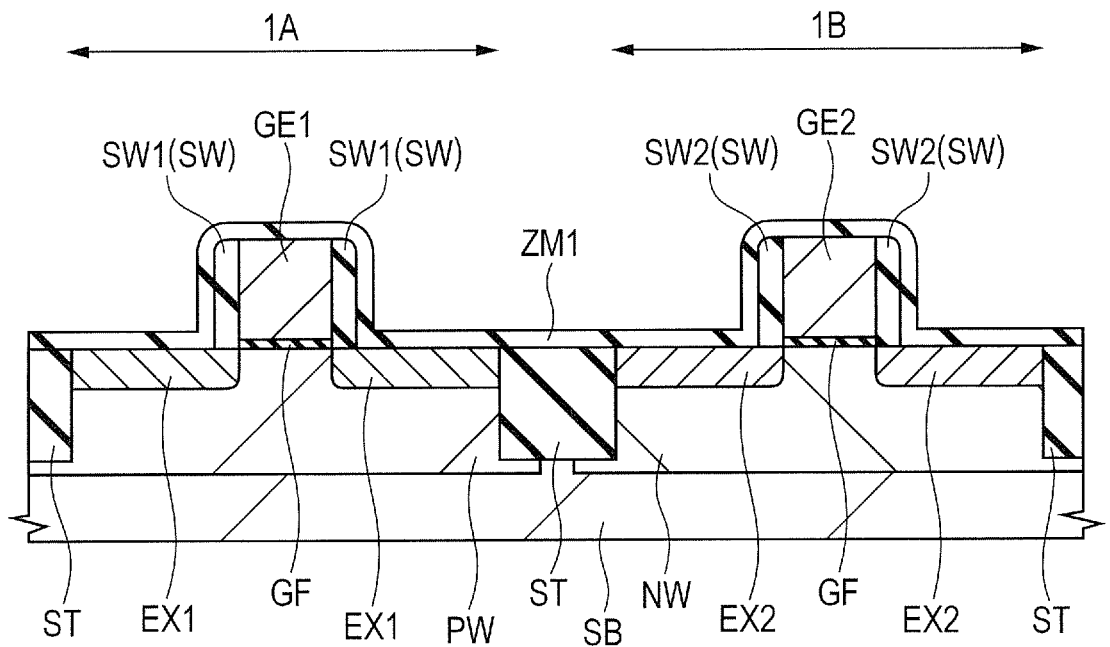
FIG. 34 is an essential part cross sectional view of a semiconductor device of another embodiment during a manufacturing step.

After obtaining the structure of FIG. 21 in the same manner as in First Embodiment, in the present Second Embodiment, as shown in FIG. 34, entirely over the main surface of the semiconductor substrate SB, an insulation film ZM1 is formed in such a manner as to cover the gate electrodes GE1 and GE2 and the sidewall spacers SW1 and SW2. The insulation film ZM1 is preferably formed of a silicon oxide film or a silicon nitride film, and can be formed using a CVD method or the like.

Figure 35:
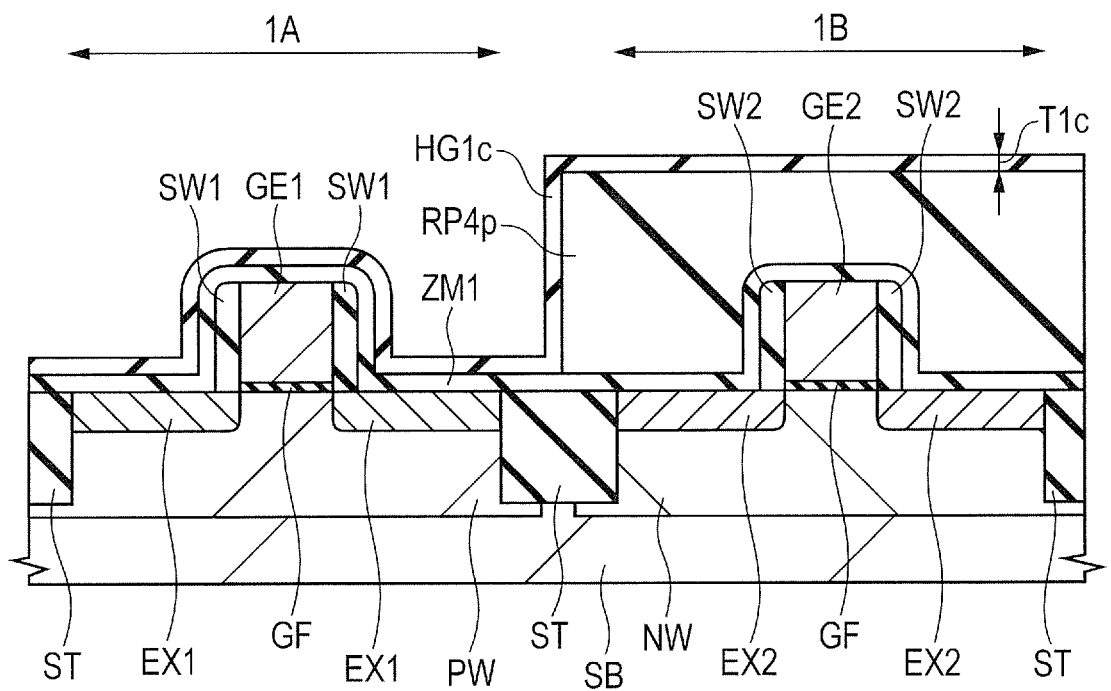
FIG. 35 is an essential part cross sectional view of the semiconductor device during a manufacturing step following FIG. 34.

Then, as shown in FIG. 35, over the insulation film ZM1, a photoresist pattern (resist pattern) RP4p covering the pMISFET formation region 1B, and exposing the nMISFET formation region 1A is formed using a photolithography technology. The present Second Embodiment is equal to First Embodiment in planar region in which the photoresist pattern RP4p is formed, but is different from First Embodiment in that the photoresist pattern RP4p is formed over the insulation film ZM1.

Then, over the insulation film ZM1, a protective film HG1c is formed in such a manner as to cover the photoresist pattern RP4p. The protective film HG1c corresponds to the protective film HG1a of First Embodiment. The protective film HG1c is preferably formed of a silicon film (more particularly, an amorphous silicon film). In order to prevent the modification of the photoresist pattern RP4p during deposition of the protective film HG1c, the protective film HG1c is preferably formed at relatively lower temperatures. The deposition temperature of the protective film HG1c is preferably 200° C. or less. The protective film HG1c can be formed using preferably a CVD method or an ALD method, more preferably a plasma CVD method or an ALD method, and further preferably an ALD method.

Figure 36:
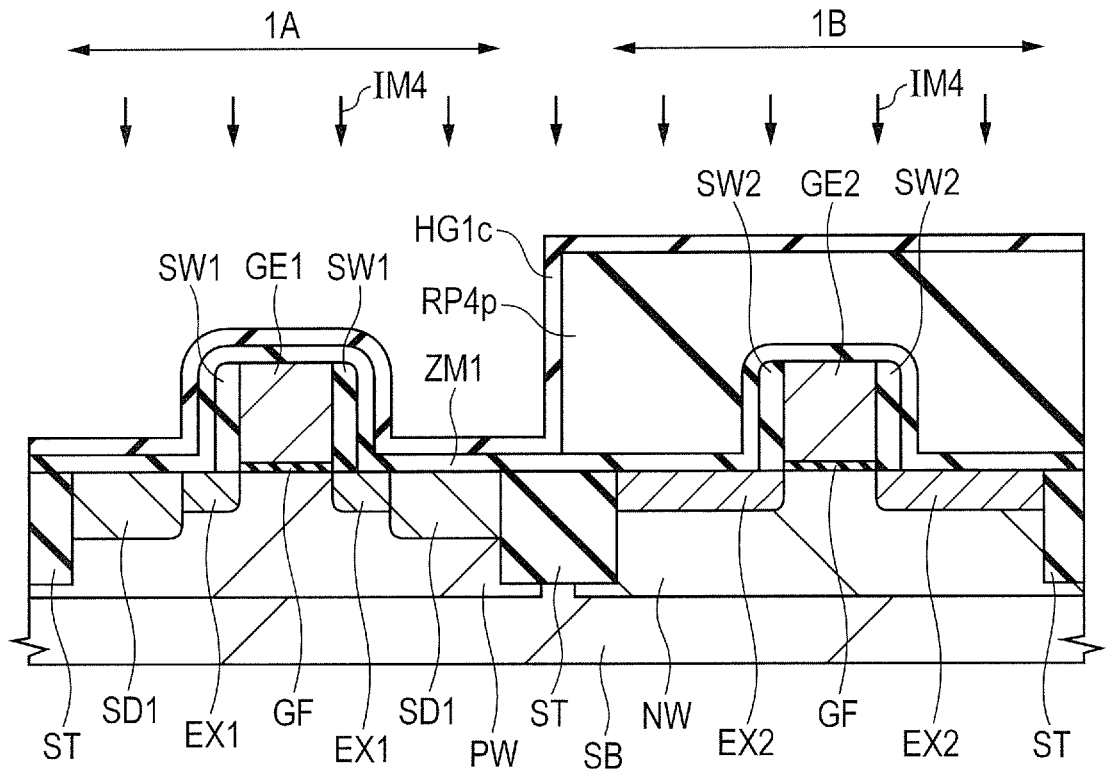
FIG. 36 is an essential part cross sectional view of the semiconductor device during a manufacturing step following FIG. 35.

Then, as shown in FIG. 36, by the ion implantation IM4, the n$^+$ type semiconductor regions SD1 are formed. The present Second Embodiment is basically the same as First Embodiment in step of forming the n$^+$ type semiconductor regions SD1 by the ion implantation IM4, but is different from First Embodiment in the following points.

Namely, in First Embodiment, in the ion implantation IM4, the impurity ions passed through the protective film HG1a, to be implanted into the semiconductor substrate SB. As a result, the n$^+$ type semiconductor regions SD1 were formed. However, in the present Second Embodiment, in the ion implantation IM4, impurity ions pass through the protective film HG1c and the insulation film ZM1, to be implanted into the semiconductor substrate SB. As a result, the n$^+$ type semiconductor regions SD1 are formed. As for others, the present Second Embodiment is the same as First Embodiment in step of forming the n+ type semiconductor regions SD1 by the ion implantation IM4, and hence herein is not described repeatedly.

As with First Embodiment, also in the present Second Embodiment, the ion implantation IM4 is performed with the photoresist pattern RP4p covered with the protective film (HG1c). Accordingly, the photoresist pattern RP4p is scarcely damaged by the ion implantation IM4. For this reason, the cured layer (KL) is not formed at the photoresist pattern RP4p.

Incidentally, in the present Second Embodiment, for the ion implantation IM4, in the nMISFET formation region 1A, in addition to the gate electrode GE1 and the sidewall spacers SW1, the insulation film ZM1 and the protective film HG1c over the side surfaces of the sidewall spacers SW1 may also function as a mask. Similarly, for ion implantation IM5 to be performed later, in the pMISFET formation region 1B, in addition to the gate electrode GE2 and the sidewall spacers SW2, the insulation film ZM1 and the protective film HG1d over the side surfaces of the sidewall spacers SW2 may also function as a mask. Accordingly, in the case of the present Second Embodiment, it is essential only that each thickness of the side wall spacers SW1 and SW2 is previously set smaller by the thickness of the insulation film ZM1 as compared with the case of First Embodiment.

Figure 37:
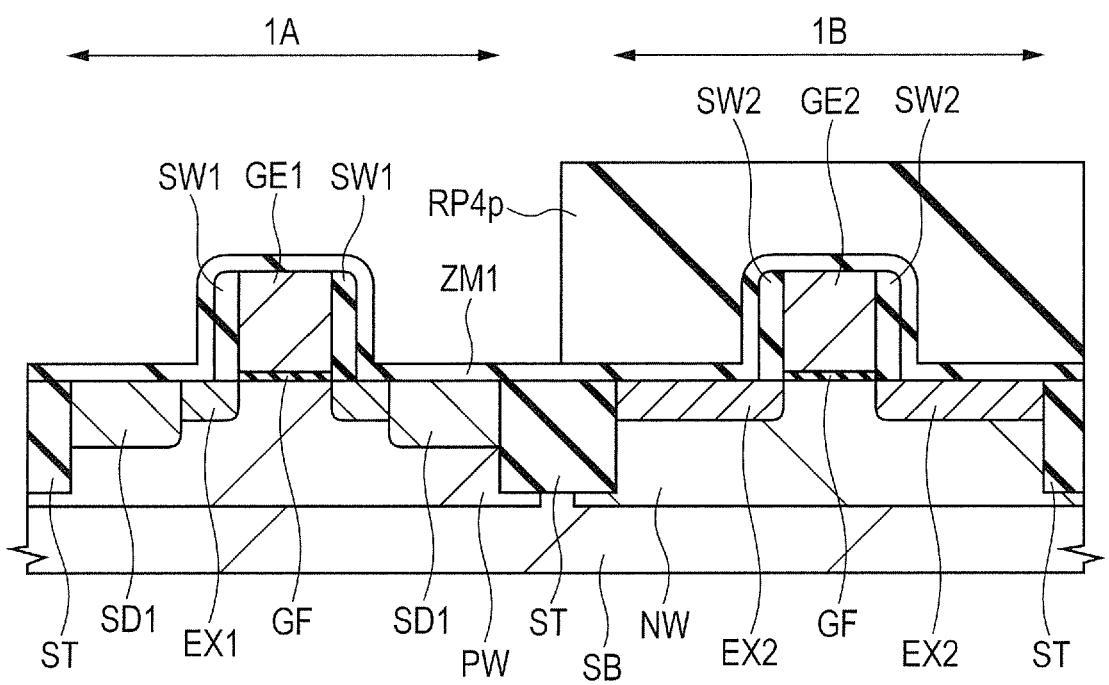
FIG. 37 is an essential part cross sectional view of the semiconductor device during a manufacturing step following FIG. 36.

Then, as shown in FIG. 37, the protective film HG1c is removed by a wet etching treatment. When the protective film HG1c is removed by a wet etching treatment, the protective film HG1c is selectively etched under the conditions in which the protective film HG1c is more likely to be etched than the photoresist pattern RP4p, and the insulation film ZM1 is less likely to be etched than the protective film HG1c. The insulation film ZM1 can function as an etching stopper film. The protective film HG1c is originally formed of a material easy to remove by wet etching. For this reason, the protective film HG1c can be removed by wet etching with ease and reliability even when damaged by the ion implantation IM4.

In order to enable selective etching of the protective film HG1c while suppressing the etching of the insulation film ZM1, desirably, the protective film HG1c is formed of a different material from that for the insulation film ZM1, and as the material for the protective film HG1c, the material capable of increasing the etching selectivity relative to the insulation film ZM1 is selected. Further, as the material for the protective film HG1c, desirably, the material which tends to be wet etched is selected. From this viewpoint, the protective film HG1c is preferably formed of a silicon film (more particularly, an amorphous silicon film). When the protective film HG1c is a silicon film, as the etchant for removing the protective film HG1c, for example, hydrochloric acid (an aqueous solution of hydrochloric acid) can be preferably used. Alternatively, when the insulation film ZM1 is a silicon oxide film or a silicon nitride film, as the protective film HG1c, a silicon film is preferable. However, other than this, the following is also possible: a silicon oxide film is used as the insulation film ZM1, and a silicon nitride film is used as the protective film HG1c. When the insulation film ZM1 is a silicon oxide film, and the protective film HG1c is a silicon nitride film, as the etchant for removing the protective film HG1c, hot phosphoric acid can be preferably used.

Figure 38:
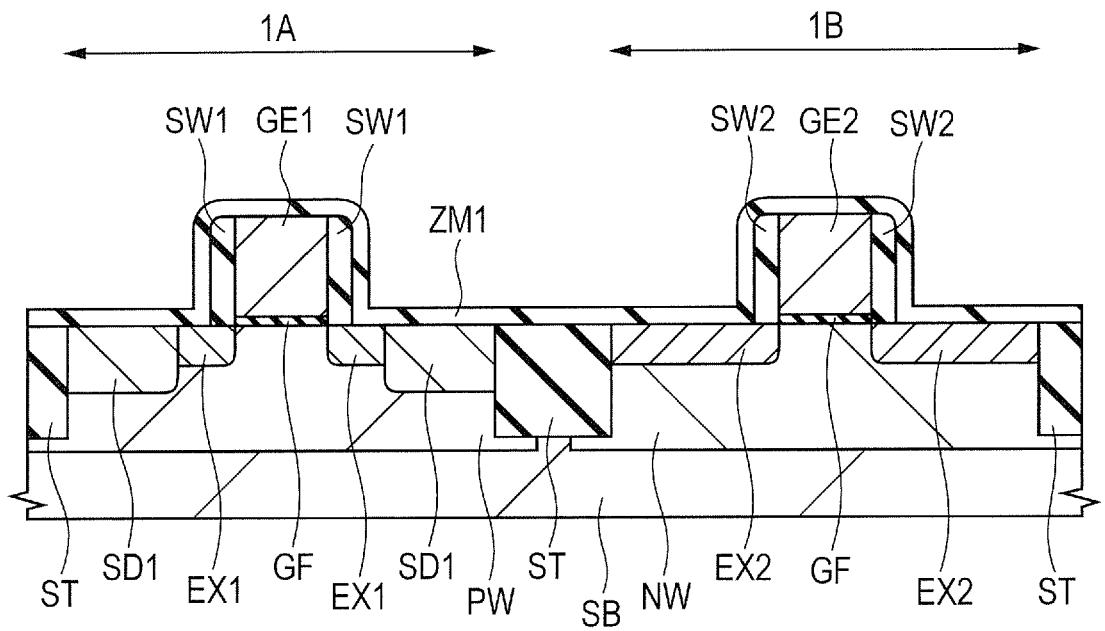
FIG. 38 is an essential part cross sectional view of the semiconductor device during a manufacturing step following FIG. 37.

Then, as shown in FIG. 38, the photoresist pattern RP4p is removed by an ashing treatment or a wet treatment. The cured layer (KL) is not formed at the photoresist pattern RP4p. For this reason, the photoresist pattern RP4p can be removed by an ashing treatment or a wet treatment with ease and reliability. Further, even when the removal step of the photoresist pattern RP4p is performed, the insulation film ZM1 is hardly removed, and remains in a layer form.

Figure 39:
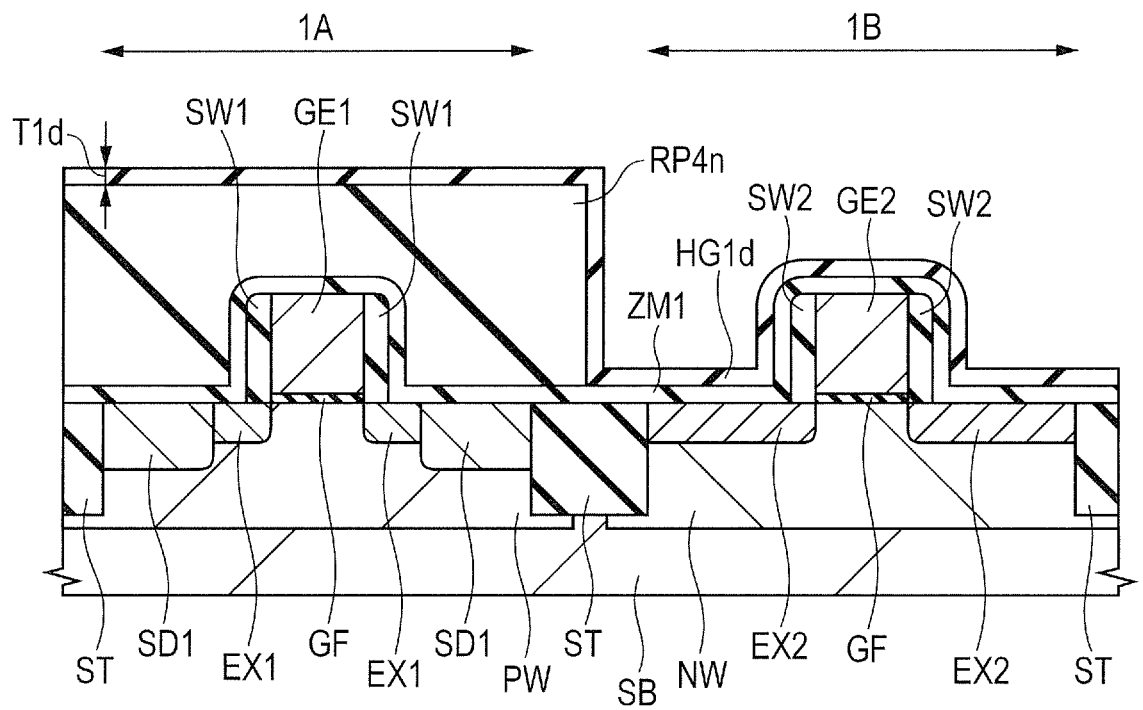
FIG. 39 is an essential part cross sectional view of the semiconductor device during a manufacturing step following FIG. 38.

Then, as shown in FIG. 39, over the insulation film ZM1, a photoresist pattern (resist pattern) RP4n covering the nMISFET formation region 1A and exposing the pMISFET formation region 1B is formed using a photolithography technology. The present Second Embodiment is also equal to First Embodiment in planar region in which the photoresist pattern RP4n is formed, but is different from First Embodiment in that the photoresist pattern RP4n is formed over the insulation film ZM1.

Then, over the insulation film ZM1, a protective film HG1d is formed in such a manner as to cover the photoresist pattern RP4n. The protective film HG1d corresponds to the protective film HG1b of First Embodiment. The protective film HG1c is preferably formed of a silicon film (more particularly, an amorphous silicon film). In order to prevent the modification of the photoresist pattern RP4n during deposition of the protective film HG1d, the protective film HG1d is preferably formed at relatively lower temperatures. The deposition temperature of the protective film HG1d is preferably 200° C. or less. The protective film HG1d can be formed using preferably a CVD method or an ALD method, more preferably a plasma CVD method or an ALD method, and further preferably an ALD method.

Figure 40:
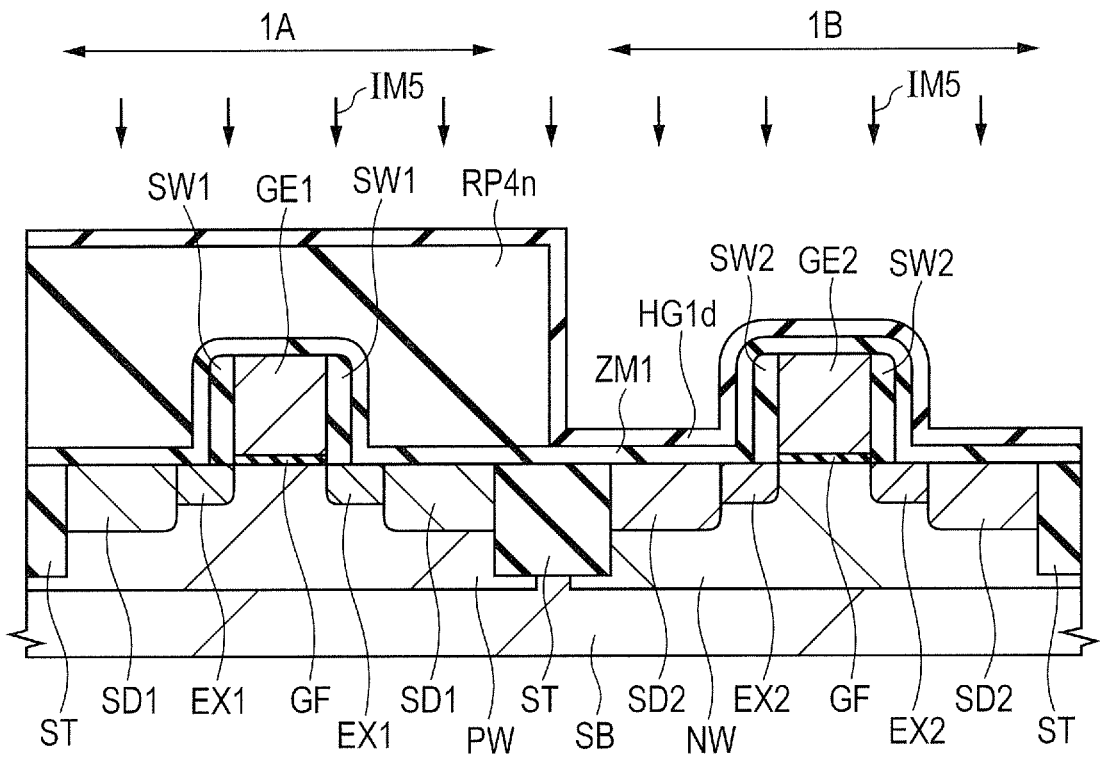
FIG. 40 is an essential part cross sectional view of the semiconductor device during a manufacturing step following FIG. 39.

Then, as shown in FIG. 40, by the ion implantation IM5, the p+ type semiconductor regions SD2 are formed. The present Second Embodiment is basically the same as First Embodiment in step of forming the p+ type semiconductor regions SD2 by the ion implantation IM5, but is different from First Embodiment in the following points.

Namely, in First Embodiment, in the ion implantation IM5, the impurity ions passed through the protective film HG1b, to be implanted into the semiconductor substrate SB. As a result, the p+ type semiconductor regions SD2 were formed. However, in the present Second Embodiment, in the ion implantation IM5, impurity ions pass through the protective film HG1d and the insulation film ZM1, to be implanted into the semiconductor substrate SB. As a result, the p+ type semiconductor regions SD2 are formed. As for others, the present Second Embodiment is the same as First Embodiment in step of forming the p+ type semiconductor regions SD2 by the ion implantation IM5, and hence herein is not described repeatedly.

As with First Embodiment, also in the present Second Embodiment, the ion implantation IM5 is performed with the photoresist pattern RP4n covered with the protective film (HG1d). Accordingly, the photoresist pattern RP4n is hardly damaged by the ion implantation IM5. For this reason, the cured layer (KL) is not formed at the photoresist pattern RP4n.

Figure 41:
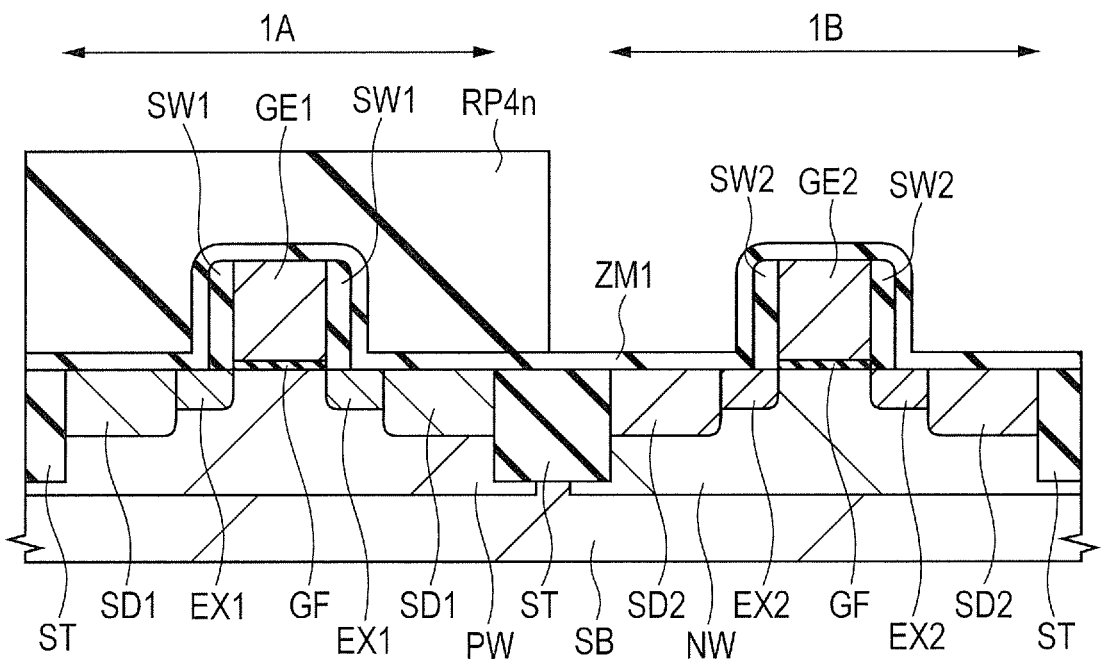
FIG. 41 is an essential part cross sectional view of the semiconductor device during a manufacturing step following FIG. 40.

Then, as shown in FIG. 41, the protective film HG1d is removed by a wet etching treatment. When the protective film HG1d is removed by a wet etching treatment, the protective film HG1d is selectively etched under the conditions in which the protective film HG1d is more likely to be etched than the photoresist pattern RP4n, and the insulation film ZM1 is less likely to be etched than the protective film HG1d. The insulation film ZM1 can function as an etching stopper film. The protective film HG1d is originally formed of a material easy to remove by wet etching. For this reason, the protective film HG1d can be removed by wet etching with ease and reliability even when damaged by the ion implantation IM5.

In order to enable selective etching of the protective film HG1d while suppressing the etching of the insulation film ZM1, desirably, the protective film HG1d is formed of a different material from that for the insulation film ZM1, and as the material for the protective film HG1d, the material capable of increasing the etching selectivity relative to the insulation film ZM1 is selected. Further, as the material for the protective film HG1d, desirably, the material which tends to be wet etched is selected. From this viewpoint, the protective film HG1d is preferably formed of a silicon film (more particularly, an amorphous silicon film). When the protective film HG1d is a silicon film, as the etchant for removing the protective film HG1d, for example, hydrochloric acid (an aqueous solution of hydrochloric acid) can be preferably used. Alternatively, when the insulation film ZM1 is a silicon oxide film or a silicon nitride film, as the protective film HG1d, a silicon film is preferable. However, other than this, the following is also possible: a silicon oxide film is used as the insulation film ZM1, and a silicon nitride film is used as the protective film HG1d. When the insulation film ZM1 is a silicon oxide film, and the protective film HG1d is a silicon nitride film, as the etchant for removing the protective film HG1d, hot phosphoric acid can be preferably used.

Figure 42:
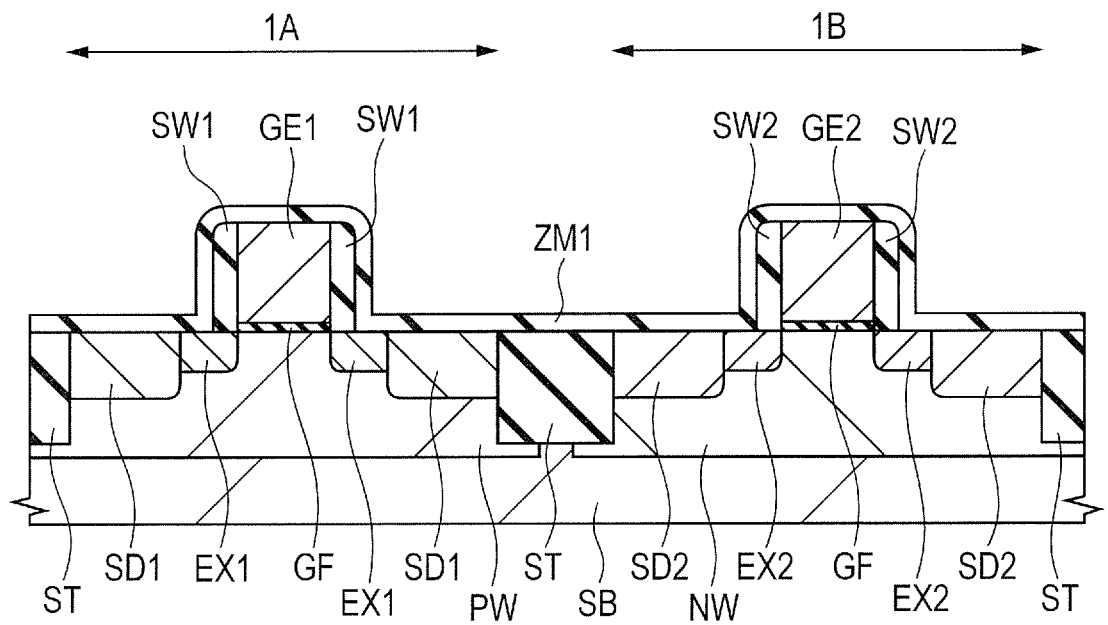
FIG. 42 is an essential part cross sectional view of the semiconductor device during a manufacturing step following FIG. 41.
Figure 43:
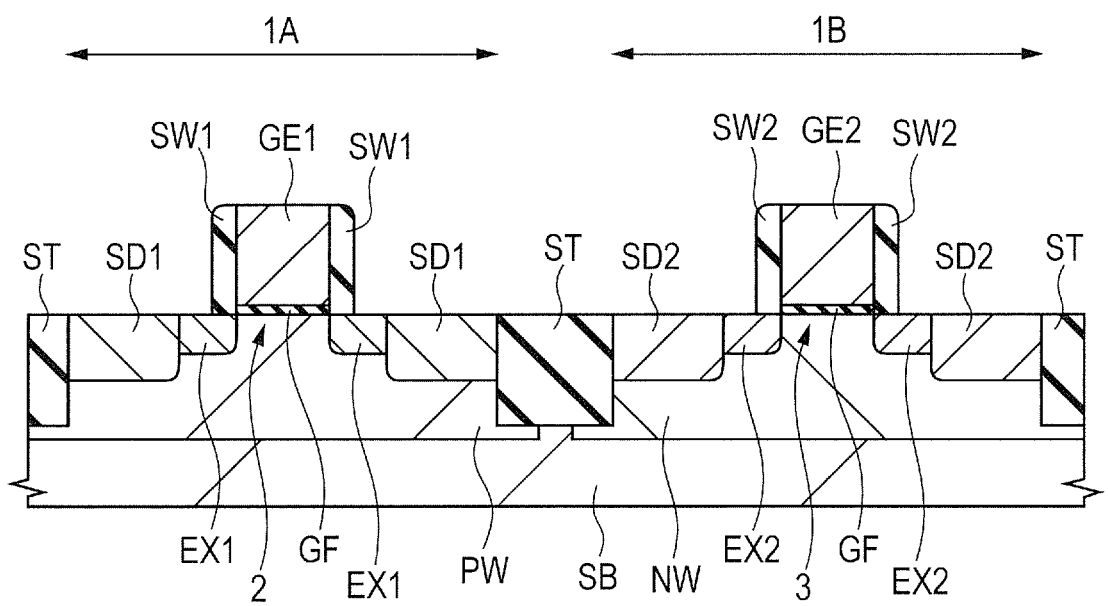
FIG. 43 is an essential part cross sectional view of the semiconductor device during a manufacturing step following FIG. 42.

Then, as shown in FIG. 42, the photoresist pattern RP4n is removed by an ashing treatment or a wet treatment. The cured layer (KL) is not formed at the photoresist pattern RP4n. For this reason, the photoresist pattern RP4n can be removed by an ashing treatment or a wet treatment with ease and reliability. Further, even when the removal step of the photoresist pattern RP4n is performed, the insulation film ZM1 is hardly removed, and remains in a layer form.

Then, the insulation film ZM1 is removed. The insulation film ZM1 can be removed using wet etching. For example, when the insulation film ZM1 is a silicon oxide film, hydrofluoric acid can be preferably used as an etchant. When the insulation film ZM1 is a silicon nitride film, hot phosphoric acid can be preferably used as an etchant.

Incidentally, herein, a description has been given to the following: after forming the insulation film ZM1, the steps of forming the $n^+$ type semiconductor regions SD1 (the steps of FIGS. 35 to 38) are performed first; then, the steps of forming the $p^+$ type semiconductor regions SD2 (the steps of FIGS. 39 to 42) are performed. However, either of the $n^+$ type semiconductor regions SD1 and the $p^+$ type semiconductor regions SD2 may be formed first. The following case is also possible: after forming the insulation film ZM1, the steps of forming the $p^+$ type semiconductor regions SD2 (the steps of FIGS. 39 to 42) are performed; then, the steps of forming the $n^+$ type semiconductor regions SD1 (the steps of FIGS. 35 to 38) are performed.

The present Second Embodiment and First Embodiment are equal in subsequent steps (the steps of FIGS. 32 and 33). For this reason, herein, a repeated description thereon is omitted. The activating annealing can be performed after removing or before removing the insulation film ZM1 in the present Second Embodiment.

The present Second Embodiment can also provide almost the same effects as those of First Embodiment, but is different from First Embodiment in the following points.

Namely, in the case of First Embodiment, upon removing the protective film HG1a by wet etching, the surface of the semiconductor substrate SB is exposed. The removal step of the photoresist pattern RP4p is performed with the surface of the semiconductor substrate SB exposed. Further, upon removing the protective film HG1b by wet etching, the surface of the semiconductor substrate SB is exposed. The removal step of the photoresist pattern RP4n is performed with the surface of the semiconductor substrate SB exposed.

In contrast, in the case of the present Second Embodiment, upon removing the protective film HG1c by wet etching, the surface of the semiconductor substrate SB is not exposed. The removal step of the photoresist pattern RP4p is performed with the surface of the semiconductor substrate SB not exposed. Further, upon removing the protective film HG1d by wet etching, the surface of the semiconductor substrate SB is not exposed. The removal step of the photoresist pattern RP4n is performed with the surface of the semiconductor substrate SB not exposed.

For this reason, as compared with First Embodiment, the present Second Embodiment has an advantage of preventing the semiconductor substrate SB from being damaged in the removal step of the photoresist pattern RP4p and the removal step of the photoresist pattern RP4n. The present Second Embodiment is more advantageous in this point than First Embodiment.

Further, in the case of First Embodiment, in the ion implantation IM4, the impurity ions pass through the protective film HG1a, to be implanted into the semiconductor substrate SB, and in the ion implantation IM5, the impurity ions pass through the protective film HG1b, to be implanted into the semiconductor substrate SB. In contrast, in the case of the present Second Embodiment, in the ion implantation IM4, the impurity ions pass through the protective film HG1c and the insulation film ZM1, to be implanted into the semiconductor substrate SB, and in the ion implantation IM5, the impurity ions pass thorough the protective film HG1d and the insulation film ZM1, to be implanted into the semiconductor substrate SB.

For this reason, as compared with the present Second Embodiment, First Embodiment has the following advantage: the $n^+$ type semiconductor regions SD1 tend to be formed by the ion implantation IM4, and the $p^+$ type semiconductor regions SD2 tend to be formed by the ion implantation IM5. First Embodiment is more advantageous in this point than the present Second Embodiment.

Further, as compared with the present Second Embodiment, First Embodiment also has the following advantage: the insulation film ZM1 formation step and the insulation film ZM1 removal step become unnecessary, sot that the number of manufacturing steps of the semiconductor device can be reduced by that much, and hence the manufacturing cost of the semiconductor device can be reduced.

Third Embodiment

FIGS. 44 to 51 are each an essential part cross sectional view of a semiconductor device of the present Third Embodiment during a manufacturing step. Also in the present Third Embodiment, the steps up to the formation of the photoresist pattern RP4p and obtaining the structure of FIG. 22 are the same as the manufacturing steps of First Embodiment, and hence herein, are not described repeatedly. A description will be given to the manufacturing steps after obtaining the structure of FIG. 22.

Figure 44:
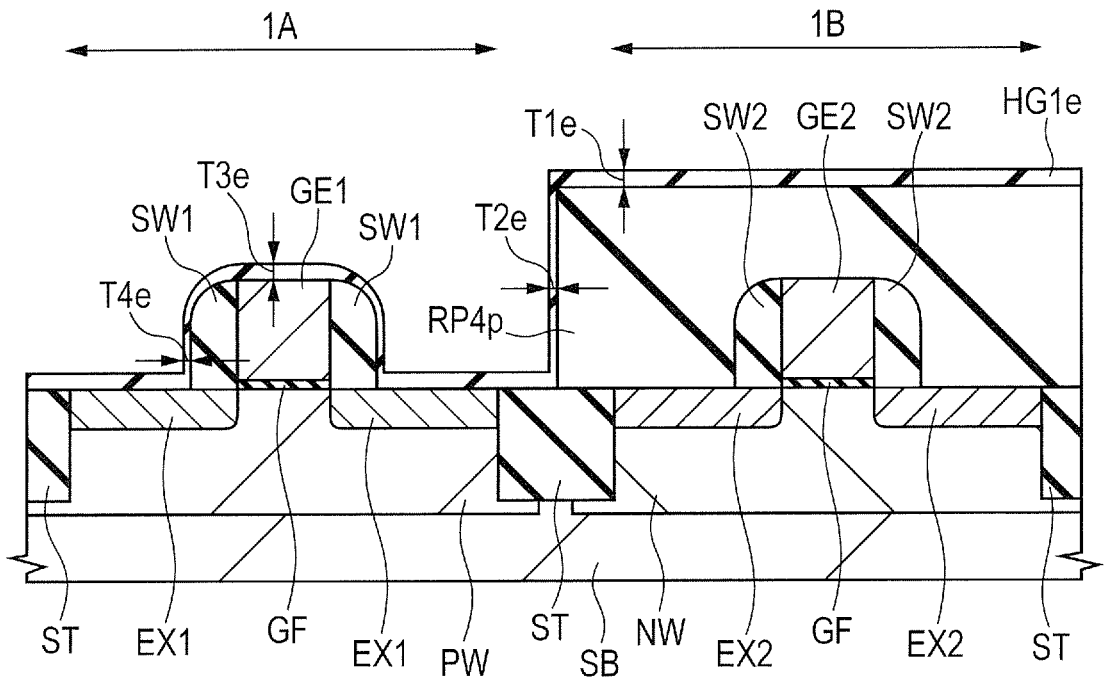
FIG. 44 is an essential part cross sectional view of a semiconductor device of a still other embodiment during a manufacturing step.

After obtaining the structure of FIG. 22 in the same manner as in First Embodiment, in the present Third Embodiment, as shown in FIG. 44, over the main surface of the semiconductor substrate SB, a protective film (insulation film) HG1e is formed in such a manner as to cover the photoresist pattern RP4p. The protective film HG1e corresponds to the protective film HG1a.

The materials for the protective film HG1e are the same as those for the protective film HG1a. However, the deposition method of the protective film HG1e is different from the deposition method of the protective film HG1a. The protective film HG1a was formed using a CVD method or an ALD method. In contrast, in the present Third Embodiment, the protective film HG1e is formed using a sputtering method. In order to prevent the modification of the photoresist pattern RP4p during deposition of the protective film HG1e, the deposition temperature of the protective film HG1e is preferably 200° C. or less.

In First Embodiment, the protective film HG1a was formed with a CVD method or an ALD method. In reflection of this, as shown in FIG. 23, the thickness T1a of the protective film HG1a formed over the upper surface of the photoresist pattern RP4p, the thickness T2a of the protective film HG1a formed over the side surface of the photoresist pattern RP4p, the thickness T3a of the protective film HG1a formed over the gate electrode GE1, and the thickness T4a of the protective film HG1a formed over the side surface of the sidewall spacer SW1 were almost equal to one another. Namely, T1a=T2a=T3a=T4a roughly holds.

In contrast, in the present Third Embodiment, the protective film HG1e is formed with a sputtering method. In reflection of this, the thickness T1e of the protective film HG1e formed over the upper surface of the photoresist pattern RP4p, and the thickness T3e of the protective film HG1e formed over the gate electrode GE1 become roughly equal to each other. Then, as compared with the thicknesses T1e and T3e, the thickness T2e of the protective film HG1e formed over the side surface of the photoresist pattern RP4p, and the thickness T4e of the protective film HG1e formed over the side surface of the sidewall spacer SW1 become very smaller. Namely, T1e=T3e, T2e=T4e, T1e>T2e, and T3e>T4e roughly hold. Alternatively, the protective film HG1e may not be formed over the side surface of the photoresist pattern RP4p, and over the side surface of the sidewall spacer SW1 (i.e., when T2e=T4e=0).

Namely, the protective film HG1e with a prescribed thickness is formed over the upper surface of the photoresist pattern RP4p and over the gate electrode GE1. In contrast, the protective film HG1e is not formed over the side surface of the photoresist pattern RP4p, and over the side surface of the sidewall spacer SW1. Alternatively, the protective film HG1e with the thickness (T2e) smaller than the thickness (T1e) of the protective film HG1e over the upper surface of the photoresist pattern RP4p is formed.

Incidentally, in the case of the present Third Embodiment, the thickness of the protective film over the side surface of the sidewall spacer SW1 is reduced. Thus, it is essential only that the thickness of the sidewall spacer SW1 is set larger than the thickness of the sidewall spacer SW1 in the case of First Embodiment by that much in order to equalize the position of the end of the n+ type semiconductor region SD1 between the present Third Embodiment and First Embodiment.

Figure 45:
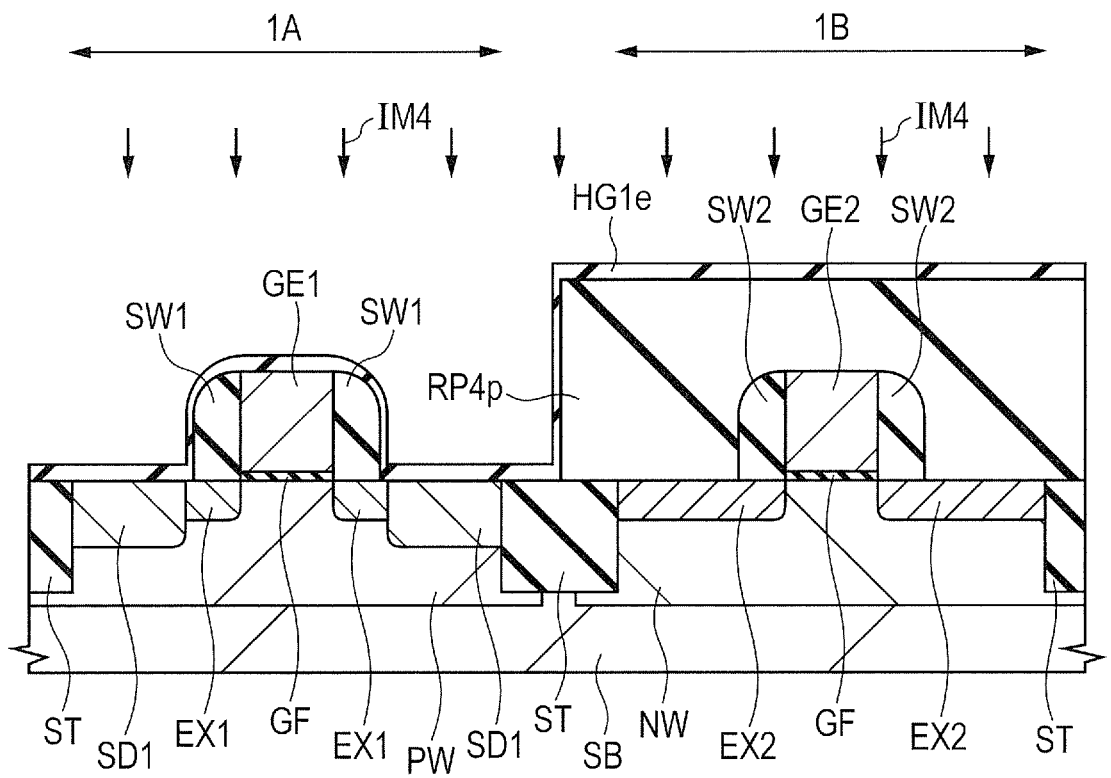
FIG. 45 is an essential part cross sectional view of the semiconductor device during a manufacturing step following FIG. 44.

Then, in the same manner as in First Embodiment, also in the present Third Embodiment, the n+ type semiconductor regions SD1 are formed by the ion implantation IM4 as shown in FIG. 45.

As distinct from the present Third Embodiment, when the ion implantation IM4 is performed without the formation of the protective film HG1e, the photoresist pattern RP4p is damaged by the ion implantation, which may result in the formation of an equivalent of the cured layer KL. The portion in which the cured layer KL is highly possibly formed is the vicinity of the upper surface of the photoresist pattern RP4p. The cured layer KL is less likely to be formed on the side surface side of the photoresist pattern RP4p. This is due to the following: as compared with the fact that a large amount of impurity ions are implanted from the upper surface of the photoresist pattern RP4p into the photoresist pattern RP4p, the impurity ions are implanted scarcely, or implanted in a small amount, if any, from the side surface of the photoresist pattern RP4p into the photoresist pattern RP4p.

For this reason, when the ion implantation IM4 is performed with the upper surface of the photoresist pattern RP4p covered with the protective film HG1e as in the present Third Embodiment, at the upper surface of the photoresist pattern RP4p, damage by the ion implantation can be prevented, thereby to prevent the formation of the cured layer (KL). On the other hand, in the present Third Embodiment, at the side surface of the photoresist pattern RP4p, the protective film HG1e is not formed, or a very thin protective film HG1e is formed. However, even in such a case, at the side surface of the photoresist pattern RP4p, the cured layer KL is formed hardly, or formed in a small amount, if any. Therefore, it is possible to prevent the occurrence of the defect (the defect described by reference to FIGS. 5 and 6) caused by the cured layer (KL) when the photoresist pattern RP4p is removed later.

Figure 46:
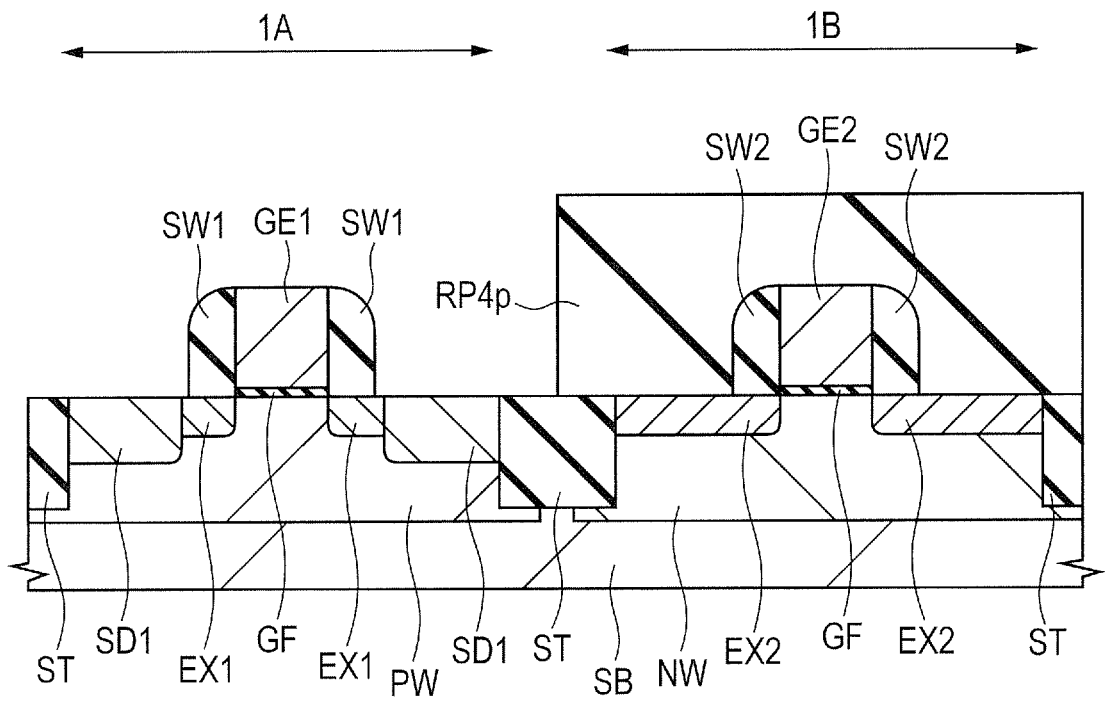
FIG. 46 is an essential part cross sectional view of the semiconductor device during a manufacturing step following FIG. 45.

Then, as with First Embodiment, also in the present Third Embodiment, as shown in FIG. 46, the protective film HG1e is removed by a wet etching treatment. The step of removing the protective film HG1e by a wet etching treatment is basically the same as the step of removing the protective film HG1a by a wet etching treatment in First Embodiment, and hence, herein, is not described repeatedly.

Figure 47:
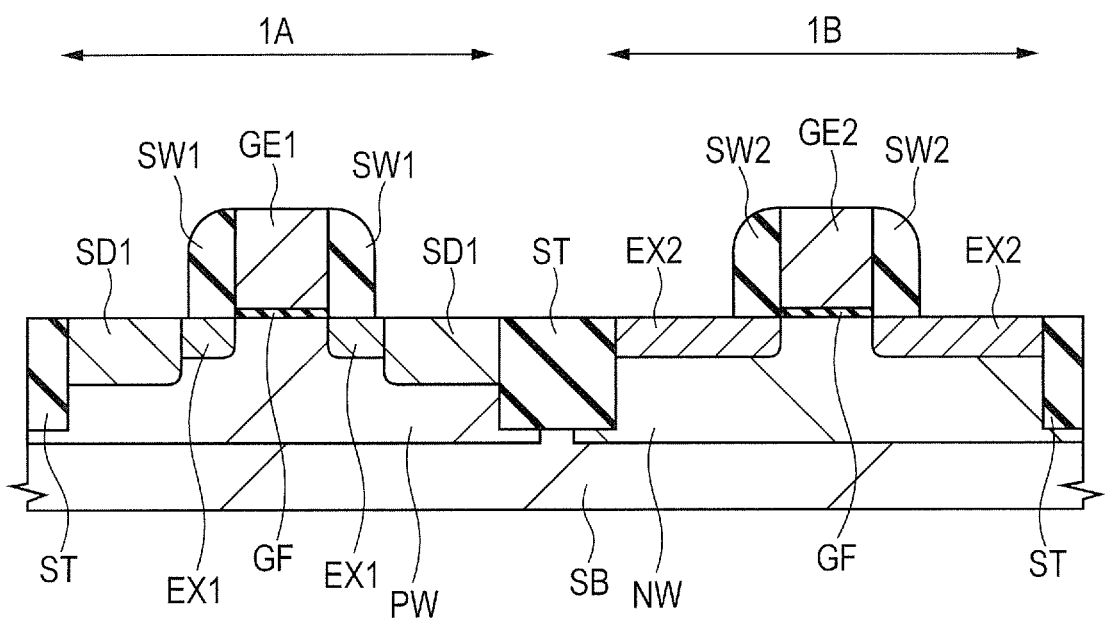
FIG. 47 is an essential part cross sectional view of the semiconductor device during a manufacturing step following FIG. 46.

Then, as with First Embodiment, also in the present Third Embodiment, as shown in FIG. 47, the photoresist pattern RP4p is removed by an ashing treatment or a wet treatment. The step of removing the photoresist pattern RP4p is basically equal between the present Third Embodiment and First Embodiment, and hence, herein, is not described repeatedly. The cured layer (KL) is formed hardly, or formed in a small amount, if any, at the photoresist pattern RP4p. For this reason, the photoresist pattern RP4p can be removed by an ashing treatment or a wet treatment with ease and reliability.

Figure 48:
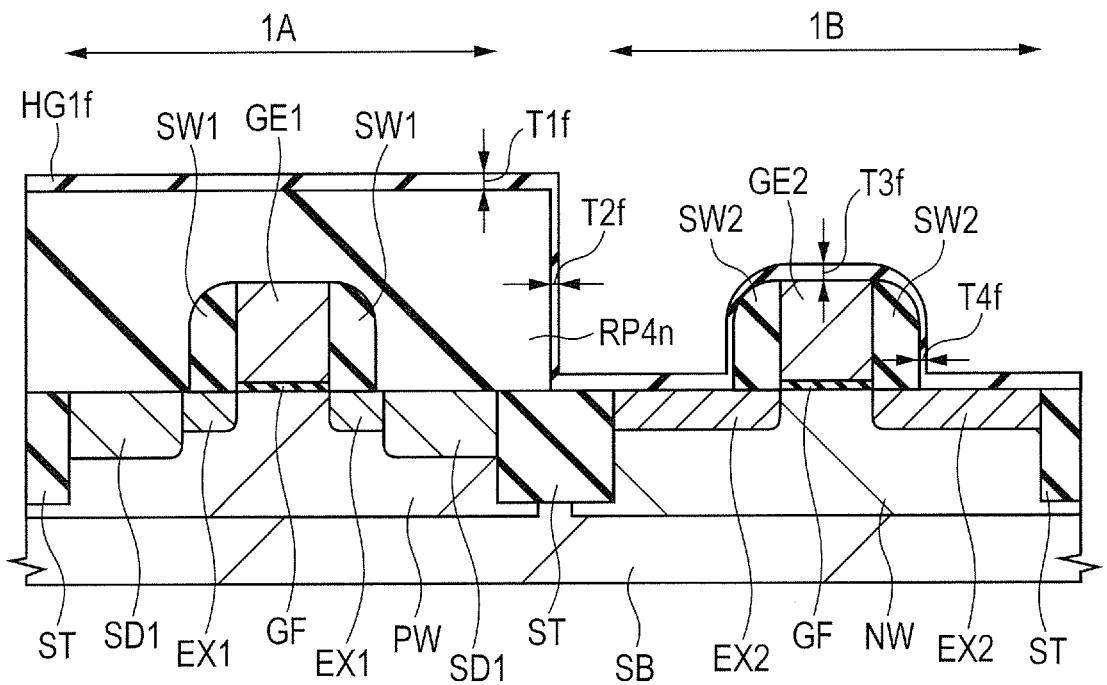
FIG. 48 is an essential part cross sectional view of the semiconductor device during a manufacturing step following FIG. 47.

Then, as with First Embodiment, also in the present Third Embodiment, as shown in FIG. 48, over the semiconductor substrate SB, a photoresist pattern (resist pattern) RP4n covering the nMISFET formation region 1A, and exposing the pMISFET formation region 1B is formed using a photolithography technology.

Then, as shown in FIG. 48, over the main surface of the semiconductor substrate SB, a protective film (insulation film) HG1f is formed in such a manner as to cover the photoresist pattern RP4n. The protective film HG1f corresponds to the protective film HG1b.

The materials for the protective film HG1f are the same as the materials for the protective film HG1b. However, the deposition method of the protective film HG1f is different from the deposition method of the protective film HG1b. In the present Third Embodiment, the protective film HG1f is also formed using a sputtering method as with the protective film HG1e. In order to prevent the modification of the photoresist pattern RP4n during deposition of the protective film HG1f, the deposition temperature of the protective film HG1f is preferably 200° C. or less.

In the First Embodiment, the protective film HG1b was formed with a CVD method or an ALD method. In reflection of this, as shown in FIG. 28, the thickness T1b of the protective film HG1b formed over the upper surface of the photoresist pattern RP4n, the thickness T2b of the protective film HG1b formed over the side surface of the photoresist pattern RP4n, the thickness T3b of the protective film HG1b formed over the gate electrode GE2, and the thickness T4b of the protective film HG1b formed over the side surface of the sidewall spacer SW2 become roughly equal to one another. Namely, T1b=T2b=T3b=T4b roughly holds.

In contrast, in the present Third Embodiment, the protective film HG1f is formed with a sputtering method. In reflection of this, the thickness T1f of the protective film HG1f formed over the upper surface of the photoresist pattern RP4n, and the thickness T3f of the protective film HG1f formed over the gate electrode GE2 become roughly equal to each other. Then, as compared with the thicknesses T1f and T3f, the thickness T2f of the protective film HG1f formed over the side surface of the photoresist pattern RP4n, and the thickness T4f of the protective film HG1f formed over the side surface of the sidewall spacer SW2 become considerably thin. Namely, T1f=T3f, T2f=T4f, T1f>T2f, and T3f>T4f roughly hold. Alternatively, there may be the case where the protective film HG1f is not formed over the side surface of the photoresist pattern RP4n and over the side surface of the sidewall spacer SW2 (i.e., the case where T2f=T4f=0).

Namely, the protective film HG1f with a prescribed thickness is formed over the upper surface of the photoresist pattern RP4n and over the gate electrode GE2. In contrast, over the side surface of the photoresist pattern RP4n and over the side surface of the sidewall spacer SW2, the protective film HG1f is not formed, or the protective film HG1f with the thickness (T2f) smaller than the thickness (T1f) of the protective film HG1f over the upper surface of the photoresist pattern RP4n is formed.

Incidentally, in the case of the present Third Embodiment, the thickness of the protective film over the side surface of the sidewall spacer SW2 is reduced. Thus, it is essential only that the thickness of the sidewall spacer SW2 is set larger than the thickness of the sidewall spacer SW2 in the case of First Embodiment by that much in order to equalize the position of the end of the $p^+$ type semiconductor region SD2 between the present Third Embodiment and First Embodiment.

Figure 49:
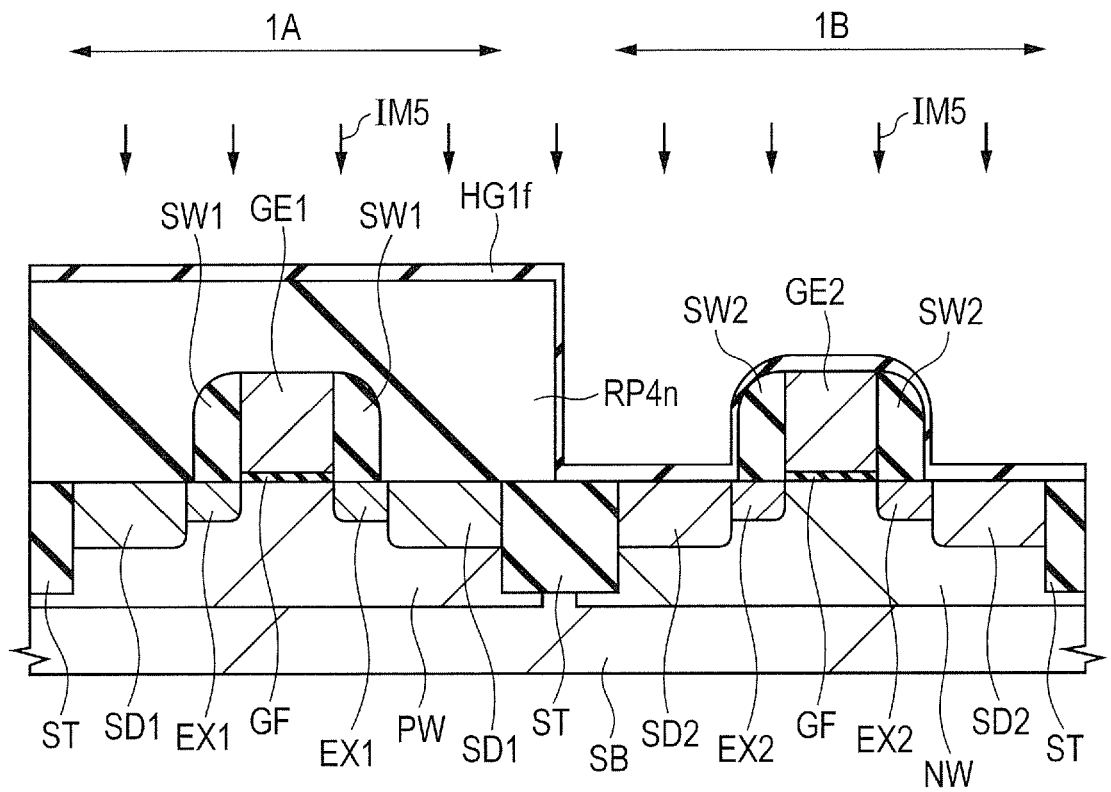
FIG. 49 is an essential part cross sectional view of the semiconductor device during a manufacturing step following FIG. 48.

Then, in the same manner as in First Embodiment, also in the present Third Embodiment, the $p^+$ type semiconductor regions SD2 are formed by the ion implantation IM5 as shown in FIG. 49.

As distinct from the present Third Embodiment, when the ion implantation IM5 is performed without the formation of the protective film HG1f, the photoresist pattern RP4n is damaged by the ion implantation, which may result in the formation of an equivalent of the cured layer KL. The portion in which the cured layer KL is highly possibly formed is the vicinity of the upper surface of the photoresist pattern RP4n. The cured layer KL is less likely to be formed on the side surface side of the photoresist pattern RP4n. This is due to the following: as compared with the fact that a large amount of impurity ions are implanted from the upper surface of the photoresist pattern RP4n into the photoresist pattern RP4n, the impurity ions are implanted scarcely, or implanted in a small amount, if any, from the side surface of the photoresist pattern RP4n into the photoresist pattern RP4n.

For this reason, when the ion implantation IM5 is performed with the upper surface of the photoresist pattern RP4n covered with the protective film HG1f as in the present Third Embodiment, at the upper surface of the photoresist pattern RP4n, damage by the ion implantation can be prevented, thereby to prevent the formation of the cured layer (KL). On the other hand, in the present Third Embodiment, at the side surface of the photoresist pattern RP4n, the protective film HG1f is not formed, or a very thin protective film HG1e is formed. However, even in such a case, at the side surface of the photoresist pattern RP4n, the cured layer KL is formed hardly, or formed in a small amount, if any. Therefore, it is possible to prevent the occurrence of the defect (the defect described by reference to FIGS. 5 and 6) caused by the cured layer (KL) when the photoresist pattern RP4n is removed later.

Figure 50:
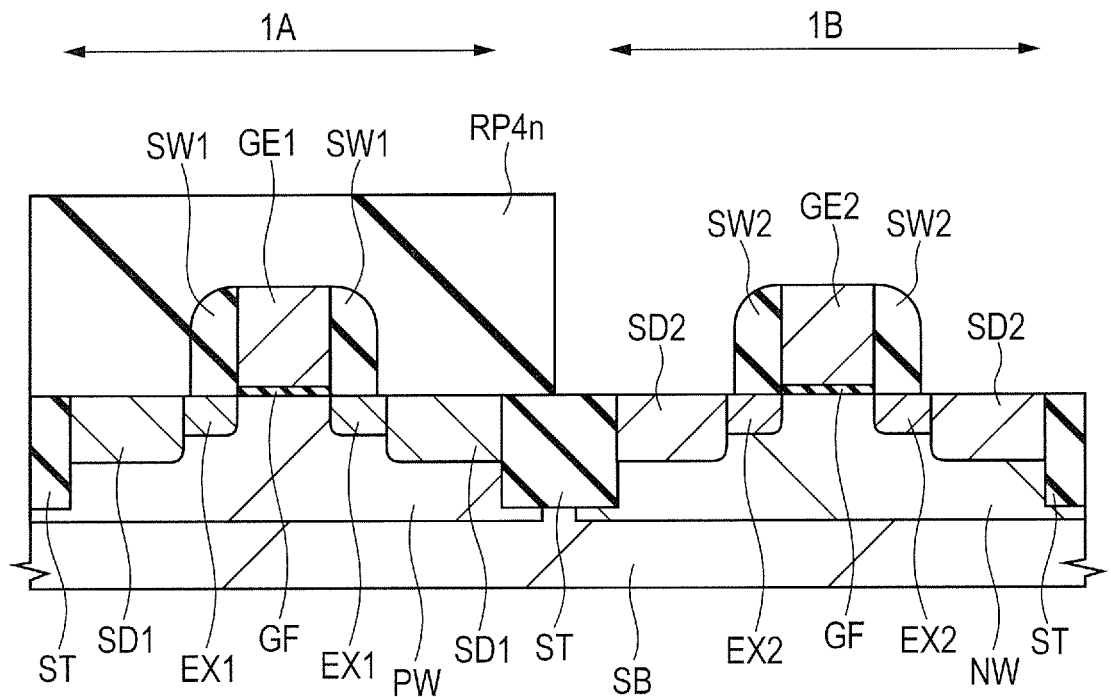
FIG. 50 is an essential part cross sectional view of the semiconductor device during a manufacturing step following FIG. 49.

Then, as with First Embodiment, also in the present Third Embodiment, as shown in FIG. 50, the protective film HG1f is removed by a wet etching treatment. The step of removing the protective film HG1f by a wet etching treatment is basically the same as the step of removing the protective film HG1b by a wet etching treatment in First Embodiment, and hence, herein, is not described repeatedly.

Figure 51:
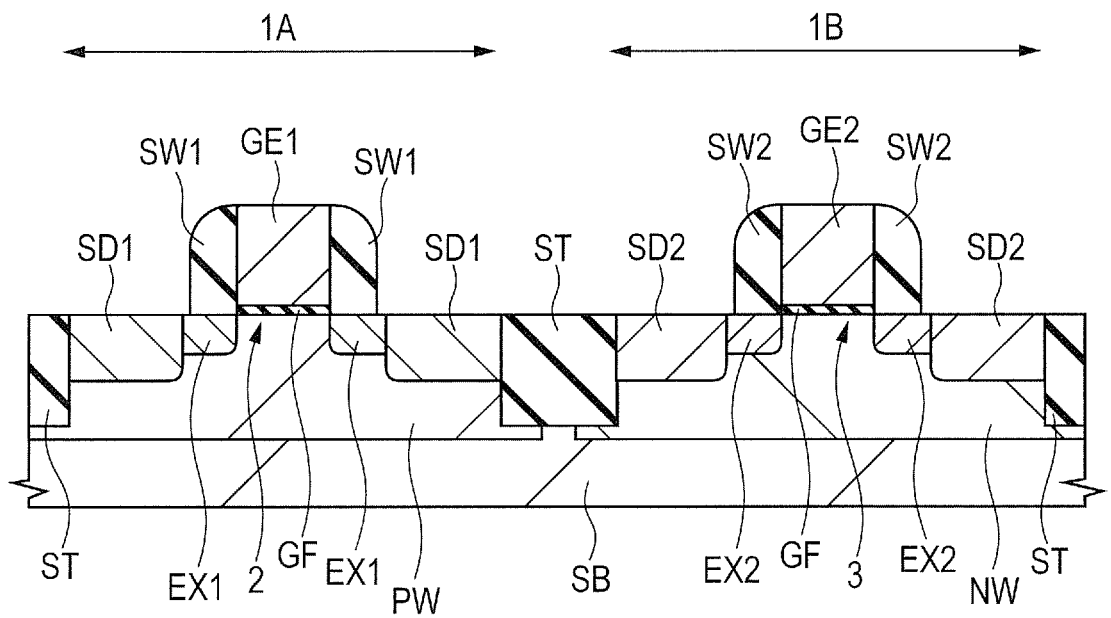
FIG. 51 is an essential part cross sectional view of the semiconductor device during a manufacturing step following FIG. 50.

Then, as with First Embodiment, also in the present Third Embodiment, as shown in FIG. 51, the photoresist pattern RP4n is removed by an ashing treatment or a wet treatment. The step of removing the photoresist pattern RP4n is basically equal between the present Third Embodiment and First Embodiment, and hence, herein, is not described repeatedly. The cured layer (KL) is formed hardly at the photoresist pattern RP4n, or formed in a small amount, if any, at the side surface of the photoresist pattern RP4n. For this reason, the photoresist pattern RP4n can be removed by an ashing treatment or a wet treatment with ease and reliability.

The subsequent steps (the steps of FIGS. 32 and 33) are the same as those of First Embodiment, and hence, herein, are not described repeatedly.

Alternatively, the present Third Embodiment can be combined with Second Embodiment. In that case, only the following is essential: in the Second Embodiment, the step of forming the protective film HG1c is performed in the same manner as the protective film HG1e formation step of the present Third Embodiment (i.e., the protective film HG1c is formed with a sputtering method); further, the step of forming the protective film HG1d is performed in the same manner as the protective film HG1f formation step of the present Third Embodiment (i.e., the protective film HG1d is formed with a sputtering method). In that case, the thickness of the protective film HG1c in Second Embodiment becomes equal to that of the protective film HG1e of the present Third Embodiment. and the thickness of the protective film HG1d in the Second Embodiment becomes equal to that of the protective film HG1f of the present Third Embodiment.

The present Third Embodiment can also provide almost the same effects as those of First Embodiment, but is different from First Embodiment in the following points.

In the present Third Embodiment, over the side surface of the photoresist pattern RP4p, the protective film HG1e is not formed, or may be reduced in thickness even when formed. For this reason, the margin (dimension margin) of the photoresist pattern RP4p can be set large. Further, over the side surface of the photoresist pattern RP4n, the protective film HG1f is not formed, or can be reduced in thickness even when formed. Accordingly, the margin of the photoresist pattern RP4n can be increased. For this reason, the present Third Embodiment can provide an advantage of facilitating performing of the photoresist pattern RP4p formation step and the photoresist pattern RP4n formation step using a photolithography technology.

On the other hand, in the present Third Embodiment, the protective film (HG1e or HG1f) is formed using a sputtering method. In contrast, in First Embodiment, the protective film (HG1a or HG1b) is formed using a CVD method or an ALD method. However, with a CVD method or an ALD method, the controllability during deposition is better, and a film with a desirable thickness can be formed with more precision than with a sputtering method. For this reason, First Embodiment in which the protective film (HG1a or HG1b) is formed using a CVD method or an ALD method can provide an advantage of capable of forming the protective film with a desirable thickness with good controllability and precision.

Up to this point, the invention completed by the present inventors was specifically described by way of embodiments. It is naturally understood that the present invention is not limited to the embodiments, and may be variously changed within the scope not departing from the gist thereof.

What is claimed is:

1. A method for manufacturing a semiconductor device, comprising the steps of:
   (a) providing a semiconductor substrate;
   (b) forming a resist pattern over the semiconductor substrate;
   (c) forming a first film over the semiconductor substrate in such a manner as to cover the resist pattern;
   (d) ion implanting an impurity into the semiconductor substrate with the resist pattern covered with the first film;
   (e) after the step (d), removing the first film by wet etching; and
   (f) after the step (e), removing the resist pattern, and further comprising a step of:
   (a1) after the step (a), and before the step (b), forming an insulation film over the semiconductor substrate,
   wherein the insulation film and the first film are formed of mutually different materials,
   wherein in the step (b), the resist pattern is formed over the insulation film,
   wherein in the step (c), the first film is formed over the insulation film in such a manner as to cover the resist pattern, and
   wherein in the step (e), wet etching is performed under the conditions in which the first film is more likely to be etched than the resist pattern, and the insulation film is less likely to be etched than the first film, thereby to remove the first film.

2. The method for manufacturing a semiconductor device according to claim 1,
   wherein in the step (e), wet etching is performed under the conditions in which the semiconductor substrate is less likely to be etched than the first film.

3. The method for manufacturing a semiconductor device according to claim 1,
   wherein the first film is a silicon oxide film or a silicon nitride film.

4. The method for manufacturing a semiconductor device according to claim 1,
   wherein in the step (c), a thickness of the first film formed over the upper surface of the resist pattern is 10 nm or more.

5. The method for manufacturing a semiconductor device according to claim 4,
   wherein in the step (c), the thickness of the first film formed over the upper surface of the resist pattern is 10 to 20 nm.

6. The method for manufacturing a semiconductor device according to claim 1,
   wherein in the step (f), the resist pattern is removed by an ashing treatment or a wet treatment.

7. The method for manufacturing a semiconductor device according to claim 1,
   wherein a deposition temperature of the first film in the step (c) is 200° C. or less.

8. The method for manufacturing a semiconductor device according to claim 1,
   wherein the insulation film is a silicon oxide film or a silicon nitride film, and
   wherein the first film is a silicon film.

9. The method for manufacturing a semiconductor device according to claim 1,
   wherein in the step (c), the first film is formed by a CVD method or an ALD method.

10. The method for manufacturing a semiconductor device according to claim 9,
    wherein in the step (c), the first film is formed over the upper surface and over the side surface of the resist pattern.

11. The method for manufacturing a semiconductor device according to claim 1,
    wherein in the step (c), the first film is formed by a sputtering method.

12. The method for manufacturing a semiconductor device according to claim 11,
    wherein in the step (c), the first film with a first thickness is formed over the upper surface of the resist pattern, and
    wherein the first film is not formed, or the first film with a second thickness smaller than the first thickness is formed over the side surface of the resist pattern.

* * * * *